United States Patent
Umetsu

(10) Patent No.: US 6,826,022 B2
(45) Date of Patent: Nov. 30, 2004

(54) CPP TYPE MAGNETIC SENSOR OR MAGNETIC SENSOR USING TUNNEL EFFECT, AND MANUFACTURING METHOD THEREFOR

(75) Inventor: Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 322 days.

(21) Appl. No.: 10/215,693

(22) Filed: Aug. 9, 2002

(65) Prior Publication Data

US 2003/0030948 A1 Feb. 13, 2003

(30) Foreign Application Priority Data

Aug. 13, 2001 (JP) .......................................... 2001-245108
Aug. 20, 2001 (JP) .......................................... 2001-248690

(51) Int. Cl.⁷ .............................................. G11B 5/127
(52) U.S. Cl. ................................................... 360/324.12
(58) Field of Search ........................... 360/324.12, 322, 360/313, 314, 324.2; 428/692, 326, 457

(56) References Cited

U.S. PATENT DOCUMENTS

| | | |
|---|---|---|
| 5,576,914 A | 11/1996 | Rottmayer et al. |
| 5,657,191 A | 8/1997 | Yuan |
| 5,729,410 A | 3/1998 | Fontana, Jr. et al. |
| 5,739,987 A | 4/1998 | Yuan et al. |
| 5,880,912 A | 3/1999 | Rottmayer |
| 5,898,548 A | 4/1999 | Dill et al. |
| 5,901,018 A | 5/1999 | Fontana, Jr. et al. |
| 5,966,012 A | 10/1999 | Parkin |
| 6,005,753 A | 12/1999 | Fontana, Jr. et al. |
| 6,249,407 B1 | 6/2001 | Aoshima et al. |
| 6,754,056 B2 * | 6/2004 | Ho et al. .................. 360/324.2 |
| 6,764,778 B2 * | 7/2004 | Saito et al. .................. 428/692 |
| 2002/0081458 A1 * | 6/2002 | Hasegawa et al. .......... 428/692 |

* cited by examiner

Primary Examiner—Allen Cao
(74) Attorney, Agent, or Firm—Brinks Hofer Gilson & Lione

(57) ABSTRACT

By forming insulating layers on two sides of a laminate, forming a free magnetic layer continuously on the laminate and the insulating layers, and placing the free magnetic layer in a single magnetic domain by an exchange bias method, reproducing output and changing rate of resistance of a CPP type magnetic sensor can be improved even when recording density is increased in the future.

32 Claims, 20 Drawing Sheets

CPP TYPE MAGNETIC SENSOR OR MAGNETIC SENSOR USING TUNNEL EFFECT, AND MANUFACTURING METHOD THEREFOR

BACKGROUND OF THE INVENTION

1. Field of the Invention

The present invention relates to CPP (current-perpendicular-to-plane) type magnetic sensors or magnetic sensors using the tunnel effect, which are mounted on magnetic reproducing devices, such as a hard disc device, or other magnetic sensing devices. In particular, the present invention relates to a magnetic sensor capable of improving reproducing output and changing rate of resistance, and to a manufacturing method therefor.

2. Description of the Related Art

FIG. 11 is a partial cross-sectional view of a conventional CPP (current-perpendicular-to-plane) type magnetic sensor (spin-valve type thin-film magnetic element) when it is viewed from an opposing face opposing a recording medium.

Reference numeral 1 indicates a first electrode layer, and on this first electrode layer 1, a laminate 9 is provided which is composed of an antiferromagnetic layer 2 formed of a Pt—Mn alloy or the like, a fixed magnetic layer 3 formed of an Ni—Fe alloy or the like, a nonmagnetic material layer 4 formed of copper (Cu), and a free magnetic layer 5 formed of an Ni—Fe alloy or the like.

As shown in FIG. 11, insulating layers 6 composed of $Al_2O_3$ or the like are formed on two sides of the laminate 9 in the track width direction (X direction in the figure) and on the first electrode layer 1, and in addition, a hard bias layer 7 formed of a Co—Pt alloy or the like is formed on each of the insulating layers 6.

In addition, a second electrode layer 8 is formed continuously on the hard bias layers 7 and the free magnetic layer 5.

The magnetization of the fixed magnetic layer 3 is fixed in the height direction (Y direction in the figure) by an exchange coupling magnetic field generated between the fixed magnetic layer 3 and the antiferromagnetic layer 2, and on the other hand, the magnetization of the free magnetic layer 5 is aligned in the track width direction (X direction in the figure) by a longitudinal bias magnetic field from the hard bias layer 7.

In the CPP type magnetic sensor shown in FIG. 11, a sensing current is allowed to flow through each layer forming the laminate 9 in the direction (Z direction in the figure) perpendicular thereto.

Concomitant with the trend toward miniaturization of element size due to increasingly higher recording density in the future, it has been expected that CPP type magnetic sensors in which a sensing current is allowed to flow through individual films in the direction perpendicular thereto more effectively improve reproducing output than CIP (current-in-plane) type magnetic sensors in which a sensing current is allowed to flow through the films in the direction parallel thereto.

In addition, FIG. 23 is a partial cross-sectional view of a conventional magnetic sensor (tunnel type magnetoresistive element) using the tunnel effect when it is viewed from an opposing face opposing a recording medium.

Reference numeral 1 indicates a first electrode layer, and on this first electrode layer 1, a laminate 9 is provided which is composed of an antiferromagnetic layer 2 formed of a Pt—Mn alloy or the like, a fixed magnetic layer 3 formed of a Ni—Fe alloy or the like, an insulating-barrier layer 400 formed of $Al_2O_3$ or the like, and a free magnetic layer 5 formed of a Ni—Fe alloy or the like.

As shown in FIG. 23, insulating layers 6 composed of $Al_2O_3$ or the like are formed on two sides of the laminate 9 in the track width direction (X direction in the figure) and on the first electrode layer 1, and in addition, a hard bias layer 7 formed of a Co—Pt alloy or the like is formed on each of the insulating layers 6.

In addition, a second electrode layer 8 is formed continuously on the hard bias layers 7 and the free magnetic layer 5.

The magnetization of the fixed magnetic layer 3 is fixed in the height direction (Y direction in the figure) by an exchange coupling magnetic field generated between the fixed magnetic layer 3 and the antiferromagnetic layer 2, and on the other hand, the magnetization of the free magnetic layer 5 is aligned in the track width direction (X direction in the figure) by a longitudinal bias magnetic field from the hard bias layer 7.

The magnetic sensor shown in FIG. 23 has the structure which is called a tunnel type magnetoresistive element, and the features of this structure are that a layer provided between the fixed magnetic layer 3 and the free magnetic layer 5 is the insulating barrier layer 400, which is an insulating layer, and that the electrode layers 8 and 1 are formed on the top and the bottom of the laminate 9, respectively.

In the tunnel type magnetic sensor shown in FIG. 23 which generates change in resistance using the tunnel effect, when the magnetizations of the fixed magnetic layer 3 and the free magnetic layer 5 are antiparallel to each other, it is most difficult for a tunnel current to flow through the insulating barrier layer 400, so that the resistance becomes a maximum. On the other hand, when the magnetizations of the fixed magnetic layer 3 and the free magnetic layer 5 are parallel to each other, it is most easy for a tunnel current to flow through the insulating layer 400, so that the resistance becomes a minimum.

By using this principle, when the magnetization of the free magnetic layer 5 varies by the influence of an external magnetic field, change in electrical resistance is detected as change in voltage, thereby sensing a leakage magnetic field from the recording medium.

However, in a magnetic sensor having the structure shown in FIG. 11 or 23, problems described below have occurred.

Concomitant with the trend toward higher recording density in the future, when the track width Tw which is defined by the width dimension in the track width direction of the upper surface of the free magnetic layer 5 is decreased, the size of the free magnetic layer 5 itself is decreased, and hence, even when a longitudinal bias magnetic field is supplied from the hard bias layer 7 to the free magnetic layer 5, the free magnetic layer 5 is difficult to be appropriately placed in a single domain state in the track width direction (X direction in the figure). In addition, since the influence of a demagnetizing field of the free magnetic layer 5 is enhanced, the stability of reproducing properties is degraded.

In order to solve the problems described above, a method in which the film thickness of the hard bias layer 7 is increased so as to supply an intense longitudinal bias magnetic field to the free magnetic layer 5 may be considered; however, in the method described above, since the magnetization of the free magnetic layer 5 formed in a very small area tends to be fixed, and the magnetization change cannot be performed sensitively in response to an external magnetic field, a problem of degradation of reproducing output may arise in some cases.

Next, as shown in FIG. 23, the insulating layers 6 are provided on two sides of the laminate 9 in the track width direction. The insulating layers 6 are provided so that a current flowing from the electrode layer 1 or 8 through the laminate 9 flows effectively.

However, since the hard bias layer 7 is formed on the insulating layer 7, a part of the current flowing from the electrode layer 1 or 8 through the laminate 9 is shunted to the hard bias layer 7. The current thus shunted flows into the insulating barrier layer 400, the fixed magnetic layer 3, or the like not through the free magnetic layer 5.

That is, in addition to a regular route through which a current flows from the electrode layer 1 or 8 in the laminate 9, an additional current route through which a part of the current is shunted to the hard bias layer 7 not through the free magnetic layer 5 is formed, resulting in shut loss. Accordingly, decrease in changing rate of resistance (ΔR/R) occurs.

In order to solve the problems described above, as shown in FIG. 24 (a partial cross-sectional view showing an enlarged portion in FIG. 23), by forming the insulating layers 6 having a large thickness on two side surfaces 5a of the free magnetic layer 5, two side surfaces of the laminate 9 are properly covered with the insulating layers 6, and the amount of current shunted from the electrode layer 1 or 8 to the hard bias layer 7 can be decreased; however, when the thick insulating layer 6 is provided between the free magnetic layer 5 and the hard bias layer 7, the longitudinal bias magnetic field, which is to be supplied to the free magnetic layer 5 from the hard bias layer 7, is decreased, and as a result, since the free magnetic layer 5 cannot be placed in a single domain state, degradation of reproducing properties occurs.

In addition, as described above, in the magnetic sensor having the structure shown in FIG. 23, when the track width Tw is decreased with increase in recording density in the future, the surface area of the laminate 9 in the direction parallel to the film surface thereof (the surface formed by the X and Y axes) is decreased, and DC resistance (DCR) is extremely increased, resulting in degradation of reproducing characteristics such as reproducing output.

SUMMARY OF THE INVENTION

Accordingly, the present invention was made to solve the problems described above, and an object of the present invention is to provide a magnetic sensor, in which reproducing properties such as reproducing output or changing rate of resistance can be appropriately improved so as to meet the requirements of higher recording density in the future by properly improving a bias method for aligning the magnetization of a free magnetic layer and the structure thereof, and to provided a manufacturing method therefor.

A magnetic sensor of the present invention comprises a laminate having a first antiferromagnetic layer, a fixed magnetic layer formed on the upper surface of the first antiferromagnetic layer, the magnetization of the fixed magnetic layer being fixed in a predetermined direction by an exchange coupling magnetic field generated between the first antiferromagnetic layer and the fixed magnetic layer, and a nonmagnetic material layer formed on the upper surface of the fixed magnetic layer; insulating layers formed on two sides in the track width direction of the laminate; a free magnetic layer formed continuously on the upper surface of the nonmagnetic material layer and the upper surfaces of the insulating layers, the magnetization of the free magnetic layer being aligned in the direction crossing that of the fixed magnetic layer; a second antiferromagnetic layer formed at the upper side of the free magnetic layer; a recess portion formed in the second antiferromagnetic layer from the surface thereof in the direction toward the laminate at the position opposing the laminate in the thickness direction; and electrode layers formed at the lower side of the laminate and at the upper side of the second antiferromagnetic layer.

The present invention relates to a CPP (current-perpendicular-to-plane) type magnetic sensor, and a sense current flows in the direction perpendicular to the film surfaces of individual layers forming the magnetic sensor.

In the present invention, a conventional hard bias method in which hard bias layers are provided on two sides in the track width direction of the free magnetic layer is not employed, and an exchange bias method in which the second antiferromagnetic layer is provided at the upper side of the free magnetic layer is employed.

When the exchange bias method is employed, the width dimension in the track width direction of the free magnetic layer can be formed to be larger than the track width Tw.

In particular, according to the present invention, the free magnetic layer can be formed not only on the laminate, but also on the insulating layers formed at the two sides of the laminate.

Accordingly, even when the track width Tw is decreased concomitant with the trend toward higher recording density in the future, regardless of the dimensions of the track width Tw and the width dimension of the laminate, the width dimension of the free magnetic layer can be formed large. Hence, the free magnetic layer can be appropriately placed in a single domain state, the influence of the demagnetizing field of the free magnetic layer can be decreased, and as a result, a magnetic sensor which has superior sensitivity and which can appropriately improve reproducing output can be manufactured even when the track width Tw is decreased in the future.

Next, in the present invention, the laminate having the antiferromagnetic layer, the fixed magnetic layer, and the nonmagnetic material layer is covered with the insulating layers at two side surfaces in the track width direction of the laminate.

Previously, since the hard bias layers are provided on the two sides of the free magnetic layer, and current shunted to these hard bias layers flows through the nonmagnetic material layer and the fixed magnetic layer but the free magnetic layer, shunt loss occurs, thereby degrading changing rate of resistance. However, in the present invention, since no hard bias layers are provided, and the two sides of the laminate are covered with the insulating layers, a current from the electrode layer appropriately flows through the free magnetic layer and then the laminate, and as a result, compared the convention structure described above, shut loss can be decreased and changing rate of resistance can be improved.

In addition, in the present invention, the width dimension in the track width direction of the upper surface of the laminate is preferably equal to or smaller than the width dimension in the track width direction of the bottom surface of the recess portion.

The width dimension in the track width direction of the upper surface of the laminate is defined as an electric track width. Accordingly, in order to increase DC resistance (DCR), the width dimension of the laminate described above is preferably decreased as small as possible.

On the other hand, the width dimension in the track width direction of the bottom surface of the recess portion is defined as a magnetic track width Tw. That is, a part of the free magnetic layer, which is located at the position opposing the recess portion, substantially serves as a sensing region of the magnetoresistive effect.

Accordingly, the sensing region of the free magnetic layer is decreased with decrease in the dimension in the track width direction of the bottom surface of the recess portion; however, when the sensing region is too much decreased, it is not preferable since the reproducing output is decreased.

That is, in order to fulfill the requirements of higher recording density appropriately, the sensing region described above (magnetic track width Tw) must be decreased; however, when it is too much decreased, the reproducing output is also decreased. On the other hand, in order to increase DC resistance, the electric track width defined by the width dimension of the upper surface of the laminate is preferably further decreased regardless of the dimension of the magnetic track width Tw.

Consequently, in the present invention, the width dimension in the track width direction of the upper surface of the laminate is formed to be equal to or smaller than the width dimension in the track width direction of the bottom surface of the recess portion. As a result, the DC resistance (DCR) and the reproducing output of a CPP type magnetic sensor can be appropriately improved.

In the nonmagnetic material layer according to the present invention, element Ru, Rh, Re, Os, Ir, Pt, Pd, or the mixture thereof is preferably present at a high concentration at the upper surface side of the nonmagnetic material layer as compared to that at the lower surface side thereof.

In the present invention, the nonmagnetic material layer is preferably composed of a lower layer, which is formed of a Cu layer, an Rh layer, an Ru layer, an Re layer, an Os layer, a Cr layer, an Ir layer, a Pt layer, a Pd layer, or a layer containing at least two elements forming the above-mentioned layers, and an upper layer which is provided on the lower layer and which is formed of an Ru layer, an Rh layer, an Re layer, an Os layer, an Ir layer, a Pt layer, a Pd layer, or a layer containing at least two elements forming the above layers.

In the present invention, the entire nonmagnetic material layer may also be formed of an Ru layer, an Rh layer, an Re layer, an Os layer, an Ir layer, a Pt layer, a Pd layer, or a layer containing at least two elements forming the above layers.

In addition, the magnetic sensor of the present invention may further comprise a nonmagnetic interlayer and a ferromagnetic layer on the free magnetic layer in that order, and the second antiferromagnetic layer is preferably formed on the ferromagnetic layer.

In the present invention, the three layers, that is, the free magnetic layer, the nonmagnetic interlayer, and the ferromagnetic layer, form a laminated ferrimagnetic structure. The ferromagnetic layer is magnetized in the track width direction by an exchange coupling magnetic field generated between the ferromagnetic layer and the second antiferromagnetic layer provided on the two sides in the track width direction of the recess portion formed therein.

On the other hand, the free magnetic layer described above is magnetized antiparallel to the magnetization direction of the ferromagnetic layer by a coupling magnetic field generated between the ferromagnetic layer and the free magnetic layer due to the RKKY interaction.

In the present invention, since the magnetizations of parts of the free magnetic layer and the ferromagnetic layer, which are formed under the second antiferromagnetic layer at the two sides in the track width direction of the recess portion formed therein, are fixed, regions corresponding to the parts described above are regions having no relation with the magnetoresistive effect.

On the other hand, since parts of the ferromagnetic layer and the free magnetic layer, which are formed under the recess portion, are placed in a weak single domain state so that the magnetizations thereof may be inverted in response to an external magnetic field, a region corresponding to the parts described above serves substantially as a sensing region of the magnetoresistive effect.

As described above, when a laminated ferrimagnetic structure is formed of the free magnetic layer, the nonmagnetic interlayer free, and the ferromagnetic layer laminated to each other in that order from the bottom, the single domain structure in which the magnetization of the free magnetic layer is stabilized can be formed, and hence the reproducing output can be appropriately improved.

According to the present invention, the recess portion may be formed to extend to the surface of the ferromagnetic layer so that the surface thereof is exposed at the bottom of the recess portion or may be formed to extend to the surface of the nonmagnetic interlayer so that the surface thereof is exposed at the bottom of the recess portion.

According to the present invention, a method for manufacturing a magnetic sensor comprises a step (a) of forming a laminate composed of a first antiferromagnetic layer, a fixed magnetic layer, and a nonmagnetic material layer provided in that order on a first electrode layer; a step (b) of forming a lift-off resist layer on the upper surface of the laminate and removing two side surfaces thereof, which are not covered with the resist layer, in the track width direction; a step (c) of forming insulating layers on two sides in the track width direction of the laminate and removing the resist layer: a step (d) of forming a free magnetic layer continuously on the insulating layers and the nonmagnetic material layer and forming a second antiferromagnetic layer on the free magnetic layer; a step (f) of forming a mask layer having an opening at the position opposing the laminate in the thickness direction on the second antiferromagnetic layer and excavating the second antiferromagnetic layer which is exposed in the opening to form a recess portion in the second antiferromagnetic layer; and a step (g) of forming a second electrode layer on the second antiferromagnetic layer.

In the manufacturing method described above, in accordance with an exchange bias method in which the second antiferromagnetic layer is formed at the upper side of the free magnetic layer, the free magnetic layer can be placed in a single domain state in the track width direction.

According to the method described above, compared to the case in which the magnetization is performed by a hard bias method, the free magnetic layer can be formed to extend long in the track width direction, and in addition, the free magnetic layer can also be formed on the insulating layers provided on the two sides of the laminate. Consequently, the free magnetic layer can be formed to be large regardless of the track width Tw and the dimensions of the laminate, and hence, even when element sizes are decreased concomitant with the trend toward higher recording density in the future, the free magnetic layer can be appropriately placed in a single domain state by an exchange coupling magnetic field generated between the second antiferromagnetic layer and the free magnetic layer.

In addition, since the two sides of the laminate, which is composed of the first antiferromagnetic layer, the fixed magnetic layer, and the nonmagnetic material layer and which is provided below the free magnetic layer, can be approximately covered with the insulating layers, a magnetic sensor in which shunt loss is unlikely to occur and changing rate of resistance can be appropriately improved can be manufactured.

According to the method of the present invention for manufacturing the magnetic sensor, a magnetic sensor capable of appropriately improving reproducing properties such as reproducing output or changing rate of resistance can be easily manufactured even when recording density is increased.

In addition, in the step (f) described above of the present invention, the width dimension in the track width direction of the bottom surface of the recess portion is preferably formed to be larger than the width dimension in the track width direction of the laminate.

In the step (a) of the present invention, the nonmagnetic material layer is preferably composed of a lower layer, which is formed of a Cu layer, an Rh layer, an Ru layer, an Re layer, an Os layer, a Cr layer, an Ir layer, a Pt layer, a Pd layer, or a layer containing at least two elements forming the above-mentioned layers, and an upper layer which is provided on the lower layer and which is formed of an Ru layer, an Rh layer, an Re layer, an Os layer, an Ir layer, a Pt layer, a Pd layer, or a layer containing at least two elements forming the above layers.

When a nonmagnetic material layer formed of Cu or the like is exposed to the air, a problem in which bulk scattering cannot be fully obtained due to oxidation or damages caused by contamination may arise in some cases, and as a result, degradation of output properties such as changing rate of resistance is likely to occur.

Accordingly, in the present invention, after the lower layer composed of Cu described above is formed, the upper layer such as an Ru layer is sequentially formed on the lower layer, so that the lower layer is appropriately prevented from being exposed to the air. When being exposed to the air, since the upper layer such as an Ru layer is not significantly degraded by contamination and is not liable to oxidize, the lower layer composed of Cu or the like can be appropriately protected from degradation caused by exposure to the air, and since the lower layer and the upper layer can be formed from a nonmagnetic material, the upper layer and the lower layer can form a nonmagnetic material layer.

In the step (a) of the present invention, the nonmagnetic material layer may be formed of an Ru layer, an Rh layer, an Re layer, an Os layer, an Ir layer, a Pt layer, a Pd layer, or a layer containing at least two elements forming the above layers.

In the step (d) of the present invention, it is preferable that after a nonmagnetic interlayer and a ferromagnetic layer are formed in that order on the free magnetic layer, the second antiferromagnetic layer be formed on the ferromagnetic layer.

In the step (f) of the present invention, the second antiferromagnetic layer may be excavated to expose the surface of the ferromagnetic layer, or a part of the second antiferromagnetic layer may be excavated. In this step, the part of the second antiferromagnetic layer remaining under the recess portion is a thin-film so that the antiferromagnetic functions may be degraded to some extent. Consequently, an exchange coupling magnetic field between the region under the recess portion and the free magnetic layer (or the ferromagnetic layer) may not be generated, or only a very weak exchange coupling magnetic field is generated, and hence, the magnetization of the free magnetic layer (or the ferromagnetic layer) cannot be firmly fixed.

Accordingly, a part of the free magnetic layer (and a part of the ferromagnetic layer) located under the recess portion formed in the second antiferromagnetic layer can be used as a sensing region in which the magnetoresistive effect can be appropriately obtained.

According to the present invention, the mask layer is preferably formed from an inorganic material.

In addition, instead of the steps (d) to (g) described above, the present invention may further comprises a step (h) of, after the free magnetic layer is formed continuously on the insulating layers and the nonmagnetic material layer, forming a nonmagnetic interlayer on the free magnetic layer; a step (i) of forming a lift-off resist layer on the nonmagnetic interlayer at the position opposing the laminate in the thickness direction, and forming a ferromagnetic layer and a second antiferromagnetic layer in that order on each of two sides in the track width direction of the nonmagnetic interlayer, which are not covered with the resist layer, so that the width dimension in the track width direction of a part of the nonmagnetic interlayer exposed between the second antiferromagnetic layers is smaller than the width dimension in the track width direction of the upper surface of the laminate; and a step (j) of removing the resist layer.

When the steps (i) and (j) are used, excavation of the second ferromagnetic layer in the step (f) is not necessary. In addition, by the steps (i) and (j), the upper surface of the nonmagnetic interlayer can be exposed at the bottom of the recess portion formed between the second antiferromagnetic layers.

According to the present invention, a magnetic sensor comprises a laminate formed of a first antiferromagnetic layer, a fixed magnetic layer formed on the upper surface of the first antiferromagnetic layer, the magnetization of the fixed magnetic layer being fixed in a predetermined direction by an exchange coupling magnetic field generated between the first antiferromagnetic layer and the fixed magnetic layer, and a spacer layer which is formed on the upper surface of the fixed magnetic layer and which contains at least an insulating barrier layer; insulating layers formed on two sides in the track width direction of the laminate; a free magnetic layer formed continuously on the spacer layer and the insulating layers, the magnetization of the free magnetic layer being aligned in the direction crossing that of the fixed magnetic layer; a second antiferromagnetic layer formed at the upper side of the free magnetic layer; a recess portion formed in the second antiferromagnetic layer from the surface thereof in the direction toward the laminate at the position opposing to the laminate in the thickness direction, the width dimension in the track width direction of the bottom surface of the recess portion being formed to be smaller than the width dimension in the track width direction of the upper surface of the laminate; and electrode layers formed at the lower side of the laminate and at the upper side of the second antiferromagnetic layer.

In the present invention, a conventional hard bias method in which hard bias layers are provided on two sides in the track width direction of a free magnetic layer is not used, and an exchange bias method in which a second antiferromagnetic layer is provided at the upper side of the free magnetic layer is employed.

When the exchange bias method is employed, the width dimension in the track width direction of the free magnetic layer can be formed to be larger than the track width Tw.

In particular, the free magnetic layer can be formed not only on the laminate but also on the insulating layers formed on the two sides of the laminate.

Consequently, even when the track width Tw is decreased concomitant with the trend toward higher recording density in the future, regardless of the dimension of the track width Tw, the width dimension of the free magnetic layer can be formed to be large. Accordingly, since the free magnetic layer can be appropriately placed in a single domain state, and the influence of the demagnetizing field of the free magnetic layer can be weakened, even when the track width Tw is decreased in the future, a magnetic sensor which has superior sensitivity and which can appropriately improve reproducing output can be manufactured.

Next, in the present invention, the two sides in the track width direction of the laminate formed of the antiferromagnetic layer, the fixed magnetic layer, and the spacer layer are covered with the insulating layers.

Previously, since hard bias layers are provided on two sides of the free magnetic layer, and current shunted to these hard bias layers flows through the insulating barrier layer and the fixed magnetic layer but the free magnetic layer, shunt loss occurs, thereby degrading changing rate of resistance. However, in the present invention, since no hard bias layers are provided, and the two sides of the laminate are covered with the insulating layers, a current from the electrode layer appropriately flows through the free magnetic layer and then the laminate, and as a result, compared the convention structure described above, shunt loss can be reduced and changing rate of resistance can be improved.

Next, in the present invention, the width dimension in the track width direction of the upper surface of the laminate is formed to be larger than the width dimension (track width Tw) in the track width direction of the bottom surface of the recess portion.

That is, in the present invention, since a surface area parallel to the film surface of the laminate can be formed to be large regardless of the dimension of the track width Tw, DC resistance (DCR) can be appropriately decreased as compared to the conventional structure described above, and hence, reproducing properties such as reproducing output can be improved.

In the present invention, the insulating barrier layer is preferably formed of Al—O, Si—O, or Al—Si—O.

In addition, according to the present invention, the spacer layer preferably has a laminated structure composed of the insulating barrier layer and a protective layer which is provided thereon and which contains at least one selected from the group consisting of Ru, Ir, Rh, Os, Re, Pt, and Pd.

In the present invention, it is preferable that a nonmagnetic interlayer and a ferromagnetic layer be formed in that order on the free magnetic layer and that the second antiferromagnetic layer be formed on the ferromagnetic layer.

According to the present invention, the three layers, that is, the free magnetic layer, the nonmagnetic interlayer, and the ferromagnetic layer, form a laminated ferrimagnetic structure. The ferromagnetic layer is magnetized in the track width direction by an exchange coupling magnetic field generated between the ferromagnetic layer and the second antiferromagnetic layer provided on the two sides of the recess.

On the other hand, the free magnetic layer is magnetized antiparallel to the magnetization direction of the ferromagnetic layer by a coupling magnetic field generated between the ferromagnetic layer and the free magnetic layer due to the RKKY interaction.

In the present invention, the magnetizations of parts of the ferromagnetic layer and the free magnetic layer, which are formed under the second antiferromagnetic layer at the two sides in the track width direction of the recess portion, are fixed, and regions corresponding to the parts described above are regions having no relation with the magnetoresistive effect.

On the other hand, parts of the ferromagnetic layer and the free magnetic layer, which are formed under the recess portion are placed in a weak single domain state so that the magnetizations thereof may be inverted in response to an external magnetic field, and hence a region corresponding to the parts described above serves substantially as a sensing region of the magnetoresistive effect.

As described above, when a ferrimagnetic structure composed of the nonmagnetic interlayer and the ferromagnetic layer provided in that order on the free magnetic layer is formed, a single domain structure in which the magnetization of the free magnetic layer is stabilized can be formed, and hence reproducing output can be appropriately improved.

According to the present invention, the recess portion described above may be formed to extend to the surface of the ferromagnetic layer so that the surface thereof is exposed at the bottom of the recess portion or may be formed to extend to the surface of the nonmagnetic interlayer so that the surface thereof is exposed at the bottom of the recess portion.

A method of the present invention for manufacturing a magnetic sensor comprises a step (a) of forming a laminate composed of a first antiferromagnetic layer, a fixed magnetic layer, and an insulating barrier layer in that order on a first electrode layer; a step (b) of forming a lift-off resist layer on the upper surface of the laminate and removing two side surfaces, which are not covered with the resist layer, in the track width direction of the laminate; a step (c) of forming insulating layers on two sides in the track width direction of the laminate and removing the resist layer: a step (d) of forming a free magnetic layer continuously on the insulating layers and the insulating barrier layer and forming a second antiferromagnetic layer on the free magnetic layer; a step (f) of forming a mask layer having an opening at the position opposing the laminate in the thickness direction on the second antiferromagnetic layer and excavating the second antiferromagnetic layer which is exposed in the opening to form a recess portion in the second antiferromagnetic layer so that the width dimension in the track width direction of the bottom surface of the recess portion is smaller than the width dimension in the track width direction of the upper surface of the laminate; and a step (g) of forming a second electrode layer on the second antiferromagnetic layer.

According to the manufacturing method described above, since the exchange bias method in which the second antiferromagnetic layer is formed at the upper side of the free magnetic layer is employed, the free magnetic layer can be placed in a single domain state in the track width direction.

According to the method described above, compared to the case in which the magnetization is performed by a hard bias method, the free magnetic layer can be formed to extend long in the track width direction and can be appropriately placed in a single domain state by an exchange coupling, magnetic field generated between the second antiferromagnetic layer and the free magnetic layer.

In addition, since the laminate composed of the first antiferromagnetic layer, the fixed magnetic layer, and the insulating barrier layer formed under the free magnetic layer is appropriately covered with the insulating layers at the two sides in the track width direction of the laminate, shunt loss is not likely to occur, and hence a magnetic sensor capable of appropriately improving changing rate of resistance can be manufactured.

The track width Tw can be controlled by the width dimension in the track width direction of the bottom surface of the recess portion formed in the second antiferromagnetic layer, and even when the track width is decreased, the width dimension in the track width direction of the laminate can be formed to be large regardless of the dimension of the track width Tw. Accordingly, DC resistance (DCR) of the laminate can be appropriately increased, and a magnetic sensor capable of increasing reproducing output can be easily formed as compared to that in the past.

Consequently, according to the method for manufacturing a magnetic sensor of the present invention, even when recording density is increased, a magnetic sensor capable of appropriately improving reproducing properties such as reproducing output or changing rate of resistance can be easily manufactured.

In the step (a) of the present invention, the insulating barrier layer preferably comprises an insulating material composed of Al—O, Si—O, or Al—Si—O.

In addition, in the step (a) of the present invention, it is preferable that after a layer composed of Al, Si, or Al—Si is formed on the fixed magnetic layer, the layer described above be oxidized to form an insulating barrier layer composed of Al—O, Si—O, or Al—Si—O. As the oxidation method therefor, for example, there may be mentioned natural oxidation, plasma oxidation, radical oxidation, ion-assist-oxidation (IAO), or CVD oxidation.

In addition, in the step (a) of the present invention, a protective layer composed of at least one selected from the group consisting of Ru, Ir, Rh, Os, Re, Pt, and Pd is preferably formed on the insulating barrier layer, whereby the protective layer and the insulating barrier layer form a spacer layer.

When the insulating barrier layer formed of the Al—O or the like mentioned above is exposed to the air, barrier properties are degraded due to damages caused by contamination or the like, and as a result, degradation of reproducing properties such as changing rate of resistance is likely to occur.

Accordingly, in the present invention, after the insulating barrier layer composed of the Al—O or the like mentioned above is formed, a protective layer is sequentially formed from Ru or the like on the insulating barrier layer, thereby appropriately preventing the insulating barrier layer from being exposed to the air. Consequently, although the laminate having the protective layer provided on the insulating barrier layer is exposed to the air, the barrier properties of the insulating barrier layer can be appropriately maintained.

In the step (d) of the present invention, it is preferable that after a nonmagnetic interlayer and a ferromagnetic layer are formed on the free magnetic layer in that order, the second antiferromagnetic layer be formed on the ferromagnetic layer.

In the step (f) of the present invention, the second antiferromagnetic layer may be excavated to expose the surface of the ferromagnetic layer, or a part of the second antiferromagnetic layer may be excavated. In this step, the part of the second antiferromagnetic layer remaining under the recess portion is a thin-film so that antiferromagnetic functions may be degraded to some extent. Consequently, an exchange coupling magnetic field between the region under the recess portion and the free magnetic layer (or the ferromagnetic layer) may not be generated, or only a very weak exchange coupling magnetic field may be generated, and hence, the magnetization of the free magnetic layer (or the ferromagnetic layer) cannot be firmly fixed.

Accordingly, the free magnetic layer (and the ferromagnetic layer) under the recess portion formed in the second antiferromagnetic layer can be used as a sensing region in which the magnetoresistive effect can be appropriately obtained.

In the present invention, the mask layer is preferably formed from an inorganic material.

In addition, instead of the steps (d) to (g), the present invention may further comprises a step (h) of, after the free magnetic layer is formed continuously on the insulating layers and the insulating barrier layer, forming a nonmagnetic interlayer on the free magnetic layer; a step (i) of forming a lift-off resist layer on the nonmagnetic interlayer at the position opposing the laminate in the thickness direction, and forming ferromagnetic layers and second antiferromagnetic layers in that order on two sides, which are not covered with the resist layer, in the track width direction of the nonmagnetic interlayer so that the width dimension in the track width direction of the surface of the nonmagnetic interlayer which is exposed between the second antiferromagnetic layers is smaller than the width dimension in the track width direction of the upper surface of the laminate; and a step (j) of removing the resist layer.

When the steps (i) and (j) are used, excavation of the second ferromagnetic layer in the step (f) is not necessary. In addition, by the steps (i) and (j), the upper surface of the nonmagnetic interlayer can be exposed at the bottom of the recess portion formed between the second antiferromagnetic layer.

DESCRIPTION OF THE PREFERRED EMBODIMENTS

Figure 1:
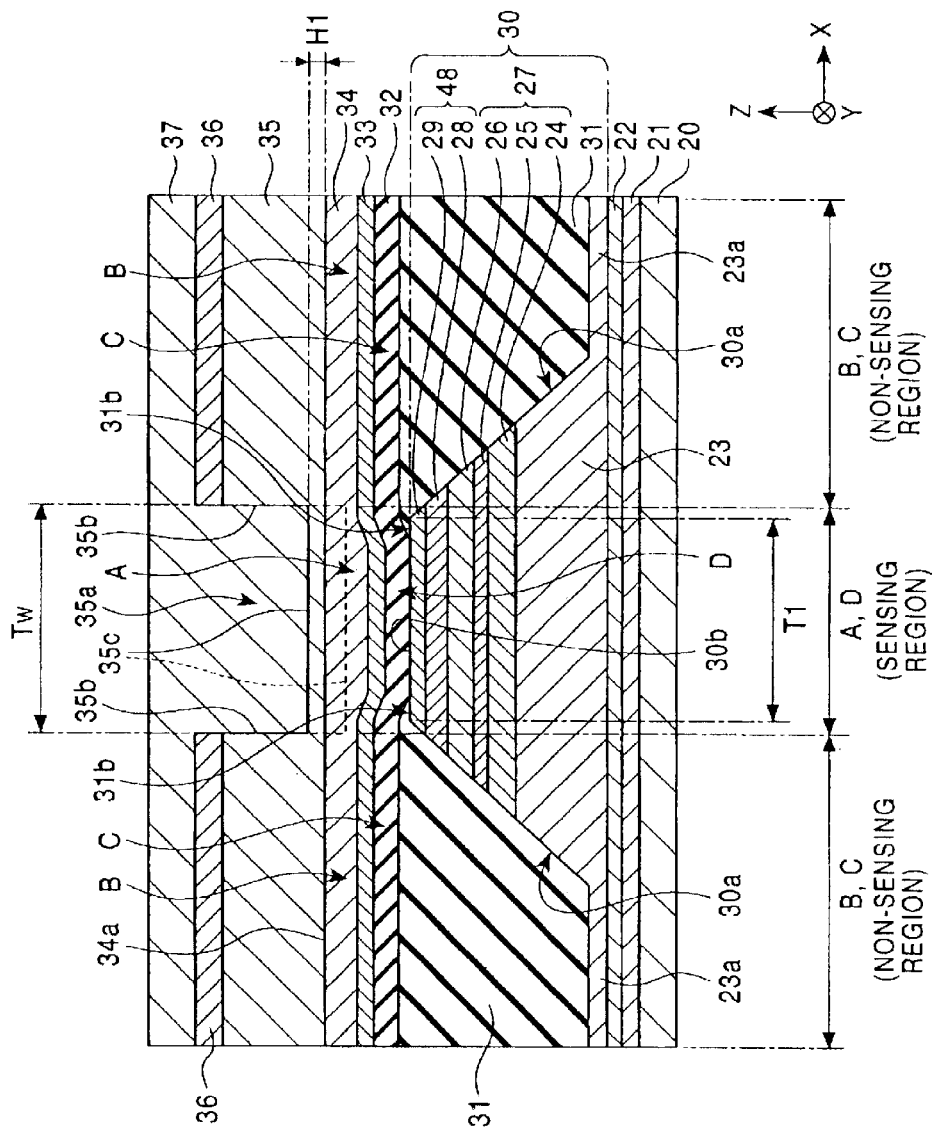
FIG. 1 is a partial cross-sectional view of a CPP type magnetic sensor (spin-valve type thin-film element) according to a first embodiment of the present invention when it is viewed from an opposing face opposing a recording medium.

FIG. 1 is a partial cross-sectional view of a CPP (current-perpendicular-to-plane) type magnetic sensor (spin-valve type thin-film magnetic element) according to a first embodiment of the present invention when it is viewed from an opposing face opposing a recording medium.

Shield layers (not shown) are provided on the top and the bottom sides of the magnetic sensor shown in FIG. 1 with the gap layers (not shown) provided therebetween, and the magnetic sensor, the gap layers, and the shield layers are collectively called an MR head.

The MR head described above serves to reproduce external signals stored in a recording medium. In addition, in the present invention, on the MR head described above, an inductive head for recording may be provided. The shielding layer (upper shielding layer) formed on the upper side of the magnetic sensor may also be used as a lower core layer of the inductive head.

In addition, the MR head is formed on a trailing end surface of a slider formed of, for example, alumina titanium carbide ($Al_2O_3$—TiC). The slider is bonded to an elastic deformable supporting member, formed of stainless steel or the like, at the side opposite to the opposing face opposing the recording medium, thereby forming a magnetic head device.

Reference numeral 20 in FIG. 1 indicates a first electrode layer. The first electrode layer 20 may also be used as the gap layer described above or, when being formed of a magnetic material, the first electrode layer 20 may also be used as the shield layer. The first electrode layer 20 is formed of, for example, α-tantalum (Ta), gold (Au), chromium (Cr), copper (Cu), rhodium (Rh), iridium (Ir), ruthenium (Ru), or tungsten (W).

As shown in FIG. 1, on the first electrode layer 20, an underlying layer 21 is formed, and on the underlying layer 21, a seed layer 22 is formed.

The underlying layer 21 is preferably formed of at least one element selected from the group consisting of tantalum (Ta), hafnium (Hf), niobium (Nb), zirconium (Zr), titanium (Ti), molybdenum (Mo), and tungsten (W). In addition, the seed layer 22 described above is formed of a Ni—Fe—Cr alloy, chromium, or the like. When the seed layer 22 is formed, the crystal grain diameter of each layer formed thereon is increased, and hence changing rate of resistance or the like can be improved.

On the seed layer 22, a first antiferromagnetic layer 23 is formed. The antiferromagnetic layer 23 mentioned above is preferably formed of an antiferromagnetic material containing manganese (Mn) and element X (where X is at least one element selected from the group consisting of platinum (Pt), palladium (Pd), iridium (Ir), rhodium (Rh), ruthenium (Ru), and osmium (Os). For example, the antiferromagnetic layer 23 may be formed of a Pt—Mn alloy.

Alternatively, in the present invention, the first antiferromagnetic layer 23 described above may be formed of an X—Mn—X' alloy (where X' is at least one selected from the group consisting of neon (Ne), argon (Ar), krypton (Kr), xenon (Xe), beryllium (Be), boron (B), carbon (C), nitrogen (N), magnesium (Mg), aluminum (Al), silicon (Si), phosphorus (P), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), silver (Ag), cadmium (Cd), iridium (Ir), tin (Sn), hafnium (Hf), tantalum (Ta), tungsten (W), rhenium (Re), gold (Au), lead (Pb), and at least one of rare earth elements).

The composition ratio of the element X and the total of the elements X and X' are each preferably in the range of 45 to 60 atomic percent.

On the first antiferromagnetic layer 23, a fixed magnetic layer 27 is formed. In this embodiment, the fixed magnetic layer 27 is formed so as to have a laminated ferrimagnetic structure.

As shown in FIG. 1, the fixed magnetic layer 27 has the laminated structure composed of a magnetic layer 24, a nonmagnetic interlayer 25, and a magnetic layer 26 laminated to each other in that order from the bottom. In this embodiment, the magnetic layers 24 and 26 are formed of a magnetic material, such as a Co—Fe alloy, a Co—Fe—Ni alloy, Co, or a Ni—Fe alloy. In addition, the nonmagnetic interlayer 25 is preferably formed of a nonmagnetic conductive material such as Ru, Rh, Ir, Cr, Re, or Cu.

In the fixed magnetic layer 27 shown in FIG. 1, the magnetization of the magnetic layer 24 described above is fixed in, for example, the Y direction in the figure by an exchange coupling magnetic field generated between the magnetic layer 24 and the first antiferromagnetic layer 23. In addition, the magnetic layer 26 is magnetized in the direction opposite to the Y direction in the figure by a coupling magnetic field generated between the magnetic layer 26 and the magnetic layer 24 due to the RKKY interaction.

In the laminated ferrimagnetic structure, that is, the magnetic layer 24 and the magnetic layer 26 are magnetized so as to be antiparallel to each other. In order to form the laminated ferrimagnetic structure described above, the magnetic momentum (product of the saturated magnetization Ms and film thickness t) per unit area of the magnetic layer 24 must be different from that of the magnetic layer 26. For example, when the magnetic layer 24 and the magnetic layer 26 are formed of the same material, the film thickness of the magnetic layer 24 must be different from that of the magnetic layer.

As shown in FIG. 1, on the fixed magnetic layer 27, a nonmagnetic material layer 48 is formed. In this embodiment, the nonmagnetic material layer 48 has a two-layered structure composed of a lower layer 28, which is formed of a Cu layer, an Rh layer, an Ru layer, an Re layer, an Os layer, a Cr layer, an Ir layer, a Pt layer, a Pd layer, or a layer containing at least two elements forming the above layers, and an upper layer 29 which is formed of an Ru layer, an Rh layer, an Re layer, an Os layer, an Ir layer, a Pt layer, a Pd layer, or a layer containing at least two elements forming the layers mentioned above. In particular, the upper layer 29 is preferably formed of an Ru layer.

The thickness of the nonmagnetic material layer 48 is preferably in the range of 10 to 70 Å. In the nonmagnetic material layer 48 formed of Ru or the like, since a conductive up-spin or a down-spin electron has not so high transmittance and reflectance at the interface with element Fe or Co forming the fixed magnetic layer 28 and/or the free magnetic layer 32, the thickness of the nonmagnetic layer 48 is preferably not so large. The thickness of the nonmagnetic material layer 48 is more preferably in the range of 3 to 20 Å.

As described later in detail, the upper layer 29 formed of Ru or the like is a layer for appropriately protecting the lower layer 28 formed of Cu or the like from contamination or oxidation caused by exposure to the air. Even when being exposed to the air, the upper layer 29 formed of Ru or the like is unlikely to be contaminated and eroded by oxidation or the like, and hence the lower layer 28 is appropriately protected by the upper layer 29. In addition, since being formed of a nonmagnetic material, the upper layer 29 serves as the nonmagnetic material layer 48 together with the lower layer 28.

In FIG. 1, the nonmagnetic material layer 48 having a two-layered structure composed of the upper layer 29 and the lower layer 28 is shown; however, composition irregularity is allowed to occur at the interface between the lower layer 28 and the upper layer 29. In the present invention, the composition irregularity means the state in which element Ru, Rh, Re, Os, Ir, Pt, Pd, which forms the corresponding layer, or the mixture thereof is present at a high concentration in the upper surface side of the nonmagnetic material layer 48 as compared to that in the lower surface side thereof by mixing of the elements contained in the upper and the lower layers 28 and 29 performed at the interface therebetween.

As shown in FIG. 1, the laminate 30 formed of the layers from the first antiferromagnetic layer 23 to the nonmagnetic material layer 48 has continuous side surfaces 30a in the track width direction (X direction in the figure), and these side surfaces 30a are formed to be inclined or curved so that the distance between the side surfaces 30a is gradually decreased from the first antiferromagnetic layer 23 side to the nonmagnetic material layer 48 side (Z direction in the figure).

In the embodiment shown in FIG. 1, downside regions 23a of the first antiferromagnetic layer 23 are formed to further extend from two side surfaces 30a in the track width direction (X direction in the figure); however, the extending downside region 23a may be removed so that the seed layer 22, the underlayer 21, or the first electrode layer 20 is exposed.

The thickness from the upper surface of the downside region 23a of the first antiferromagnetic layer 23 to the upper surface thereof is approximately 100 to 150 Å.

As shown in FIG. 1, on the two sides of the laminate 30 in the track width direction (X direction in the figure), the insulating layers 31 are formed. The insulating layer 31 is formed of an insulating material such as $Al_2O_3$ or $SiO_2$.

In this embodiment, inner front portions 31b of the insulating layers 31 are preferably formed so as to extend onto the laminate 30. Accordingly, the two side regions of the laminate 30 can be appropriately placed in an insulating state. The thickness of the insulating layer 31 is approximately 150 Å.

In the present invention, as shown in FIG. 1, the free magnetic layer 32 is formed continuously on the insulating layers 31 and the laminate 30. The free magnetic layer 32 is formed of, for example, a Ni—Fe alloy, a Co—Fe alloy, a Co—Fe—Ni alloy, or Co.

In addition, the free magnetic layer 32 may be formed to have a laminated structure composed of magnetic materials, and for example, the structure formed of a Co—Fe alloy film and a Ni—Fe alloy film laminated to each other in that order from the bottom may be mentioned. When the Co—Fe alloy is formed at the side in contact with the laminate 30, diffusion of metal elements or the like at the interface with the nonmagnetic material layer 48 can be prevented, and hence, changing rate of resistance ($\Delta R/R$) can be increased.

As shown in FIG. 1, on the free magnetic layer 32, a nonmagnetic interlayer 33 is formed, and a ferromagnetic layer 34 is formed thereon. The nonmagnetic interlayer 33 is preferably formed of a nonmagnetic conductive material such as Ru, Rh, Ir, Cr, Re, or Cu. In addition, the ferromagnetic layer 34 is formed of a magnetic material such as a Ni—Fe alloy, a Co—Fe alloy, a Co—Fe—Ni alloy, or Co.

In addition, in the present invention, as shown in FIG. 1, on the ferromagnetic layer 34, a second antiferromagnetic layer 35 is formed. The second antiferromagnetic layer 35 is preferably formed of an antiferromagnetic material similar to that for the first antiferromagnetic layer 23. In particular, the second antiferromagnetic layer 35 is preferably formed of an antiferromagnetic material containing Mn and element X (where X is at least one element selected from the group consisting of Pt, Pd, Ir, Rh, Ru, and Os). For example, a Pt—Mn alloy may be used.

Alternatively, in the present invention, the second antiferromagnetic layer 35 described above may be formed of an X—Mn—X' alloy (where X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements).

The composition ratio of the element X and the total of the elements X and X' are each preferably in the range of 45 to 60 atomic percent.

As shown in FIG. 1, in the second antiferromagnetic layer 35, a recess portion 35a is formed from the surface thereof in the direction toward the laminate at the position opposing the laminate 30 in the thickness direction (Z direction in the figure).

In the embodiment shown in FIG. 1, the magnetization of the ferromagnetic layer 34 is fixed in the track width direction (X direction in the figure) by an exchange coupling magnetic field generated between the second antiferromagnetic layer 35 and the ferromagnetic layer 34; however, the magnetization of the central region (sensing region) A of the ferromagnetic layer 34, which is under the recess portion 35a formed in the second antiferromagnetic layer 35, is not fixed, and this central region A is placed in a weakly magnetized state so that the magnetization change may occur.

As described above, the recess portion 35a is formed in the second antiferromagnetic layer 35 at the central region thereof, and the thickness of the second antiferromagnetic layer 35 under the recess portion 35a is very small. For example, film thickness H1 of the second antiferromagnetic layer 35 under the recess portion 35a is 10 to 70 Å. As described above, since the film thickness H1 of the second antiferromagnetic layer 35 under the recess portion 35a is very small, an exchange coupling magnetic field is not substantially generated between the second antiferromagnetic layer 35 having the film thickness Hi and the ferromagnetic layer 34, and hence, the magnetization of the central region A of the ferromagnetic layer 34 under the recess portion 35a formed in the second antiferromagnetic layer 35 is not firmly fixed. On the other hand, sufficient exchange coupling magnetic fields are each generated between the ferromagnetic layer 34 at one of the side regions (non-sensing regions) B of the central region A and a corresponding thicker part of the antiferromagnetic layer 35 which is formed on the ferromagnetic layer 34 described above, and hence, the magnetizations of the individual side regions B of the ferromagnetic layer 34 are firmly fixed in the X direction in the figure.

In addition, the free magnetic layer 32 is magnetized antiparallel to the magnetization of the ferromagnetic layer 34 by a coupling magnetic field generated between the free magnetic layer 32 and the ferromagnetic layer 34 due to the RKKY interaction.

The magnetizations at two side regions (non-sensing regions) C of the free magnetic layer 32 are firmly fixed by the coupling magnetic field due to the RKKY interaction described above; however, the central region (sensing region) D of the free magnetic layer 32 is placed in a weakly magnetized state so that the magnetization thereof may vary in response to an external magnetic field. Accordingly, when an external magnetic field flows into this magnetic sensor, since the magnetization of the central region D of the free magnetic layer 32 and the magnetization of the central region A of the ferromagnetic layer 34 vary while an antiparallel state therebetween is maintained, and electrical resistance varies in accordance with the relation with the fixed magnetization of the fixed magnetic layer 27, external signals can be reproduced.

In addition, as shown in FIG. 1, a protective layer 36 composed of Ta or the like is provided on the second antiferromagnetic layer 35. However, the protective layer 36 is not formed in the recess portion 35a formed in the second antiferromagnetic layer 35.

An electrode layer (second electrode layer) 37 is formed continuously on the protective layer 36 and inside the recess portion 35a formed in the second antiferromagnetic layer 35. The second electrode layer 37 is formed of, for example, α-Ta, Au, Cr, Cu, Rh, Ir, Ru, or W. In addition, the second electrode layer 37 may also be used as the gap layer mentioned above, and when the second electrode layer 37 is formed of a magnetic material, it may also be used as the shield layer mentioned above.

Since the magnetic sensor of the present invention is a CPP type, as shown in FIG. 1, the electrode layers 20 and 37 are provided at the top and the bottom sides of the element in the thickness direction, respectively, and a sensing current from the electrode layer 20 or 37 flows through the individual layers forming the element in the direction perpendicular thereto.

Heretofore, the individual layers forming the magnetic sensor shown in FIG. 1 have been described, and hereinafter, structural features of the magnetic sensor of the present invention will be described.

(1) The free magnetic layer 32 is formed continuously on the insulating layers 32 and the laminate 30 and is also formed so that the width of the free magnetic layer 32 in the track width direction (X direction in the figure) extends larger than the track width Tw (in this embodiment, the track width Tw means the magnetic track width, and hereinafter, the magnetic track width will be simply referred to as the track width Tw).

In the embodiment shown in FIG. 1, the track width Tw is determined by the width dimension in the track width direction (X direction in the figure) of a bottom surface 35c of the recess portion 35a formed in the second antiferromagnetic layer 35.

As described above, the central region D of the free magnetic layer 32, located at the position opposing the recess portion 35a in the thickness direction, is a sensing region in which magnetization change may occur in response to an external magnetic field, and the width dimension of this central region D in the track width direction is approximately equal to the track width Tw described above.

Concomitant with the trend toward higher recording density in the future, the track width Tw tends to become increasingly smaller. For example, the track width Tw will be decreased to approximately 0.1 μm.

Accordingly, when the width dimension of the free magnetic layer 32 in the track width direction is formed by the track width Tw as in a conventional case, the size of the free magnetic layer 32 is extremely decreased, influence of a demagnetizing field is increased, and hence it becomes very difficult to appropriately put the free magnetic layer 32 in a single domain state.

In contrast, according to the present invention, regardless of the dimension of the track width Tw, the free magnetic layer 32 can be formed having a large width in the track width direction. In addition, since a so-called exchange bias method is employed in which the thick second antiferromagnetic layer 35 is formed at the upper sides of the two side regions (non-sensing regions having no relation with the magnetoresistive effect) C of the free magnetic layer 32, i.e., the regions other than the central region D thereof at which the track width Tw region (sensing region) is formed, the demagnetizing field is weak, the magnetizations of the two side regions C are appropriately fixed in the track width direction, and the central region D can be placed in a weak single domain state so that magnetization change may occur in response to an external magnetic field. As a result, a magnetic sensor having superior sensitivity can be obtained even when the track width Tw is decreased.

In particular, in the present invention, since the free magnetic layer 32 can be formed so as to extend onto the insulating layers 31 formed on the two sides of the laminate 30, regardless of the width dimension of the laminate 30 in addition to the dimension of the track width Tw, the width dimension of the free magnetic layer 32 can be determined.

Figure 11:
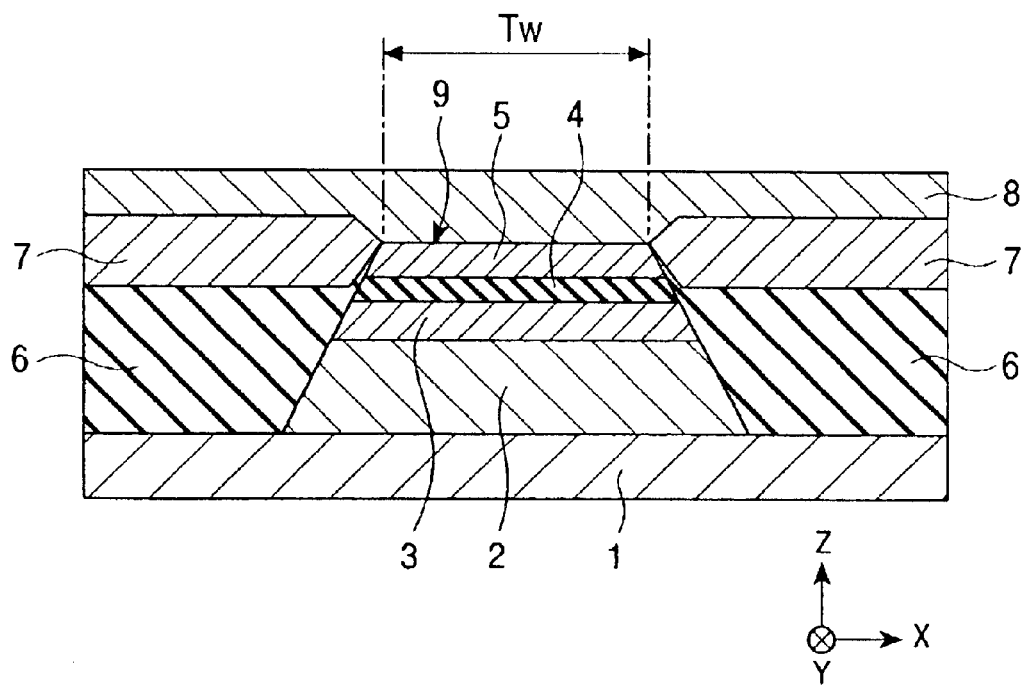
FIG. 11 is a view showing a conventional CPP type magnetic sensor (spin-valve type thin-film element) when it is viewed from an opposing face opposing a recording medium.
Figure 12:
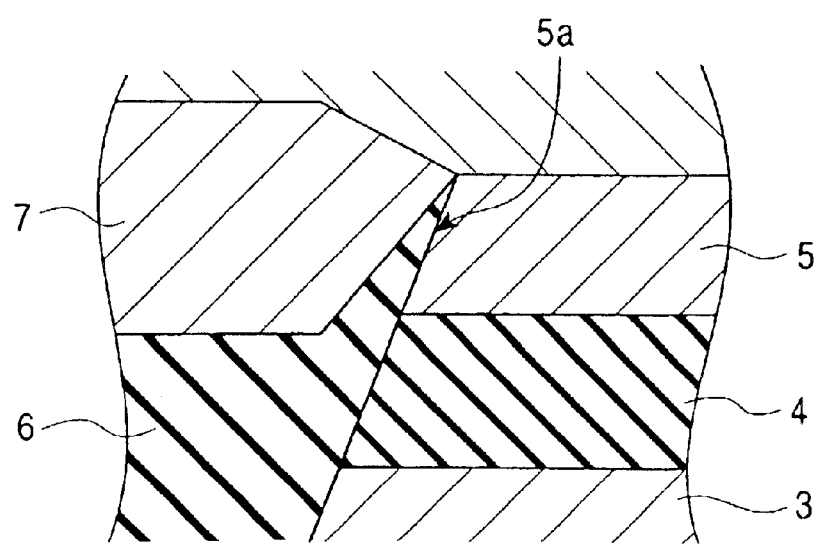
FIG. 12 is an enlarged view of a part of the conventional CPP type magnetic sensor shown in FIG. 11.

For example, as shown in a conventional case in FIG. 11, when the free magnetic layer 5 is provided as a part of the laminate 9, and the width dimension of the laminate 9 is increased, the width dimension of the free magnetic layer 5 can be increased; however, the width dimension of the free magnetic layer cannot be larger than that of the laminate 9.

In addition, in the laminate 9 shown in FIG. 11, even when an exchange bias method is used, the width of the laminate 9 itself must be decreased with relation to DC resistance or the like as described later, and hence the width dimension of the free magnetic layer 5 cannot be sufficiently increased as long as the width of the laminate 9 is equal to that of the free magnetic layer 5. In the case described above, even when an exchange bias method is used, output that appropriately meets the requirement of higher recording density in the future cannot be obtained.

In contrast, according to the present invention, the width dimension of the free magnetic layer 32 can be defined regardless of the width dimension of the laminate 30 in addition to the dimension of the track width Tw, and hence even when the track width Tw and the width of the laminate 30 are decreased, the free magnetic layer can be formed to have a large width extending in the width direction.

Accordingly, in the present invention, magnetization control of the free magnetic layer 32 can be more appropriately and easily performed than that in the past.

(2) The insulating layers 31 are formed on the two sides in the track width direction of the laminate 30 composed of the layers from the first antiferromagnetic layer 23 to the nonmagnetic material layer 48, and the free magnetic layer 32 is formed continuously on the insulating layers 31 and the nonmagnetic material layer 48.

Since the insulating layers 31 are formed on the two sides in the track width direction of the laminate 30, a current flowing from the electrode layer 20 or 37 appropriately flows in the laminate through the free magnetic layer 32.

That is, a current surely flows from the free magnetic layer 32 to the inside of the laminate 30 or from the inside of the laminate 30 to the free magnetic layer 32, and hence current shunt is unlikely to occur in this structure.

The reason for this is that an exchange bias method in which the second antiferromagnetic layer 35 is provided for magnetization control of the free magnetic layer 32 is employed. In the past, a hard bias method in which hard bias layers are provided on the two sides of the free magnetic layer 32 for magnetization control thereof has been used; however, a current is likely to be shunted to the hard bias layers, and as a result, so-called shunt loss has been increased.

In contrast, according to the present invention, in addition to the formation of the insulating layers 31 covering the two sides of the laminate 30, by performing the magnetization control of the free magnetic layer 32 using an exchange bias method, since a current surely flows from the free magnetic layer 32 to the inside of the laminate 30 or from the laminate 30 to the free magnetic layer 32, a shunt current is decreased as compared to that in a hard bias method, and hence changing rate of resistance can be improved due to the decrease of shunt loss.

In the present invention, as described above, even when the track width Tw is decreased, a CPP (current-perpendicular-to-plane) type magnetic sensor having superior sensitivity, high reproducing output, and a high changing rate of resistance can be appropriately and easily manufactured.

Next, in the present invention, width dimension T1 in the track width direction (X direction in the figure) of an upper surface 30b of the laminate 30 is preferably equal to or smaller than the track width Tw.

The width dimension T1 in the track width direction of the upper surface 30b of the laminate 30 is defined as an electric track width. In a CPP type magnetic sensor, the width dimension T1 is preferably decreased as small as possible so as to increase DC resistance (DCR).

On the other hand, the width dimension in the track width direction of a bottom surface 35c of the recess portion 35a is defined as a magnetic track width Tw. That is, the central region A of the ferromagnetic layer 34 and the central region D of the free magnetic layer 32, which are located at positions opposing the recess portion 35a, substantially serve as sensing regions of the magnetoresistive effect.

In order to realize higher recording density, the magnetic track width Tw must be decreased so as to improve recording density; however, when the magnetic track width Tw is too much decreased, the sensing region is too much decreased, and as a result, reproducing output is largely degraded.

Hence, the magnetic track width Tw is preferably decreased to the level at which high recording density can be appropriately realized and reproducing output is not degraded, and in addition, the width dimension (electric track width) of the upper surface 30b of the laminate 30 is preferably formed approximately equal to or smaller than the magnetic track width Tw so that DC resistance (DCR) of the element is more reliably increased.

Accordingly, in the present invention, the width dimension T1 in the track width direction of the upper surface 30b of the laminate 30 is defined to be equal to or smaller than the width dimension (equal to the magnetic track width Tw) in the track width direction of the bottom surface 35c of the recess portion 35a.

It is preferable that the track width Tw of the recess portion 35a be approximately 0.1 $\mu$m and that the width dimension T1 of the laminate 30 be 0.1 $\mu$m or less.

Accordingly, both reproducing output and DC resistance (DCR) can be appropriately increased.

In the present invention, the reason the dimensional relationship between the width dimension T1 in the track width direction of the upper surface 30b of the laminate 30 and the width dimension (magnetic track width Tw) in the track width direction of the bottom surface 35c of the recess portion 35a is defined so that T1 is equal to or smaller than Tw is that since the free magnetic layer 32 is formed continuously on the laminate 30 and the insulating layers 31 formed on the two sides thereof, the width dimension in the track width direction of the second antiferromagnetic layer 35 provided at the upper side of the free magnetic layer 32 can be formed larger than the width direction T1 of the upper surface 30b of the laminate 30. Accordingly, in the present invention, regardless of the width dimension T1 of the upper surface 30b of the laminate 30, the recess portion 35a having the width equal to or larger than the width dimension T1 can be formed in the second antiferromagnetic layer 35.

Next, the shape or the like of the recess portion 35a formed in the second antiferromagnetic layer 35 will be described.

In the embodiment shown in FIG. 1, inner side surfaces 35b of the recess portion 35a are formed in the vertical direction (Z direction in the figure) from the bottom surface 35c; however, the inner side surfaces 35b may be formed to be inclined or curved so that the distance between the inner side surfaces 35b is gradually increased from the bottom surface 35c of the recess portion 35a to the top portion thereof.

In the embodiment shown in FIG. 1, a part of the second antiferromagnetic layer 35 remains under the recess portion 35a, and as described above, since the thickness H1 of the second antiferromagnetic layer 35 under the recess portion 35a is very small, an exchange coupling magnetic field is not substantially generated between the ferromagnetic layer 34 and the part of the second antiferromagnetic layer 35.

In the case of the CPP type magnetic sensor of the present invention, even when a part of the second antiferromagnetic layer 35 remains under the recess portion 35a, the generation of current shunt loss can be appropriately suppressed as compared to the case of a CIP type (in which a current flows along a film surface of each layer) magnetic element.

In the case of a CPP type magnetic sensor as in the present invention, since a sense current flows through the individual layers perpendicular to the surfaces thereof, even when a part of the second antiferromagnetic layer 35 remains at the upper side of the central region (sensing region) D of the free magnetic layer 32 that substantially contributes to the magnetoresistive effect, a sense current flows through the central region D of the free magnetic layer 32 via this second antiferromagnetic layer 35. Accordingly, shunt loss is unlikely to occur.

However, in the case of a CIP type, when a part of the second antiferromagnetic layer 35 remains above the central region D of the free magnetic layer 32, a sense current flowing through the part of the second antiferromagnetic layer 35 mentioned above does not flow into the free magnetic layer 32 (even when a part of that flows thereinto); however, it flows primarily in the direction (X direction in the figure) parallel, to the film surface of the second antiferromagnetic layer 35. That is, this phenomenon causes shunt loss, resulting in degradation of changing rate of resistance.

As described above, in the CPP type magnetic sensor of the present invention, even when the part of the second antiferromagnetic layer 35 remains above the central region (sensing region) D of the free magnetic layer 32, the changing rate of resistance is unlikely to decrease, the formation of the recess portion 35a is easy as compared to the case of a CIP type magnetic sensor, and a magnetic sensor having a high changing rate of resistance can be effectively formed.

In this embodiment, the recess portion 35a is formed by excavating the second antiferromagnetic layer 35 by, for example, ion milling. Accordingly, by measuring the amount excavated, the dimension of the film thickness H1 can be appropriately controlled, and when the amount excavated is increased, all the second antiferromagnetic layer 35 at the recess portion 35a in the thickness direction may be removed in some cases so that the surface of the ferromagnetic layer 34 is exposed.

In the case described above, according to the present invention, since the surface of the ferromagnetic layer 34 is polished away to some extent as shown by the dotted line, the bottom surface 35c of the recess portion 35a is located at the position lower than an upper surface 34a of the ferromagnetic layer 34 (see the dotted outgoing line provided with reference numeral 35c).

In addition, the surface of the nonmagnetic interlayer 33 may be exposed at the bottom of the recess portion 35a by removing all the ferromagnetic layer 34 opposing the position in the thickness direction at which the recess portion 35a is formed.

However, it is not preferable that the surface of the free magnetic layer 32 be exposed at the bottom of the recess portion 35a by removing all of a part of the nonmagnetic interlayer 33 opposing the position in the thickness direction at which the recess portion 35a is formed. When all of the part of the nonmagnetic interlayer 33 described above is removed, the free magnetic layer 32 is also partly polished away. Since the central region D of the free magnetic layer 32 is substantially a sensing region of the magnetoresistive effect, the reproducing properties are considerably affected by the change in film thinness in this region, and hence degradation of reproducing properties is liable to occur. In addition, when the free magnetic layer 32 is exposed to and then contaminated by outside air, the reproducing properties may be degraded.

Accordingly, in order not to expose the surface of the free magnetic layer 32, the recess portion 35a must be formed by controlling ion milling time or the like so that the nonmagnetic interlayer 33 at least remains on the free magnetic layer 32.

Figure 2:
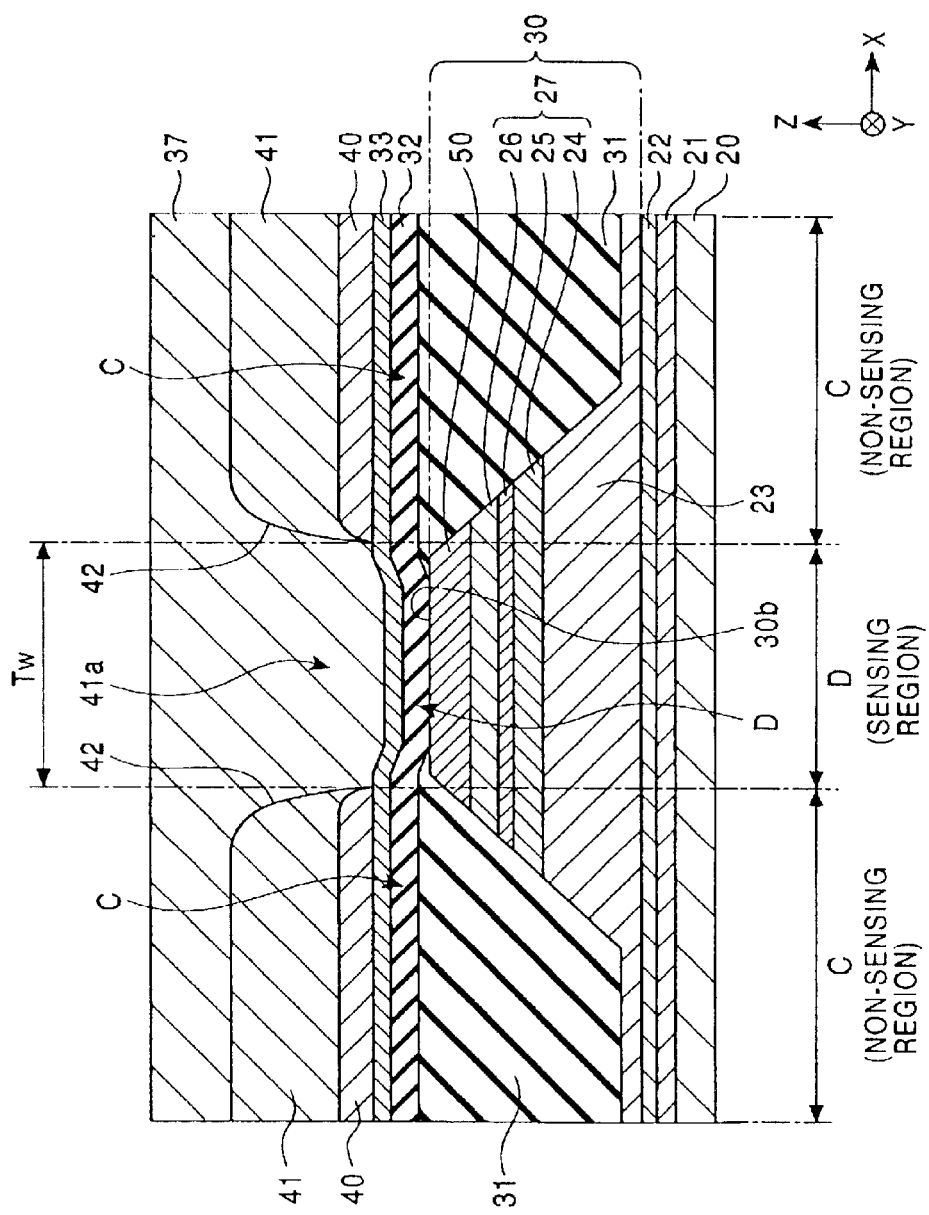
FIG. 2 is a partial cross-sectional view of a CPP type magnetic sensor (spin-valve type thin-film element) according to a second embodiment of the present invention when it is viewed from an opposing face opposing a recording medium.

FIG. 2 is a partial cross-sectional view showing the structure of a CPP type magnetic sensor (spin-valve type thin-film element) of a second embodiment of the present invention when it is viewed from an opposing face opposing a recording medium. The same reference numerals of layers in FIG. 1 designate the same layers in this figure.

In the embodiment shown in FIG. 2, the structure of the laminate 30, the insulating layers 31 formed on the two sides in the track width direction of the laminate 30, the free magnetic layer 32 formed continuously on the insulating layers 31 and the laminate 30, and the nonmagnetic interlayer 33 formed on the free magnetic layer 32 are the approximately equivalent to those described in FIG. 1.

The point in FIG. 2 different from that in FIG. 1 is that a recess portion 41a formed between second antiferromagnetic layers 41 and between ferromagnetic layers 40 extends to the nonmagnetic interlayer 33 so that the surface thereof is exposed at the bottom of the recess portion 41a.

As described above, in the case shown in FIG. 1, the nonmagnetic interlayer 33 can be exposed at the bottom of the recess portion 35a; however, since the recess portion 35a shown in FIG. 1 is formed by excavation using ion milling or the like, a part of the surface of the nonmagnetic interlayer 33 is also excavated, and hence the part thus excavated tends to be thin.

In the case shown in FIG. 2, since the recess portion 41a is formed by forming the ferromagnetic layers 40 and the second antiferromagnetic layers 41 having the shape shown in FIG. 2 on the nonmagnetic interlayer 33 using a resist, excavation is not carried out by ion milling for forming the recess portion 41a. A manufacturing method for the structure shown in FIG. 2 will be described later in detail.

Accordingly, in FIG. 2, since the surface of the nonmagnetic interlayer 33 exposed at the bottom of the recess portion 41a is flat without excavated traces, the thickness of the nonmagnetic interlayer 33 under the recess portion 41a is approximately equal to that of the nonmagnetic interlayer 33 at the position other than that under the recess portion 41a. In addition, the surface of the nonmagnetic interlayer 33 including the part thereof exposed at the bottom of the recess portion 41a is formed so as to have an approximately planarized surface.

In the embodiment shown in FIG. 2, the inner side surfaces 42 of the ferromagnetic layers 40 and the second antiferromagnetic layers 41 formed on the nonmagnetic interlayer are formed to be inclined or curved so that the distance between the inner side surfaces 42 is gradually increased from the lower position to the upper position (Z direction in the figure).

In the embodiment shown in FIG. 2, as is the embodiment shown in FIG. 1, the free magnetic layer 32 is formed continuously on the insulating layers 31 and the laminate 30, and the width dimension in the track width direction (X direction in the figure) of the free magnetic layer 32 is formed to extend larger than the track width W and the width direction of the laminate 30.

In addition, since a so-called exchange bias method is employed in which the second antiferromagnetic layers 41 having a larger thickness are formed above two side regions (non-sensing regions) C of the free magnetic layer 32 other than the central region D which is used as the track width Tw region (sensing region), the magnetization of the two side regions C mentioned above can be appropriately fixed in the track width direction, the central region D can be placed in a weak single domain state so that the magnetization thereof may vary in response to an external magnetic field, and hence a magnetic sensor having superior sensitivity can be manufactured even when the track width Tw and the size of the laminate 30 are decreased.

In addition, the insulating layers 31 are formed on the two sides in the track width direction (X direction in the figure) of the laminate 30 formed of the layers from the first antiferromagnetic layer 23 to a nonmagnetic material layer 50, and the free magnetic layer 32 is formed continuously on the insulating layers 31 and the nonmagnetic material layer 50.

As described above, since the insulating layers 31 are formed on the two sides in the track width direction of the laminate 30, a current flowing from the electrode layer 20 or 37 appropriately flows inside the laminate 30.

That is, in the present invention, since the two sides of the laminate 30 are covered with the insulating layers 31, and an exchange bias method in which the magnetization control of the free magnetic layer 32 is performed using the second antiferromagnetic layer 41 is employed, a current flowing from the free magnetic layer 32 to the laminate 30 is prevented from being shunted to a route other than that mentioned above, and as a result, changing rate of resistance can be improved due to decrease of so-called shunt loss.

As described above, in the present invention, even when the track width Tw is decreased, a CPP type magnetic sensor (spin-valve type thin-film element) having superior sensitivity, high reproducing output, and high changing rate of resistance can be appropriately and easily manufactured.

In the embodiment shown in FIG. 2, the nonmagnetic material layer 50 has a single-layered structure. This nonmagnetic material layer 50 is formed of Ru or the like which forms the upper layer 29 of the nonmagnetic material layer 48 shown in FIG. 1. Since every material such as Ru and the like for forming the upper layer 29 described above is a nonmagnetic material, a layer formed of the material mentioned above can be used as the nonmagnetic material layer 50. In addition, when the nonmagnetic material layer 50 has a single-layered structure composed of a material such as Ru for forming the upper layer 29, the nonmagnetic material layer 50 can be appropriately protected from contamination and oxidation caused by exposure to the air.

In addition, according to the manufacturing method described later, in a step of forming the free magnetic layer 32 after the nonmagnetic material layer 50 is formed, when the element is not exposed to the air, in a manner similar to that in the past, the nonmagnetic material layer 50 may be formed from only one material such as Cu forming the lower layer 28 shown in FIG. 1.

The structure of the nonmagnetic material layer 50 can also be applied to the embodiment shown in FIG. 1 and that shown in FIG. 3 which will be described below.

Figure 3:
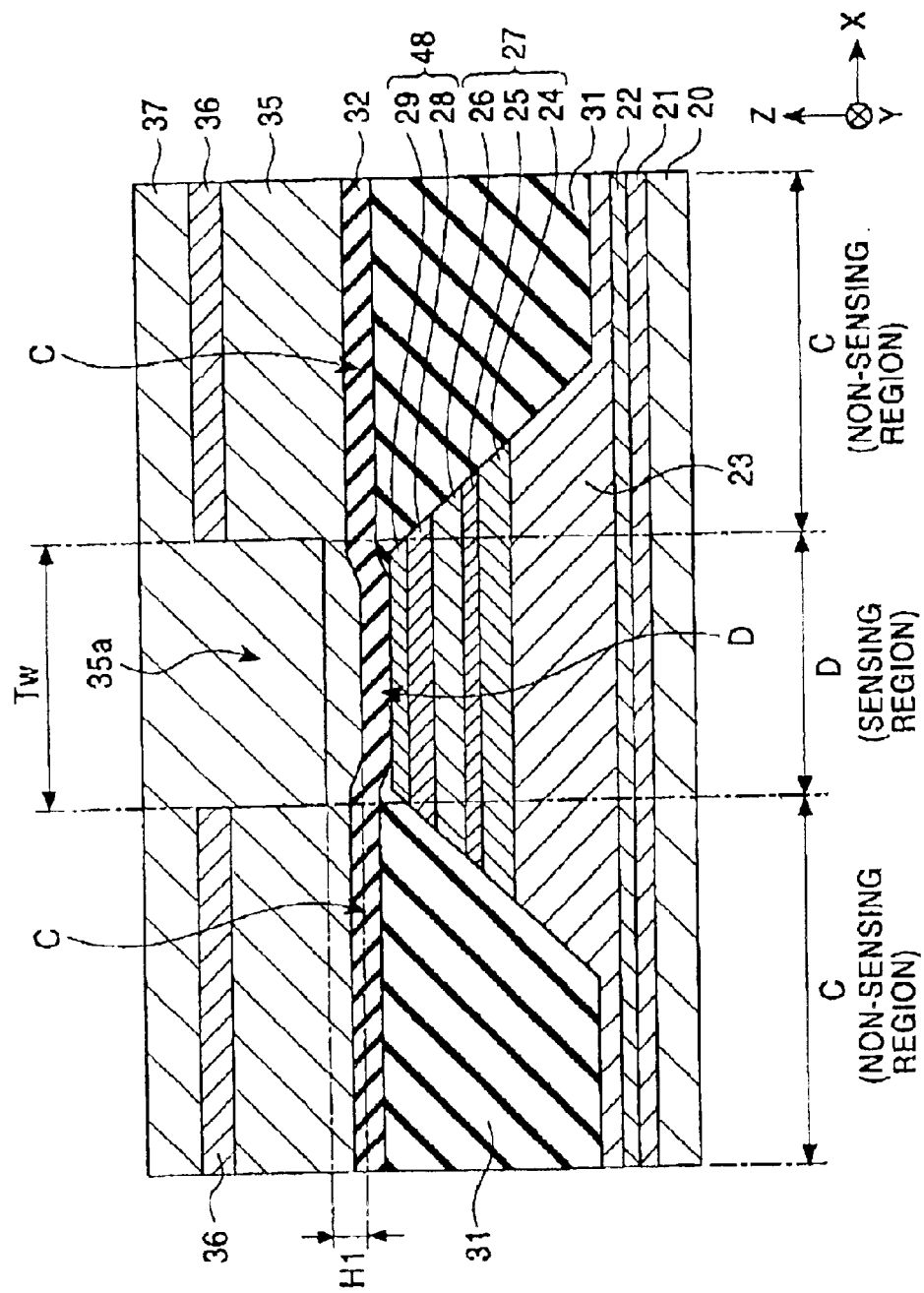
FIG. 3 is a partial cross-sectional view of a CPP type magnetic sensor (spin-valve type thin-film element) according to a third embodiment of the present invention when it is viewed from an opposing face opposing a recording medium.

FIG. 3 is a partial cross-sectional view showing the structure of a CPP type magnetic sensor (spin-valve type thin-film element) of a third embodiment of the present invention when it is viewed from an opposing face opposing a recording medium. The same reference numerals of layers in FIG. 1 designate the same layers in this figure.

The point of the embodiment shown in FIG. 3 different from that of the embodiments shown in FIGS. 1 and 2 is that the nonmagnetic interlayer 33 and the ferromagnetic layer 34 are not formed between the free magnetic layer 32 and the second antiferromagnetic layer 35.

In the embodiments shown in FIGS. 1 and 2, a laminated ferrimagnetic structure composed of the nonmagnetic interlayer 33 and the ferromagnetic layer 34 is formed at each side region C of the free magnetic layer 32, and the magnetization control of the free magnetic layer 32 is performed by an exchange bias method using a synthetic bias coupling in combination of the laminated ferrimagnetic structure and the second antiferromagnetic layer.

On the other hand, as shown in FIG. 3, the second antiferromagnetic layer 35 is directly formed on the free magnetic layer 32, and by an exchange coupling magnetic field generated between the second antiferromagnetic layer 35 and the free magnetic layer 32, the free magnetic layer 32 is magnetized in the track width direction (X direction in the figure).

In this embodiment, the width dimension in the track width direction of the bottom surface of the recess portion 35a formed in the second antiferromagnetic layer 35 is defined as the track width Tw (electric track width), and the film thickness H1 of the second antiferromagnetic layer 35 remaining under the recess portion 35a is very thin. Accordingly, an exchange coupling magnetic field is not substantially generated between the second antiferromagnetic layer 35 and the free magnetic layer 32 in this region described above, and hence, the magnetization of the central region (sensing region) D of the free magnetic layer 32 under the recess portion 35a is not firmly fixed.

On the other hand, in each of the two side regions (non-sensing regions) C of the free magnetic layer 32 located at both sides of the central region A, a large exchange coupling magnetic field is generated between the free magnetic layer 32 and the thicker part of the antiferromagnetic layer 35 formed thereon, and hence, the magnetizations of the two side regions C are firmly fixed in the track width direction.

The width dimension in the track width direction of the central region D of the free magnetic layer 32 is approximately equal to that of the track width Tw determined by the width dimension of the bottom surface of the recess portion 35a, and since the magnetizations of the two side regions C of the free magnetic layer 32 are fixed in the X direction, the magnetization of the central region D of the free magnetic layer 32 is aligned so as to be inverted in response to an external magnetic field.

In the embodiment shown in FIG. 3, as in the embodiment shown in FIG. 1, the free magnetic layer 32 is formed continuously on the insulating layers 31 and the laminate 30, and the width dimension of the free magnetic layer 32 in the track width direction (X direction in the figure) is formed to extend larger than the width dimension of the track width Tw and the width dimension of the laminate 30.

Since a so-called exchange bias method is employed in which the thick second antiferromagnetic layer 35 is formed on the two side regions (non-sensing regions) C of the free magnetic layer 32 other than the central region D at which the track width Tw region (sensing region) is formed, the magnetizations of the two side regions C can be appropriately fixed in the track width direction, the central region D can be placed in a weak single domain state so that magnetization thereof may vary in response to an external magnetic field, and hence a magnetic sensor having superior sensitivity can be manufactured even when the track width Tw and the size of the laminate 30 are decreased.

In addition, the insulating layers 31 are formed on the two sides in the track width direction of the laminate 30 composed of the layers from the first antiferromagnetic layer 23 to the nonmagnetic material layer 48, and the free magnetic layer 32 is formed continuously on the insulating layers 31 and the nonmagnetic interlayer 48.

As described above, since the insulating layers 31 are formed on the two sides of the laminate 30 in the track width direction, a current from the electrode layer 20 or 37 appropriately flows from the free magnetic layer 32 to inside the laminate 30 or from the laminate 30 to the free magnetic layer 32.

That is, in the present invention, since the two sides of the laminate 30 are covered with the insulating layers 31, and an exchange bias method in which the magnetization control of the free magnetic layer 32 is performed using the second antiferromagnetic layer 35 is employed, a current flowing from the free magnetic layer 32 to the laminate 30 is prevented from being shunted to a route other than that mentioned above, and as a result, the changing rate of resistance can be improved due to decrease of so-called shunt loss.

As described above, in the present invention, even when the track width Tw is decreased, a CPP type magnetic sensor (spin-valve type thin-film element) having superior sensitivity, high reproducing output, and high changing rate of resistance can be appropriately and easily manufactured.

FIGS. 4 to 8 show steps of manufacturing a CPP type magnetic sensor (spin-valve type thin-film element) of the present invention. The figures are partial cross-sectional views showing the magnetic sensor when it is viewed form an opposing face opposing a recording medium.

Figure 4:
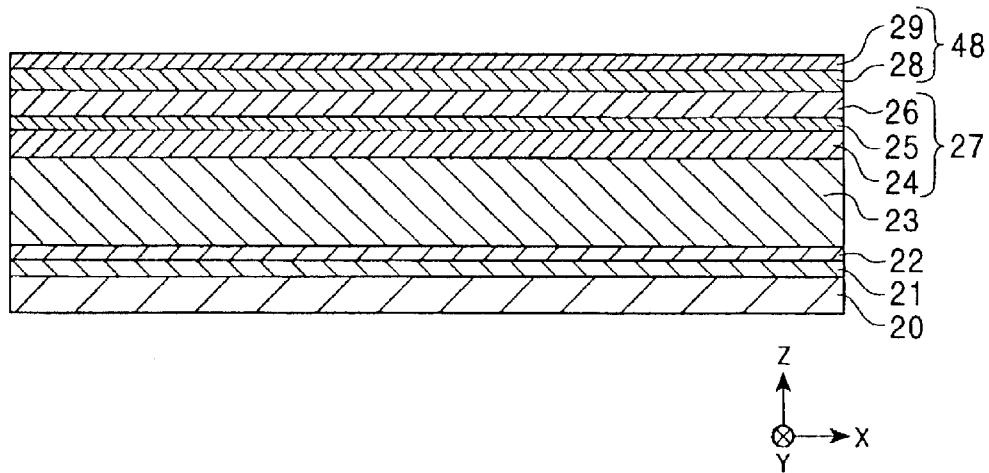
FIG. 4 is a view showing a step of forming the CPP type magnetic sensor having the structure of the present invention shown in FIG. 1.

In the step shown in FIG. 4, the first electrode layer 20, the underlying layer 21, the seed layer 22, the first antiferromagnetic layer 23, the fixed magnetic layer 27, the nonmagnetic material layer 48 composed of the lower layer 28 and the upper layer 29 are sequentially formed from the bottom. In this film-forming step, sputtering or deposition may be used.

In the present invention, it is preferable that the first electrode layer 20 be formed of α-Ta, Au, Cr, Cu, Rh, Ir, Ru, or W, that the underlying layer 21 be formed of at least one element selected from the group consisting of Ta, Hf, Nb, Zr, Ti, Mo, and W, the seed layer 22 be formed of a Ni—Fe—Cr alloy, Cr, or the like, and that the first antiferromagnetic layer 23 be formed of an antiferromagnetic material containing Mn and element X (where X is at least one element selected from the group consisting of Pt, Pd, Ir, Rh, Ru, and Os) or be formed of an X—Mn—X' alloy (where X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements).

In addition, the underlying layer 21 and the seed layer 22 used in the manufacturing step shown in FIG. 4 may be or may not be provided.

Next, the fixed magnetic layer 27 has a so-called laminated ferrimagnetic structure composed of three layers, that is, the magnetic layers 24 and 26 and the nonmagnetic interlayer 24 provided therebetween. In the present invention, the magnetic layers 24 and 26 are preferably formed of a Co—Fe alloy, a Co—Fe—Ni alloy, Co, a Ni—Fe alloy, or the like. In addition, the nonmagnetic interlayer 25 is preferably formed of a nonmagnetic conductive material such as Ru, Rh, Ir, Cr, Re, or Cu.

In order to form an appropriate laminated ferrimagnetic structure, the magnetic momentum (product of the saturated magnetization Ms and film thickness t) per unit area of the magnetic layer 24 must be different from that of the magnetic layer 26. For example, when the same material is used for forming the magnetic layers 24 and 26, the magnetic layer 24 is formed so as to have a thickness different from that of the magnetic layer 26.

After the first antiferromagnetic layer 23 and the fixed magnetic layer 27 are formed, an exchange coupling magnetic field is generated between the first antiferromagnetic layer 23 and the fixed magnetic layer 27 by performing heat treatment, thereby magnetizing the fixed magnetic layer 27 in the height direction (Y direction in the figure). The magnetic layers 24 and 26 forming the fixed magnetic layer 27 are magnetized so as to be antiparallel to each other. In addition, this heat treatment may be performed at any time, and for example, it may be performed after the nonmagnetic material layer 48 is formed or after the fixed magnetic layer is formed.

In addition, the lower layer 28 forming the nonmagnetic material layer 48 is preferably formed of a Cu layer, an Rh layer, an Ru layer, an Re layer, an Os layer, a Cr layer, an Ir layer, a Pt layer, a Pd layer, or a layer containing at least two elements forming the layers mentioned above.

The nonmagnetic material layer 48 of the present invention has a laminated structure composed of the lower layer 28 and the upper layer 29 provided thereon. The upper layer 29 is preferably formed of an Ru layer, an Rh layer, an Re layer, an Os layer, an Ir layer, a Pt layer, a Pd layer, or a layer containing at least two elements forming the layers mentioned above. In particular, the upper layer 29 is preferably formed of an Ru layer. By providing the upper layer 29, in the case in which a magnetic sensor having the film structure shown in FIG. 4 is exposed to the air when being transferred to another apparatus, damage done to the lower layer 28 by exposure to the air can be suppressed.

When the upper layer 29 composed of Ru or the like is not provided, the lower layer 28 composed of Cu or the like is contaminated by exposure to the air and is susceptible to oxidation, and as a result, the changing rate of resistance may be easily decreased due to degradation of the bulk scattering effect.

Accordingly, by providing the upper layer 29 composed of Ru or the like on the lower layer 28 composed of Cu, the functions as the nonmagnetic material layer 48 can be appropriately maintained.

Alternatively, instead of forming the nonmagnetic material layer 48 having a two-layered structure, for examples, as is the magnetic sensor shown in FIG. 2, the nonmagnetic material layer 50 having a single-layered structure may be formed. In the case described above, the nonmagnetic material layer 50 is preferably formed of the same material for forming the upper layer 29. Accordingly, even when being exposed to the air, the nonmagnetic material layer 50 can be appropriately prevented from being contaminated or oxidized.

In addition, when the magnetic sensor shown in FIG. 4 is not exposed to the air, the nonmagnetic material layer 50 may be formed having a mono-layered structure composed of the same material, such as Cu, as that used for forming the lower layer 28 shown in FIG. 4.

In FIG. 4, the nonmagnetic material layer 48 having an apparent two-layered structure composed of the lower layer 28 and the upper layer 29 is shown. However, by heat treatment or the like carried our in a subsequent step, thermal diffusion may occur between the lower layer 28 and the upper layer 29, and in this case, the interface therebetween may not be clearly identified in some cases. Although, when it is confirmed by composition analysis that a material such as Cu forming the lower layer 28 and a material such as Ru forming the upper layer are mixed together in the nonmagnetic material layer 48, it can be estimated that a two-layered structure as shown in FIG. 4 is formed at the beginning. In addition, according to the composition analysis mentioned above, the composition irregularity can be confirmed in which element Ru, Rh, Re, Os, Ir, Pt, Pd, or the mixture thereof is present at a high concentration in the upper surface side of the nonmagnetic material layer 48 as compared to that in the lower surface side thereof.

Figure 5:
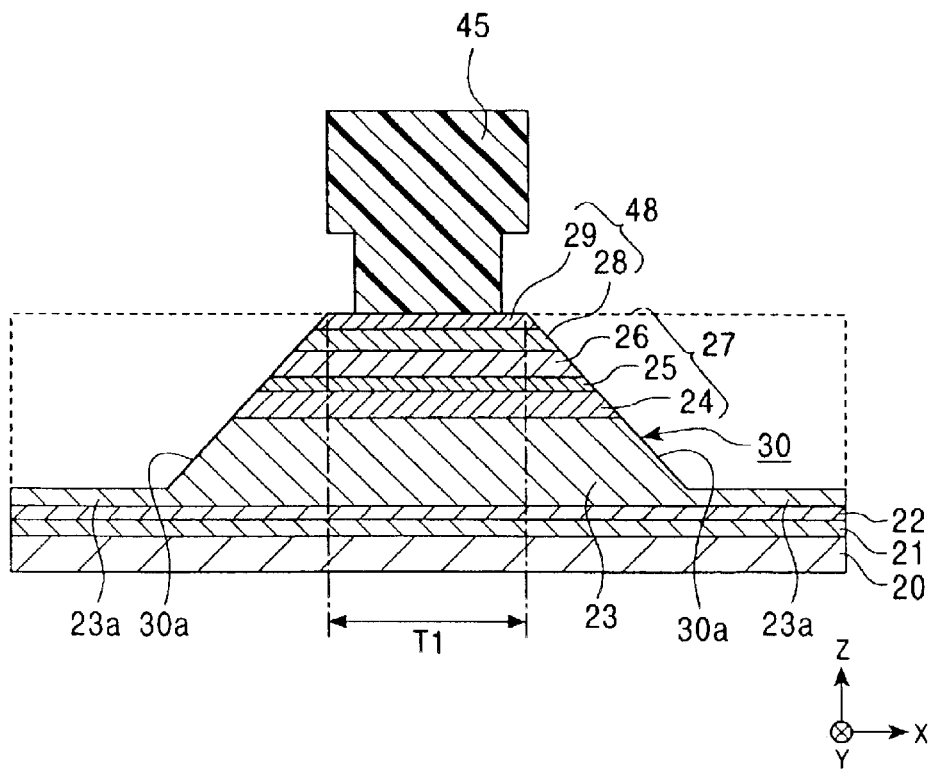
FIG. 5 is a view showing a step performed after the step shown in FIG. 4.

Next, in the step shown in FIG. 5, a lift-off resist layer 45 (see FIG. 5) is formed on the nonmagnetic material layer 48 shown in FIG. 4.

Next, the two side regions, which are not covered with the resist layer 45, in the track width direction (X direction in the figure) of the laminate 30 formed of the layers from the first antiferromagnetic layer 23 to the nonmagnetic material layer 48 are removed by ion milling. In FIG. 5, the parts thus removed are indicated by the dotted line.

In the step shown in FIG. 5, the two side surfaces 30a in the track width direction of the laminate 30, which are left behind below the resist layer 45, are formed to be inclined or curved so that the width dimension in the track width direction of the laminate 30 is gradually decreased from the lower side to the upper side (from the first antiferromagnetic layer 23 side to the nonmagnetic material layer 48 side, i.e., Z direction in the figure).

The size of the resist layer 45 is adjusted so that the width dimension T1 in the track width direction of the upper surface 30b of the laminate 30 which is left behind below the resist layer 45 is approximately 0.1 $\mu$m or less.

In addition, in FIG. 5, the downside regions 23a of the first antiferromagnetic layer 23 are formed to further extend in the track width direction (X direction in the figure) from the two side surfaces 30a; however, all the extending downside region 23 may be removed so as to form the first antiferromagnetic layer 23 in an approximately trapezoid shape. In this case, the seed layer 22, the underlayer 21, or the first electrode layer 20 is exposed at the two sides in the track width direction of the laminate 30 thus formed.

Figure 6:
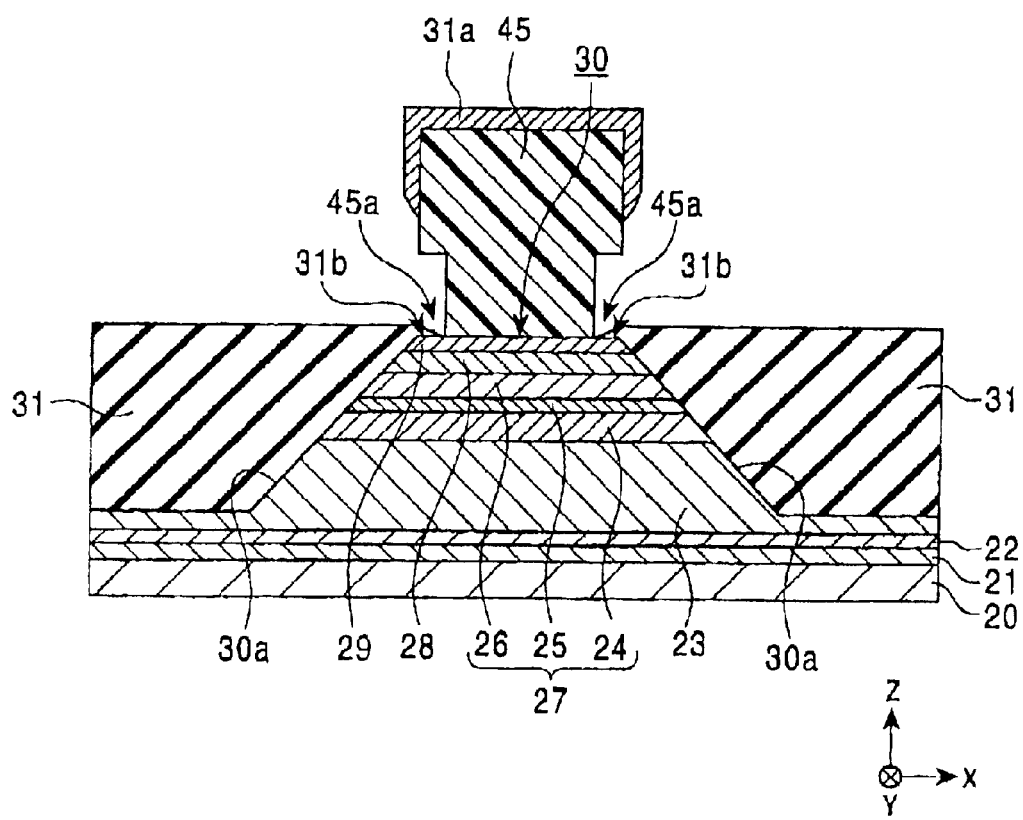
FIG. 6 is a view showing a step performed after the step shown in FIG. 5.

Next, in the step shown in FIG. 6, the insulating layers 31 are formed on the two side surfaces in the track width direction of the laminate 30 shown in FIG. 5 (see FIG. 6). The film formation mentioned above is performed by sputtering or deposition.

In the present invention, the insulating layer 31 is preferably formed of an insulating material such as $Al_2O_3$ or $SO_2$.

The insulating layers 31 are each formed so that the upper surface thereof shown in FIG. 6 is located at approximately the same level as that of the upper surface of the laminate 30, and that a part of the two side surfaces of the laminate 30 is not exposed in this step. When the part of the two side surfaces 30a of the laminate 30 is exposed, shunt loss may easily occur thereby.

In order to totally cover the two side surfaces 30a of the laminate 30 with the insulating layers 31, as shown in FIG. 6, the inner front portions 31b of the insulating layers 31 are formed in groove portions 45a formed in the lower side of the lift-off resist layer 45 so as to cover the upper surface of the laminate 30.

In order to form the inner front portions 31b of the insulating layers 31 in the groove portions 45a formed in the resist layer 45, when the insulating layers 31 is formed by sputtering, sputtering is performed at a sputtering angle inclined to some extent with respect to the direction (Z direction in the figure) perpendicular to the substrate (not shown) under the first electrode layer 20.

In addition, when the insulating layers 31 are formed, an insulating material 31a forming the insulating layers 31 adheres to the periphery of the resist layer 45. Next, the lift-off resist layer 45 is removed.

Figure 7:
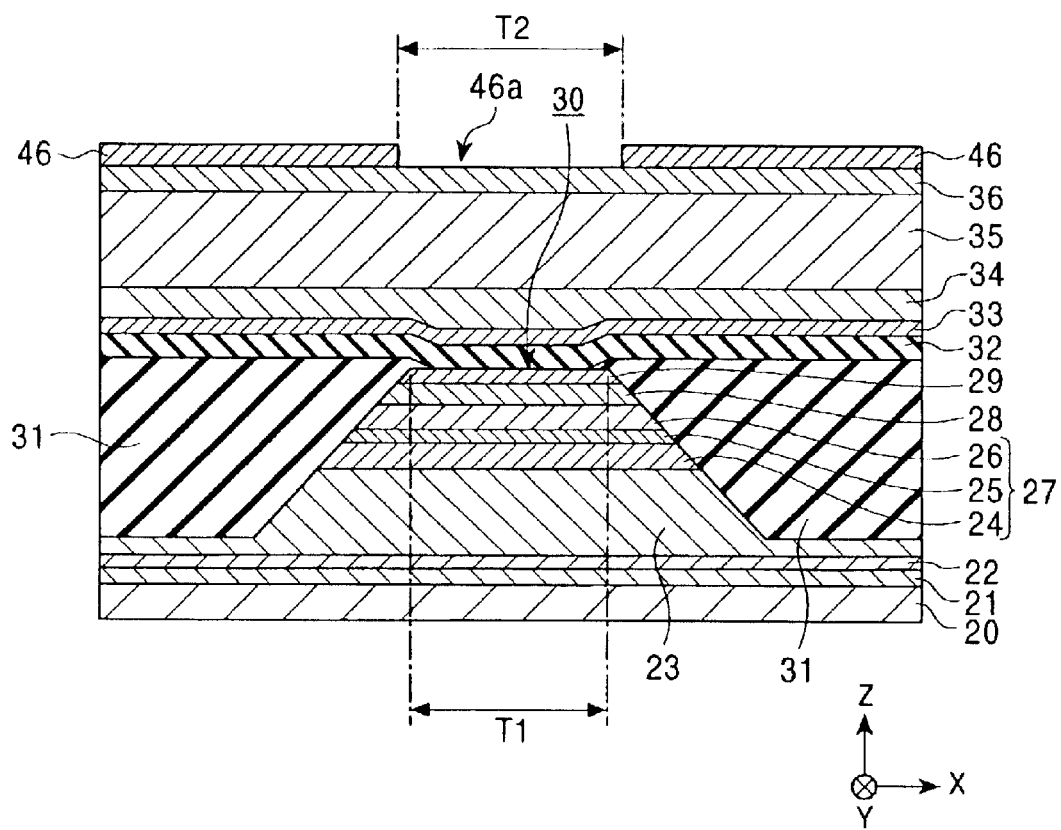
FIG. 7 is a view showing a step performed after the step shown in FIG. 6.

Next, in the step shown in FIG. 7, on the insulating layers 31 and the laminate 30, the free magnetic layer 32, the nonmagnetic interlayer 33, the ferromagnetic layer 34, the second antiferromagnetic layer 35, and the protective layer 36 are sequentially formed.

In the present invention, it is preferable that the free magnetic layer 32 be formed of magnetic material such as a Co—Fe—Ni alloy, a Co—Fe alloy, Co, or a Ni—Fe alloy, that the nonmagnetic interlayer 33 be formed of a nonmagnetic conductive material such as Ru, Rh, Ir, Cr, Re, or Cu, that the ferromagnetic layer 34 be formed of a magnetic material such as a Ni—Fe alloy, a Co—Fe alloy, a Co—Fe—Ni alloy, or Co, that the second antiferromagnetic layer 35 be formed of an antiferromagnetic material containing Mn and element X (where X is at least one element selected from the group consisting of Pt, Pd, Ir, Rh, Ru, and Os) or be formed of an X—Mn—X' alloy (where X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements), and that the protective layer 36 be formed of Ta or the like.

Next, an exchange coupling magnetic field is generated between the second antiferromagnetic layer 35 and the ferromagnetic layer 34 by heat treatment, so that the ferromagnetic layer 34 is magnetized in the track width direction (X direction in the figure). This heat treatment may be performed at any time, and for example, it may be performed after a step of forming a recess portion shown in FIG. 8 which will be described later.

In the embodiment shown in FIG. 7, since three layers, that is, the ferromagnetic layer 34, the nonmagnetic interlayer 33, and the free magnetic layer 32, form a laminated ferrimagnetic structure, by a coupling magnetic field generated between the ferromagnetic layer 34 and the free magnetic layer 32 due to the RKKY interaction, the ferromagnetic layer 34 and the free magnetic layer 32 can be magnetized so as to be antiparallel to each other.

As in the embodiment shown in FIG. 3, when the second antiferromagnetic layer 35 is provided directly on the free magnetic layer 32, after the free magnetic layer 32 shown in FIG. 7 is formed, the second ferromagnetic layer 35 is formed on the free magnetic layer 32.

Next, as shown in FIG. 7, a mask layer 46 having an opening 46a is formed on the protective layer 36. In the present invention, the mask layer 46 is preferably formed of an inorganic material.

The reason an inorganic material is used for forming the mask layer 46 is that a thin-film can be formed and that the etching rate is low. In particular, of various inorganic materials, $Al_2O_3$, $SiO_2$, Al—Si—O, or the like is preferably used since the advantages mentioned above can be easily obtained therefrom. As the mask layer 46, a resist or the like may be used; however, when a resist is used, the mask layer 46 tends to be very thick, and hence it becomes difficult to form the opening 46a having a small gap in the mask layer 46 by exposure and development. In addition, since sagging may occur at two side surfaces of this opening 46a in the mask layer 46 in some cases, it is difficult to form the opening 46a having a predetermined shape.

Since the gap of the opening 46a formed in the mask layer 46 is used for defining the track width Tw in the following step, the opening 46a having predetermined dimensions and a predetermined shape must be properly formed. Because of these reasons described above, the mask layer 46 has been made of an inorganic material, which can be formed into a thin-film.

However, the inorganic material for forming the mask layer 46 must be a hard material, which is etched at a rate lower than that of the protective layer 36 or the second antiferromagnetic layer 35. Otherwise, the recess portion having an appropriate depth cannot be formed in the second antiferromagnetic layer 35 in the following step. As the organic material, Ta, Ti, Si, Zr, Nb, Mo, Hf, W, Al—O, Al—Si—O, Si—O, or the like is preferably used.

As described above, the opening 46a provided in the central portion of the mask layer 46 is formed by, for example, steps of providing a resist layer (not shown) on the central portion of the protective layer 36, forming the mask layer 46 so as to cover two sides of the resist layer, and then removing the resist layer. Alternatively, for example, there may be a method in which after the mask layer 46 is formed over the entire protective layer 36, a resist layer (not shown) is formed on the mask layer 46, and after an opening is formed in the central portion of the resist layer by exposure and development, the mask layer 46 exposed in this opening is polished away by RIE or the like so as to form the opening 46a in the mask layer 46.

In the present invention, the width dimension T2 in the track width direction of the opening 46a provided in the mask layer 46 is preferably formed to be equal to or larger than the width dimension T1 of the upper surface of the laminate 30. For example, the width dimension T2 of the opening 46a in the mask layer 46 is preferably formed to be approximately 0.1 μm.

Figure 8:
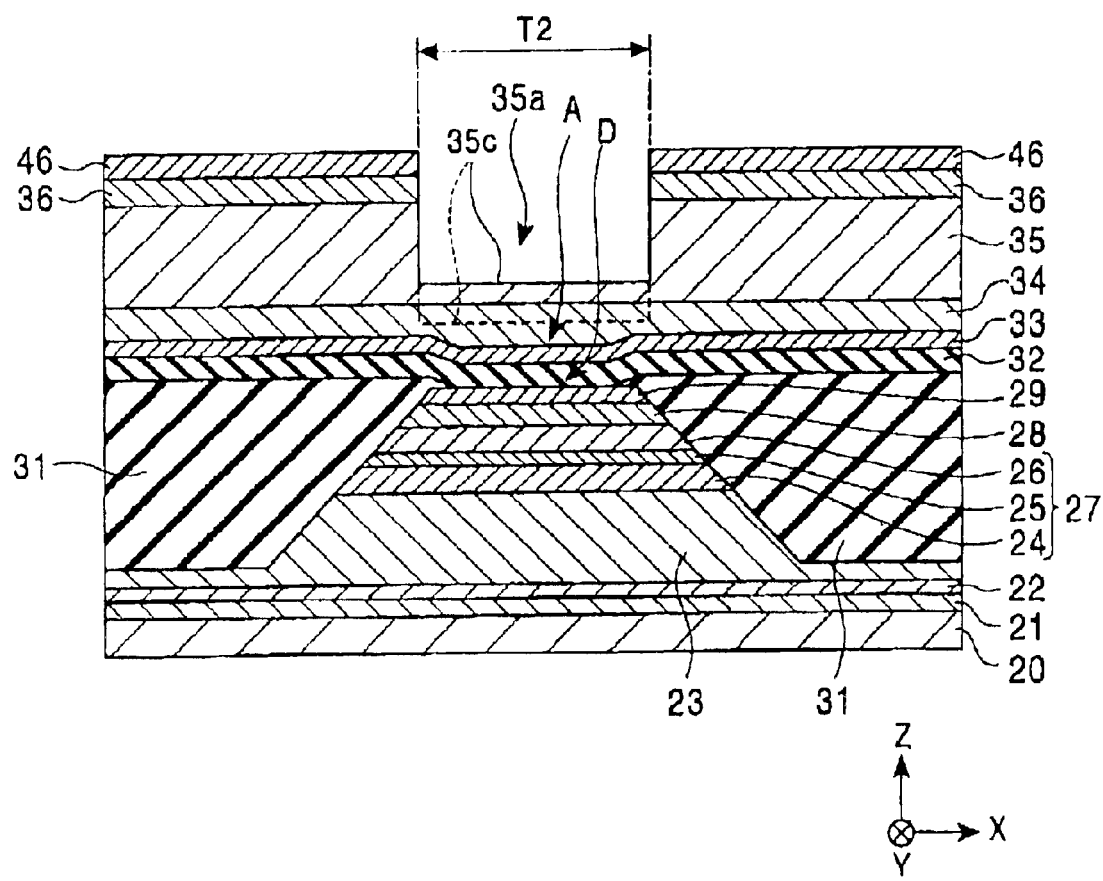
FIG. 8 is a view showing a step performed after the step shown in FIG. 7.

Next, in the step shown in FIG. 8, the protective layer 36 and the second antiferromagnetic layer 35 exposed in the opening 46a formed in the mask layer 46 in the step shown in FIG. 7 are excavated by ion milling or the like (see FIG. 8).

As shown in FIG. 8, a part of the second antiferromagnetic layer 35 is excavated by the ion milling mentioned above. Under the recess portion 35a thus formed, a part of the second antiferromagnetic layer 35 remains; however, the thickness thereof is very thin. Accordingly, an exchange coupling magnetic field generated between the second antiferromagnetic layer 35 and the ferromagnetic layer 34 under the recess portion 35a is very small, and hence the central region A of the ferromagnetic layer 34 and the central region D of the free magnetic layer 32, which are located under the recess portion 35a, are placed in a weak single domain state so that the magnetizations thereof may vary in response to an external magnetic field. That is, the central regions A and D are defined as a sensing region.

Concerning the depth of the recess portion 35a formed by excavation, as shown in FIG. 8, the second antiferromagnetic layer 35 is excavated so that a part thereof remains under the recess portion 35a, or the recess portion 35a is formed by excavating the second antiferromagnetic layer 35 and the ferromagnetic layer 34 so that the surface (see the dotted line in the figure) of the ferromagnetic layer 34 or the surface of the nonmagnetic interlayer 33 is exposed.

In addition, since the width dimension T2 in the track width direction of the opening 46a in the mask layer 46 is formed to be equal to or larger than the width dimension T1 of the upper surface of the laminate 30, the width dimension (equal to the track width Tw) in the track width direction (X direction in the figure) of the bottom surface 35c of the recess portion 35a in the second antiferromagnetic layer 35 can be formed to be equal to or larger than the width dimension T1 of the upper surface 30b of the laminate 30.

After ion milling is performed for forming the recess portion 35a shown in FIG. 8, the mask layer 46 is removed, and the second electrode layer 37 (see FIG. 1) is formed in the recess portion 35a formed in the second antiferromagnetic layer 35 from the protective layer 36 side, thereby forming a magnetic sensor having the structure shown in FIG. 1. Even when the mask layer 46 is not removed, the second electrode layer 37 can be formed without any troubles since the mask layer 46 is very thin. In addition, for example, when being formed of a metal material, the mask layer may be used as a part of the electrode layer, and hence after the recess portion 35a is formed in the second antiferromagnetic layer 35, the second electrode layer 37 may be formed without removing the mask layer 46 by cleaning or the like. However, the mask layer 46 may be removed.

Figure 9:
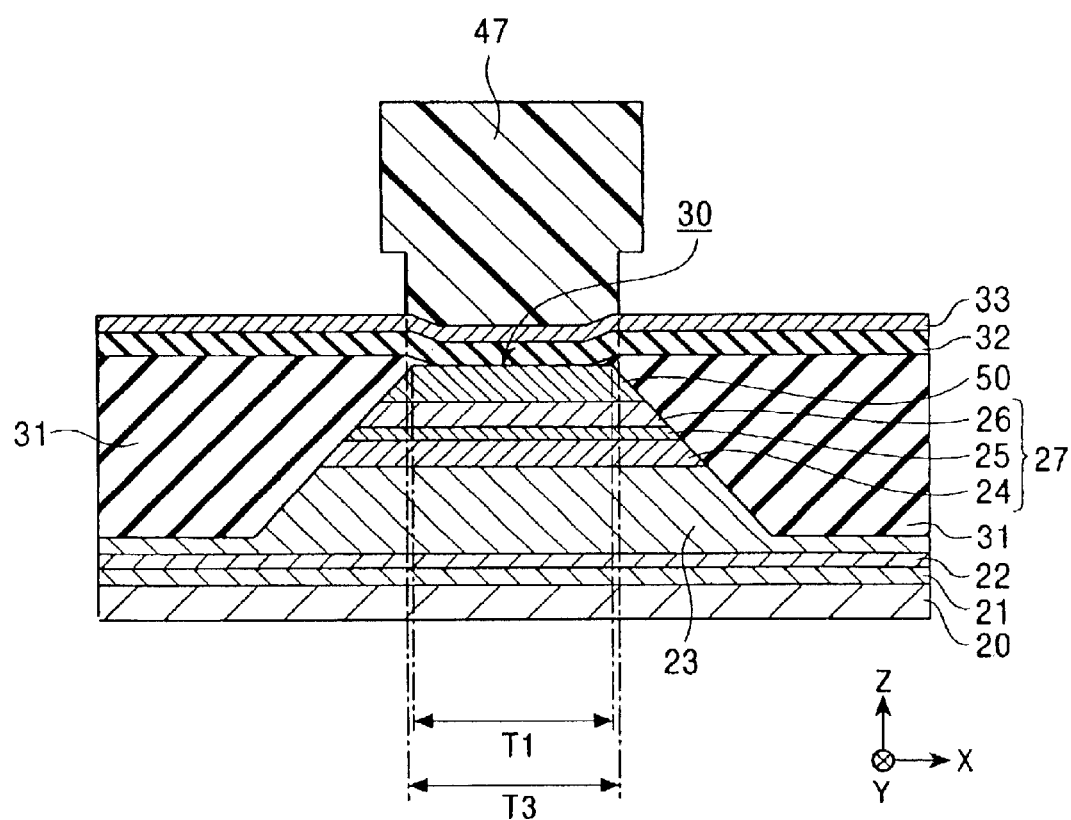
FIG. 9 is a view showing a step of forming the CPP type magnetic sensor having the structure of the present invention shown in FIG. 2.
Figure 10:
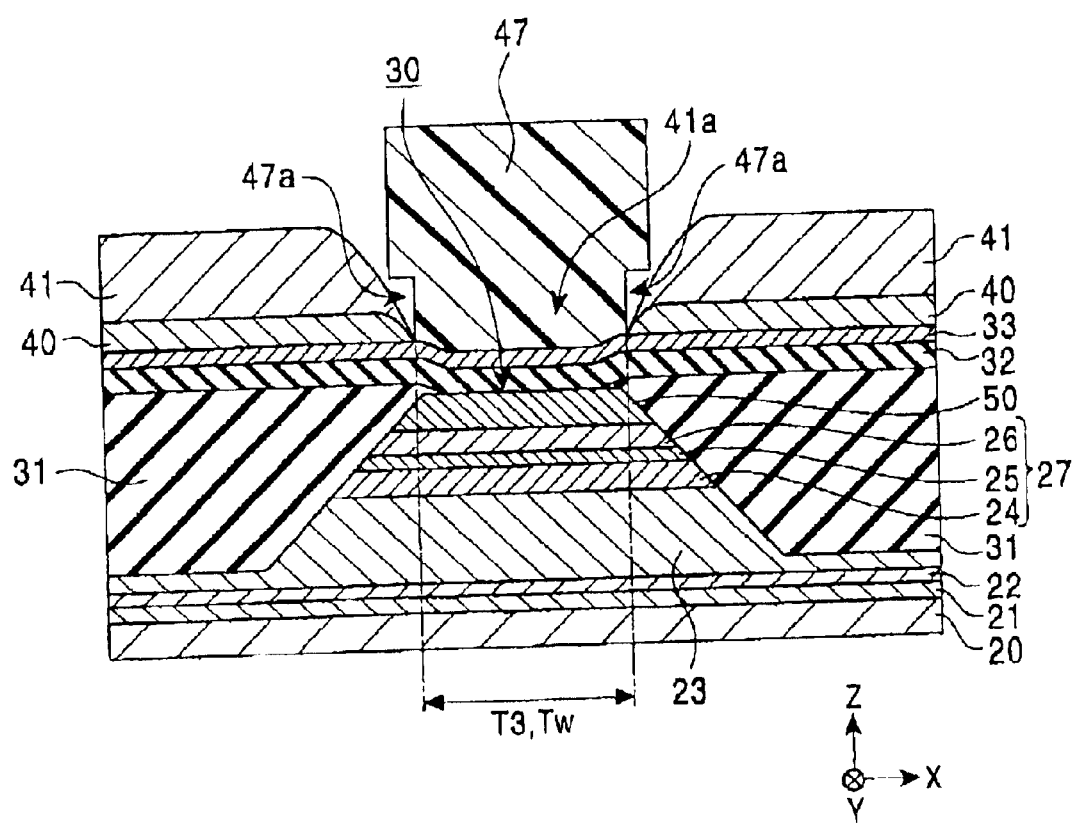
FIG. 10 is a view showing a step performed after the step shown in FIG. 9.

FIGS. 9 and 10 are views each showing a step of a manufacturing method for the magnetic sensor shown in FIG. 2. Each of the figures is a partial cross-sectional view of the magnetic sensor when it is viewed from an opposing face opposing a recording medium.

Prior to the step shown in FIG. 9, the same steps as those shown in FIGS. 4 to 6 are performed. In the step shown in FIG. 9, the free magnetic layer 32 and the nonmagnetic interlayer 33 are sequentially formed on the laminate 30 and the insulating layers 31 provided on the two sides thereof in the track width direction (X direction in the figure).

Subsequently, the lift-off resist layer 47 is formed on the nonmagnetic interlayer 33. The width dimension T3 in the track width direction of the lower surface of the lift-off resist layer 47 is a width dimension for defining the track width Tw and is preferably formed to be equal to or larger than the width dimension T1 in the track width direction of the upper surface of the laminate 30.

Next, in the step shown in FIG. 10, the ferromagnetic layers 40 and the second antiferromagnetic layers 41 are sequentially formed on the nonmagnetic interlayer 33 exposed at the two sides in the track width direction of the resist layer 47 described above. The film formation mentioned above may be performed by sputtering or deposition.

When the ferromagnetic layers 40 and the second antiferromagnetic layers 41 are formed, in order to form the inner front portions thereof in the groove portions 47a formed in the lower side of the resist layer 47 as deep as possible, sputtering is performed at a sputtering angle inclined with respect to the direction (Z direction in the figure) perpendicular to the substrate (not shown). Consequently, the inner front portions of the ferromagnetic layers 40 and the second antiferromagnetic layers 41 are formed deeply in the groove portions 47a of the resist layer 47, and as a result, the distance (width of the recess portion) between the ferromagnetic layers 40 in the track width direction (X direction in the figure) can be made approximately equal to the width dimension T3 of the lower surface of the resist layer 47 shown in FIG. 9. In FIG. 10, the track width Tw is defined by the width dimension of the nonmagnetic interlayer exposed between the ferromagnetic layers 40.

In addition, as described above, since the width dimension T3 in the track width direction of the resist layer 47 is formed to be equal to or larger than the width dimension T1 of the upper surface of the laminate 30, the width dimension (track width Tw) of the recess portion 41a (see FIG. 2) in the track width direction (X direction in the figure) formed between the second antiferromagnetic layers 41 and between the ferromagnetic layers 40 can be equal to or larger than the width dimension T1 in the track width direction of the upper surface 30b of the laminate 30.

After the ferromagnetic layers 40 and the second antiferromagnetic layers 41 are formed, the magnetic sensor shown in FIG. 2 is formed by removing the resist layer 47.

As described above, in the method for manufacturing the magnetic sensor according to the present invention, the free magnetic layer 32 is formed continuously on the laminate 30 and the insulating layers 31 provided on the two sides thereof in the track width direction, and the second antiferromagnetic layer 35 or 41 is formed on the free magnetic layer 32. Consequently, an exchange coupling magnetic field generated between the second antiferromagnetic layer and the free magnetic layer or a coupling magnetic field generated between the free magnetic layer and the ferromagnetic layer 34 or 40 due to the RKKY interaction can magnetize the free magnetic layer 32 in the track width direction.

In the present invention described above, the free magnetic layer 32 can be formed to extend long not only onto the laminate but also onto the insulating layers 31, and even when the track width Tw and the size of the laminate 30 are decreased, the free magnetic layer 32 can be appropriately placed in a single domain state.

In addition, since the two sides of the laminate 30, which is formed of the first antiferromagnetic layer 23, the fixed magnetic layer 27, and the nonmagnetic material layer 48 and which is provided under the free magnetic layer 32, are covered with the insulating layers 31, shunt loss is unlikely to occur, and hence a magnetic sensor capable of improving changing rate of resistance can be manufactured.

According to the method of the present invention for manufacturing a magnetic sensor, even when recording density is increased, a magnetic sensor capable of appropriately improving reproducing properties such as reproducing output or changing rate of resistance can be easily manufactured.

In addition, in the present invention, since the nonmagnetic material layer 48 is formed by providing the upper layer 29 composed of Ru or the like on the lower layer 28 composed of Cu or the like, or the nonmagnetic material layer 50 is formed as a single-layered film composed of the same material as that for the upper layer 29, contamination or oxidation of the nonmagnetic material layer can be suppressed, and hence, the functions as the nonmagnetic material layer can be surely maintained.

According to the present invention, the width dimension (track width Tw) of the bottom surface of the recess portion 35a or 41a formed in the second antiferromagnetic layer 35 or 41, respectively, can be formed to be larger than the width dimension T1 of the upper surface 30b of the laminate 30. The reason for this is that the free magnetic layer is formed continuously not only on the laminate but also on the insulating layers 31, and the width dimension in the track width direction of the second antiferromagnetic layer 35 formed above the free magnetic layer 32 can be formed to be larger than the width dimension T1 of the upper surface 30b of the laminate 30.

Consequently, when the recess portion 35a is formed in the second antiferromagnetic layer 35, or the recess portion 41a is formed by forming the ferromagnetic layers 40 and the antiferromagnetic layers 41 using the resist layer 47, the width dimension of the recess portion 35a can be easily formed to be larger than the width dimension T1 of the upper surface of the laminate 30.

In the case of a CPP type magnetic sensor as described in the present invention, in order to ensure a predetermined DC resistance (DCR), the width of the laminate 30 must be decreased as small as possible, and in addition, the track width Tw (magnetic track width) determined by the width dimension of the bottom surface of the recess portion 35a must also be decreased in order to meet the trend toward higher recording density in the future. However, compared to the width dimension of the laminate 30, when the track width Tw is too much decreased, degradation in output may occur in some cases.

According to the present invention described above, both width dimensions described above are formed so that the width dimension of the recess portion is larger than that of the laminate 30, and hence a magnetic sensor capable of appropriately improving both DC resistance (DCR) and reproducing output can be manufactured.

In the manufacturing steps shown in FIGS. 9 and 10, the excavating step such as ion milling shown in FIGS. 4 to 8 is not necessary, and hence a magnetic sensor having a more precise predetermined shape can be easily manufactured.

The CPP type spin-valve type thin-film elements of the present invention described above in detail can be used as memory devices such as MRAM in addition to reproducing heads mounted in hard disc devices.

The reproducing head using the spin-valve type thin-film element described above may be a sliding type or a floating type.

According to the present invention described above in detail, the free magnetic layer is formed continuously on the laminate, which is composed of the antiferromagnetic layer, the fixed magnetic layer, and the nonmagnetic material layer, and on the insulating layers provided on the two sides of the laminate, and the width dimension in the track width direction of the free magnetic layer is formed to extend larger than the track width Tw. In addition, the second antiferromagnetic layer is formed at the upper side of the free magnetic layer, and the free magnetic layer is magnetized by an exchange bias method.

Accordingly, the free magnetic layer can be appropriately placed in a single domain state, and hence a magnetic sensor having superior sensitivity can be manufactured even when the track width Tw and the size of the laminate are decreased.

In addition, since the two sides of the laminate are covered with the insulating layers, and the magnetization control of the free magnetic layer is performed by an exchange bias method using the second antiferromagnetic layer, a current flowing from the free magnetic layer to places other than the laminate, i.e., a shunt current, is decreased, and hence changing rate of resistance can be improved due to decrease of so-called shunt loss.

In addition, the width dimension in the track width direction of the laminate is preferably formed to be smaller than the track width Tw. Accordingly, both DC resistance and reproducing output of an element can be appropriately increased.

As described above, according to the present invention, even when the track width Tw is decreased, a CPP type magnetic sensor which has superior sensitivity, high reproducing output, and high changing rate of resistance can be appropriately and easily manufactured.

Figure 13:
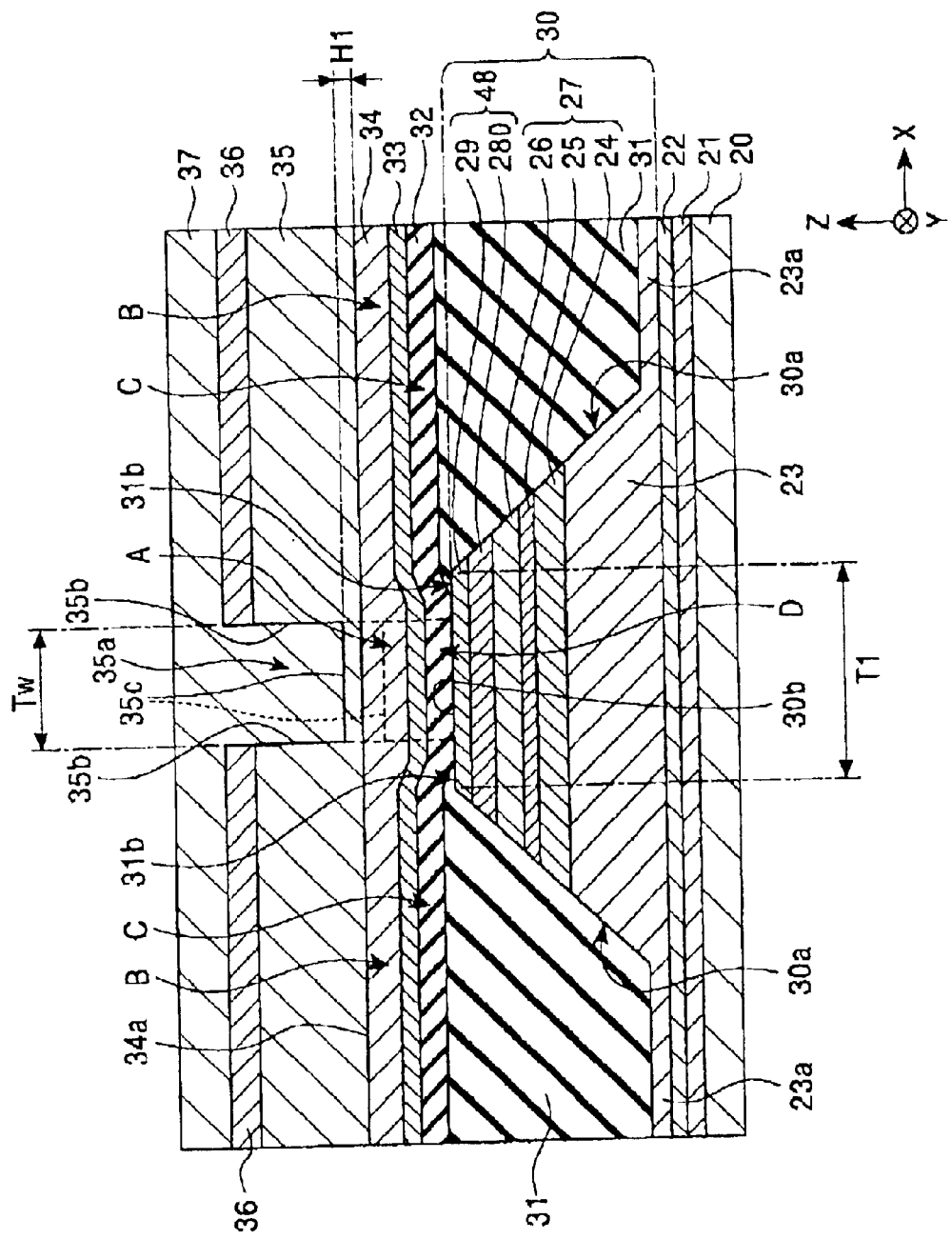
FIG. 13 is a partial cross-sectional view of a magnetic sensor (tunnel type magnetoresistive element) according to a fourth embodiment of the present invention viewed from an opposing face opposing a recording medium.

FIG. 13 is a partial cross-sectional view of a magnetic sensor (tunnel type magnetoresistive element) according to a fourth embodiment of the present invention when it is viewed from an opposing face opposing a recording medium.

Shield layers (not shown) are provided on the top and the bottom sides of the magnetic sensor shown in FIG. 13 with the gap layers (not shown) provided therebetween, and the magnetic sensor, the gap layers, and the shield layers are collectively called an MR head.

The MR head described above serves to reproduce external signals stored in a recording medium. In addition, in the present invention, on the MR head described above, an inductive head for recording may be provided. The shielding layer (upper shielding layer) formed on the upper side of the magnetic sensor may also be used as a lower core layer of the inductive head.

In addition, the MR head described above is formed on a trailing end surface of a slider formed of, for example, alumina titanium carbide ($Al_2O_3$—TiC). The slider is bonded to an elastic deformable supporting member formed of, for example, stainless steel at the side opposite to the opposing face opposing the recording medium, thereby forming a magnetic head device.

Reference numeral 20 in FIG. 13 indicates the first electrode layer. The first electrode layer 20 may also be used as the gap layer described above or, when being formed of a magnetic material, the first electrode layer 20 may also be used as the shield layer. The first electrode layer 20 is formed of, for example, α-tantalum (Ta), gold (Au), chromium (Cr), copper (Cu), rhodium (Rh), iridium (Ir), ruthenium (Ru), or tungsten (W).

As shown in FIG. 13, on the first electrode layer 20, the underlying layer 21 is formed, and on the underlying layer 21, the seed layer 22 is formed.

The underlying layer 21 is preferably formed of at least one element selected from the group consisting of tantalum (Ta), hafnium (Hf), niobium (Nb), zirconium (Zr), titanium (Ti), molybdenum (Mo), and tungsten (W). In addition, the seed layer 22 described above is formed of a Ni—Fe—Cr alloy, chromium (Cr), or the like. When the seed layer 22 is formed, the crystal grain diameter of each layer formed thereon is increased, and hence, changing rate of resistance can be improved.

On the seed layer 22, the first antiferromagnetic layer 23 is formed. The antiferromagnetic layer 23 mentioned above is preferably formed of an antiferromagnetic material containing manganese (Mn) and element X (where X is at least one element selected from the group consisting of platinum (Pt), palladium (Pd), iridium (Ir), rhodium (Rh), ruthenium (Ru), and osmium (Os). For example, the antiferromagnetic layer 23 is formed of a Pt—Mn alloy.

Alternatively, in the present invention, the first antiferromagnetic layer 23 described above may be formed of an X—Mn—X' alloy, in which X' is at least one selected from the group consisting of neon (Ne), argon (Ar), krypton (Kr), xenon (Xe), beryllium (Be), boron (B), carbon (C), nitrogen (N), magnesium (Mg), aluminum (Al), silicon (Si), phosphorus (P), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), silver (Ag), cadmium (Cd), iridium (Ir), tin (Sn), hafnium (Hf), tantalum (Ta), tungsten (W), rhenium (Re), gold (Au), lead (Pb), and at least one of rare earth elements.

The composition ratio of the element X and the total of the elements X and X' are each preferably in the range of 45 to 60 atomic percent.

On the first antiferromagnetic layer 23, the fixed magnetic layer 27 is formed. In this embodiment, the fixed magnetic layer 27 is formed so as to have a laminated ferrimagnetic structure.

As shown in FIG. 13, the fixed magnetic layer 27 has the laminated structure composed of the magnetic layer 24, the nonmagnetic interlayer 25, and the magnetic layer 26 laminated to each other in that order from the bottom. In this embodiment, the magnetic layers 24 and 26 are formed of a magnetic material, such as a Co—Fe alloy, a Co—Fe—Ni alloy, Co, or a Ni—Fe alloy. In addition, the nonmagnetic interlayer 25 is preferably formed of a nonmagnetic conductive material such as Ru, Rh, Ir, Cr, Re, or Cu.

In the fixed magnetic layer 27 shown in FIG. 13, the magnetization of the magnetic layer 24 described above is fixed in, for example, the Y direction in the figure by an exchange coupling magnetic field generated between the magnetic layer 24 and the first antiferromagnetic layer 23. In addition, the magnetic layer 26 is magnetized in the direction opposite to the Y direction in the figure by a coupling magnetic field generated between the magnetic layer 26 and the magnetic layer 24 due to the RKKY interaction.

In the laminated ferrimagnetic structure, that is, the magnetic layer 24 and the magnetic layer 26 are magnetized so as to be antiparallel to each other. In order to form the laminated ferrimagnetic structure described above, the magnetic momentum (product of the saturated magnetization Ms and film thickness t) per unit area of the magnetic layer 24 must be different from that of the magnetic layer 26. For example, when the magnetic layer 24 and the magnetic layer 26 are formed of the same material, the film thickness of the magnetic layer 24 must be different from that of the magnetic layer 26.

As shown in FIG. 13, on the fixed magnetic layer 27, a spacer layer 48 is formed. In this embodiment, the spacer layer 48 has a layered structure composed of an insulating barrier layer 280 and a protective layer 29 formed in that order from the bottom. The insulating barrier layer 280 is preferably formed of an insulating material containing Al—O, Si—O, or Al—Si—O. When a material for the insulating barrier layer 280 is represented by stoichiometric coefficients, for example, Al—O and Si—O are preferably represented by $Al_2O_3$ and $SiO_2$, respectively.

The thickness of the insulating barrier layer 280 is preferably in the range of 5 to 30 Å. Consequently, a tunnel current is allowed to appropriately flow in the insulating barrier layer 280, and the tunnel magnetoresistive effect (TMR effect) can be obtained.

In addition, on the insulating barrier layer 280, the protective layer 29 composed of at least one element selected from the group consisting of Ru, Ir, Rh, Os, Re, Pt, and Pd is formed.

The protective layer 29, which will be described later in detail in description of manufacturing steps, is a layer for properly protecting the insulating barrier layer 280, the fixed magnetic layer 27, and the like from contamination or oxidation caused by exposure of the insulating barrier layer 280 to the air. However, since a too large thickness of the protective layer 29 may result in degradation of the tunnel magnetoresistive effect in some cases, in the present invention, the protective layer 29 having a thickness of 10 Å or less is preferably formed. When the thickness of the protective layer 29 is small as described above, the tunnel magnetoresistive effect is not substantially affected, and high changing rate of resistance can be obtained.

The formation of the protective layer 29 is not essential in the present invention, when the protective layer 29 is not provided, the spacer 48 means the insulating barrier layer 280.

As shown in FIG. 13, the laminate 30 formed of the layers from the first antiferromagnetic layer 23 to the protective layer 29 has continuous side surfaces 30a in the track width direction (X direction in the figure), and these side surfaces 30a are formed to be inclined or curved so, that the distance between the side surfaces 30a is gradually decreased from the first antiferromagnetic layer 23 side to the protective layer 29 side (Z direction in the figure).

In the embodiment shown in FIG. 13, downside regions 23a of the first antiferromagnetic layer 23 are formed to further extend from two side surfaces 30a in the track width direction (X direction in the figure); however, the extending downside region 23 may be removed so that the seed layer 22, the underlayer 21, or the first electrode layer 20 is exposed.

The thickness from the upper surface of the downside region 23a of the first antiferromagnetic layer 23 to the upper surface thereof is approximately 100 to 150 Å.

As shown in FIG. 13, on the two sides of the laminate 30 in the track width direction (X direction in the figure), the insulating layers 31 are formed. The insulating layer 31 is formed of an insulating material such as $Al_2O_3$ or $SiO_2$.

In this embodiment, the inner front portions 31b of the insulating layers 31 are preferably formed so as to extend onto the laminate 30. Accordingly, the two side regions of the laminate 30 can be properly placed in an insulating state. The thickness of the insulating layer 31 is approximately 150 Å.

In the present invention, as shown in FIG. 13, the free magnetic layer 32 is formed continuously on the insulating layers 31 and the laminate 30. The free magnetic layer 32 is formed of, for example, a Ni—Fe alloy, a Co—Fe alloy, a Co—Fe—Ni alloy, or Co.

In addition, the free magnetic layer 32 may be formed to have a laminated structure composed of magnetic materials, and for example, the structure formed of a Co—Fe alloy film and a Ni—Fe alloy film laminated to each other in that order from the bottom may be mentioned. When the Co—Fe alloy is formed at the side in contact with the laminate 30, diffusion of metal elements or the like at the interface with the spacer layer 48 can be prevented, and hence, changing rate of resistance ($\Delta R/R$) can be increased.

As shown in FIG. 13, on the free magnetic layer 32, the nonmagnetic interlayer 33 is formed, and the ferromagnetic layer 34 is formed thereon. The nonmagnetic interlayer 33 is preferably formed of a nonmagnetic conductive material such as Ru, Rh, Ir, Cr, Re, or Cu. In addition, the ferromagnetic layer 34 is formed of a magnetic material such as a Ni—Fe alloy, a Co—Fe alloy, a Co—Fe—Ni alloy, or Co.

In addition, in the present invention, as shown in FIG. 13, on the ferromagnetic layer 34, the second antiferromagnetic layer 35 is formed. The second antiferromagnetic layer 35 is preferably formed of an antiferromagnetic material similar to that for the first antiferromagnetic layer 23. In particular, the second antiferromagnetic layer 35 is preferably formed of an antiferromagnetic material containing Mn and element X (where X is at least one element selected from the group consisting of Pt, Pd, Ir, Rh, Ru, and Os). For example, a Pt—Mn alloy may be used.

Alternatively, in the present invention, the second antiferromagnetic layer 35 described above may be formed of an X—Mn—X' alloy, in which X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements.

The composition ratio of the element X and the total of the elements X and X' are each preferably in the range of 45 to 60 atomic percent.

As shown in FIG. 13, in the second antiferromagnetic layer 35, the recess portion 35a is formed from the surface thereof toward the laminate at the position opposing the laminate 30 in the thickness direction (Z direction in the figure).

In the embodiment shown in FIG. 13, the magnetization of the ferromagnetic layer 34 is fixed in the track width direction (X direction in the figure) by an exchange coupling magnetic field generated between the second antiferromagnetic layer 35 and the ferromagnetic layer 34; however, the magnetization of the central region (sensing region) A of the ferromagnetic layer 34, which is under the recess portion 35a formed in the second antiferromagnetic layer 35, is not fixed, and this central region is placed in a weakly magnetized state so that the magnetization change may occur.

As described above, the recess portion 35a is formed in the second antiferromagnetic layer 35 at the central region thereof, and the thickness of the second antiferromagnetic layer 35 at which the recess portion 35a is formed is very small. For example, the film thickness H1 of the second antiferromagnetic layer 35 under the recess portion 35a is 10 to 50 Å. As described above, since the film thickness H1 of the second antiferromagnetic layer 35 at which the recess portion 35a is formed very small, an exchange coupling magnetic field is not substantially generated between the second antiferromagnetic layer 35 having the film thickness H1 and the ferromagnetic layer 34, and hence, the magnetization of the central region A of the ferromagnetic layer 34 under the recess portion 35a formed in the second antiferromagnetic layer 35 is not firmly fixed. On the other hand, sufficient exchange coupling magnetic fields are each generated between the ferromagnetic layer 34 at one of the side regions (non-sensing regions) B of the central region A and a corresponding thicker part of the antiferromagnetic layer 35 which is formed on the ferromagnetic layer 34 described above, and hence, the magnetization of each side region B of the ferromagnetic layer 34 is firmly fixed in the X direction in the figure.

In addition, the free magnetic layer 32 is magnetized antiparallel to the magnetization direction of the ferromagnetic layer 34 by a coupling magnetic field generated between the free magnetic layer 32 and the ferromagnetic layer 34 due to the RKKY interaction.

The magnetizations at the two side regions (non-sensing regions) C of the free magnetic layer 32 are firmly fixed by the coupling magnetic field due to the RKKY-interaction described above; however, the central region (sensing region) D of the free magnetic layer 32 is in a weakly magnetized state so that the magnetization thereof may vary in response to an external magnetic field. Accordingly, when an external magnetic field flows in this magnetic sensor, the magnetization of the central region D of the free magnetic layer 32 and the magnetization of the central region A of the ferromagnetic layer 34 vary while the antiparallel state therebetween is maintained, and since electrical resistance varies in accordance with the relationship with the fixed magnetization of the fixed magnetic layer 27, external signals can be reproduced.

In addition, as shown in FIG. 13, the protective layer 36 composed of Ta or the like is provided on the second antiferromagnetic layer 35. However, the protective layer 36 is not formed in the recess portion 35a formed in the second antiferromagnetic layer 35.

The electrode layer (second electrode layer) 37 is formed continuously on the protective layer 36 and inside the recess portion 35a formed in the second antiferromagnetic layer 35. The second electrode layer 37 is formed of, for example, α-Ta, Au, Cr, Cu, Rh, Ir, Ru, or W.

Heretofore, the individual layers forming the magnetic sensor shown in FIG. 13 have been described, and hereinafter, structural features of the magnetic sensor of the present invention will be described.

(1) The free magnetic layer 32 is formed continuously on the insulating layers 31 and the laminate 30 and is also formed so that the width dimension of the free magnetic layer 32 in the track width direction (X direction in the figure) extends larger than track width Tw.

In the embodiment shown in FIG. 13, the track width Tw is determined by the width dimension in the track width direction (X direction in the figure) of the bottom surface 35c of the recess portion 35a formed in the second antiferromagnetic layer 35.

As described above, the central region D of the free magnetic layer 32, located at the position opposing the recess portion 35a in the thickness direction, is a sensing region in which magnetic change may occur in response to an external magnetic field, and the width dimension of this central region D in the track width direction is approximately equal to the track width Tw described above.

Concomitant with the trend toward higher recording density in the future, the track width tends to become increasingly smaller. For example, the track width Tw will be decreased to approximately 0.1 μm.

Accordingly, when the width dimension of the free magnetic layer 32 in the track width direction is formed by the track width Tw by a conventional method, the size of the free magnetic layer 32 is extremely decreased, and hence it becomes very difficult to appropriately place the free magnetic layer 32 in a single domain state.

In contrast, according to the present invention, regardless of the dimension of the track width Tw, the free magnetic layer 32 can be formed so as to have a long width extending in the track width direction. In addition, since a so-called exchange bias method is employed in which the thick second antiferromagnetic layer 35 is formed above the two side regions C of the free magnetic layer 32, i.e., the regions other than the central region D thereof at which the track width Tw region is formed, the magnetizations of the two side regions C are properly fixed in the track width direction, the central region D can be placed in a weak single domain state so that the magnetization change may occur in response to an external magnetic field, and hence a magnetic sensor having superior sensitivity can be obtained even when the track width Tw is decreased.

In particular, in the present invention, since the free magnetic layer 32 can be formed so as to extend onto the insulating layers 31 formed on the two sides of the laminate 30, regardless of the width dimension of the laminate 30 in addition to the dimension of the track width Tw, the width dimension of the free magnetic layer 32 can be determined. Consequently, the magnetization control of the free magnetic layer 32 can be appropriately performed.

(2) The insulating layers 31 are formed on the two sides in the track width direction of the laminate 30 formed of the layers from the first antiferromagnetic layer 23 to the protective layer 29, and the free magnetic layer 32 is formed continuously on the insulating layers 31 and the protective layer 29.

Since the insulating layers 31 are formed on the two sides in the track width direction of the laminate 30, a current flowing from the electrode layer 20 or 37 appropriately flows inside the laminate through the free magnetic layer 32

That is, a current surely flows from the tree magnetic layer 32 to the inside of the laminate 30 or from the inside of the laminate 30 to the free magnetic layer 32, and hence current shunt is unlikely to occur in this structure.

In the present invention, in addition to the formation of the insulating layers 31 covering the two sides of the laminate 30, by carrying out the magnetization control of the free magnetic layer 32 using an exchange bias method, the current shunt described above is decreased, and hence changing rate of resistance can be improved due to decrease of shunt loss.

(3) The width dimension T1 in the track width direction (X direction in the figure) of the upper surface 30b of the laminate 30 is larger than the track width Tw.

As shown in FIG. 13, the width dimension T1 of the upper surface 30b (the upper surface of an Ru layer) of the laminate 30 is larger than the track width Tw determined by the width dimension of the bottom surface of the recess portion 35a formed in the second antiferromagnetic layer 35.

The reason the width dimensions of the individual positions can be controlled is that the track width is determined in a step different from that for forming the laminate, and according to the present invention, the width dimension in the track width direction of the laminate 30 can be freely determined regardless of the dimension of the track width Tw. For example, the width dimension T1 in the track width direction of the upper surface 30b of the laminate 30 is preferably in the range of 0.15 to 0.25 μm. In addition, the track width Tw is preferably smaller than the width dimension T1 and is, for example, approximately 0.1 μm.

When the width dimension in the track width direction of the laminate 30 is formed to be larger than the track width Tw, as described above, the cross-sectional area in the direction (direction parallel to X-Y plane in the figure) parallel to the surface of the laminate 30 can be formed to be large as compared to that formed by a conventional method.

Accordingly, in the present invention, even when the track width Tw described above is decreased, DC resistance (DCR) can be decreased, and hence reproducing output can be increased as compared to that by a conventional method.

According to the present invention described above, even when the track width Tw is decreased, a magnetic sensor (tunnel type magnetoresistive element) having superior sensitivity, high reproducing output, and high changing rate of resistance can be appropriately and easily manufactured.

Next, the shape or the like of the recess portion 35a formed in the second antiferromagnetic layer 35 will be described.

In the embodiment shown in FIG. 13, the inner side surfaces 35b of the recess portion 35a are formed in the vertical direction (Z direction in the figure) from the bottom surface 35c; however, the inner side surfaces 35b may be formed to be inclined or curved so that the distance between the inner side surfaces 35b is gradually increased from the bottom surface 35c of the recess portion 35a to the upper surface thereof.

In the embodiment shown in FIG. 13, a part of the second antiferromagnetic layer 35 remains under the recess portion 35a, and as described above, since the thickness H1 of the second antiferromagnetic layer 35 under the recess portion 35a is very small, an exchange coupling magnetic field is not substantially generated between the ferromagnetic layer 34 and the part of second antiferromagnetic layer 35 described above.

In this embodiment, the recess portion 35 is formed by excavating the second antiferromagnetic layer 35 by, for example, ion milling. Accordingly, by the amount excavated, the dimension of the film thickness H1 can be appropriately controlled, and when the amount excavated is increased, all the second antiferromagnetic layer 35 at the recess portion 35a in the thickness direction may be removed in some cases so that the surface of the ferromagnetic layer 34 is exposed.

In the case described above, in the present invention, since the surface of the ferromagnetic layer 34 is polished away to some extent as shown by the dotted line, the bottom surface 35c of the recess portion 35a is located at the position lower than the upper surface 34a of the ferromagnetic layer 34.

In addition, the surface of the nonmagnetic interlayer 33 may be exposed at the bottom of the recess portion 35a by removing all the ferromagnetic layer 34 opposing the position at which the recess portion 35a is formed.

However, it is not preferable that the free magnetic layer 32 be exposed at the bottom of the recess portion 35a by removing all of a part of the nonmagnetic interlayer 33 located at the position at which the recess portion 35a is formed. When all of the part of the nonmagnetic interlayer 33 described above is removed, the free magnetic layer 32 is also partly polished away. Since the central region D of the free magnetic layer 32 is substantially a sensing region of the magnetoresistive effect, the reproducing properties are considerably affected by the change in film thinness in this region, and hence degradation of reproducing properties is liable to occur. In addition, when the free magnetic layer 32 is exposed to and then contaminated by outside air, the reproducing properties are degraded.

Accordingly, in order not to expose the free magnetic layer 32, the recess portion 35a must be formed by controlling ion milling time or the like so that the nonmagnetic interlayer 33 at least remains on the free magnetic layer 32.

Figure 14:
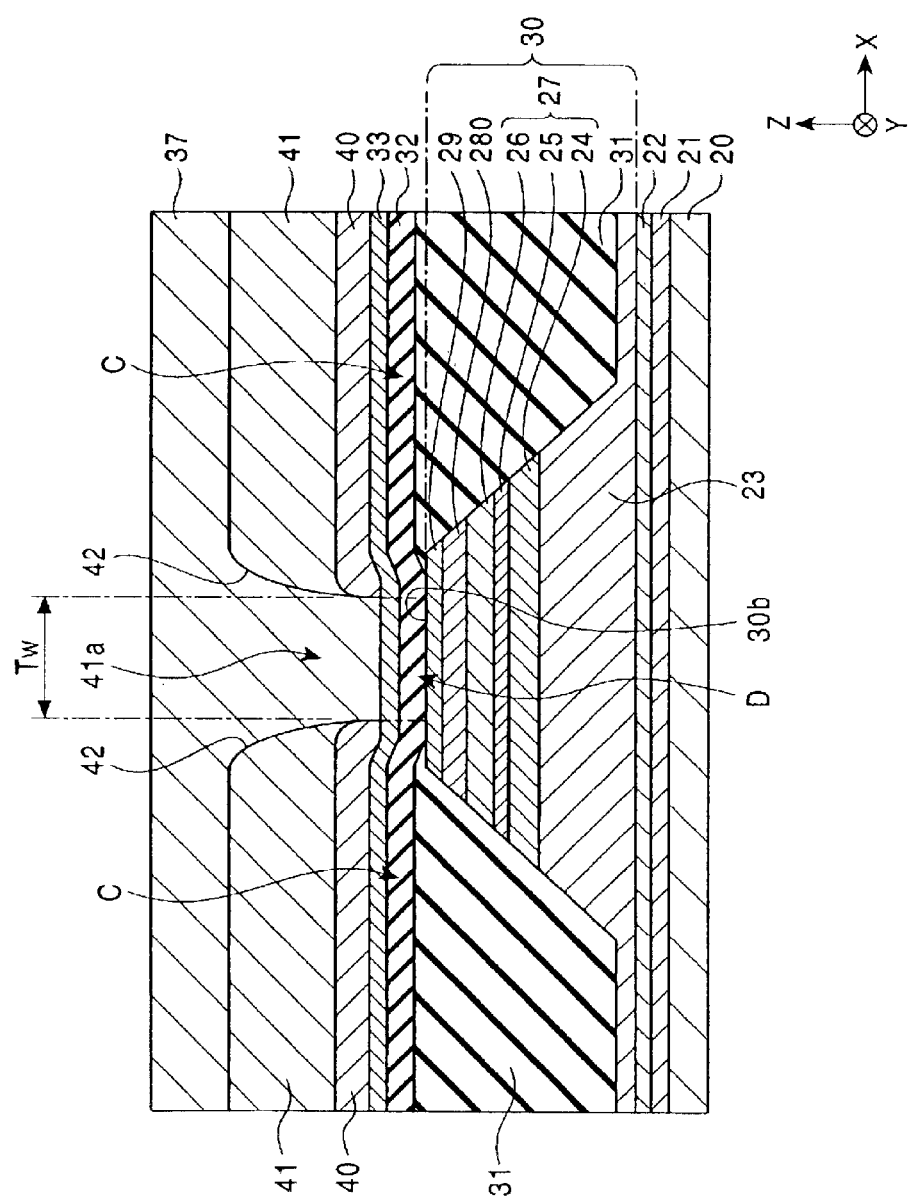
FIG. 14 is a partial cross-sectional view of a magnetic sensor (tunnel type magnetoresistive element) according to a fifth embodiment of the present invention when it is viewed from an opposing face opposing a recording medium.

FIG. 14 is a partial cross-sectional view showing the structure of a magnetic sensor (tunnel type magnetoresistive element) of a fifth embodiment of the present invention when it is viewed from an opposing face opposing a recording medium. The same reference numerals of layers in FIG. 13 designate the same layers in this figure.

In the embodiment shown in FIG. 14, the structure of the laminate 30, the insulating layers 31 formed on the two sides in the track width direction of the laminate 30, the free magnetic layer 32 formed continuously on the insulating layers 31 and the laminate 30, and the nonmagnetic interlayer 33 formed on the free magnetic layer 32 are the same as those described in FIG. 13.

The point in FIG. 14 different from that in FIG. 13 is that the recess portion 41a formed between the second antiferromagnetic layers 41 and between the ferromagnetic layers 40 extends to the nonmagnetic interlayer 33 so that the nonmagnetic interlayer 33 is exposed at the bottom of the recess portion 41a.

As described above, in the case shown in FIG. 13, the nonmagnetic interlayer 33 can be exposed at the bottom of the recess portion 35a; however, since the recess portion 35a shown in FIG. 13 is formed by excavation using ion milling or the like, a part of the surface of the nonmagnetic interlayer 33 is also excavated, and hence the part thus excavated tends to be thin.

In the case shown in FIG. 14, since the recess portion 41a is formed by forming the ferromagnetic layers 40 and the second antiferromagnetic layers 41 having the shape shown in FIG. 14 on the nonmagnetic interlayer 33 using a resist, excavation is not carried out by ion milling for forming the recess portion 41a. A manufacturing method for the structure shown in FIG. 14 will be described later in detail.

Accordingly, in FIG. 14, since the surface of the nonmagnetic interlayer 33 exposed at the bottom of the recess portion 41a is flat without excavated traces, the nonmagnetic interlayer 33 under the recess portion 41a has a thickness approximately equal to that of the other part of the nonmagnetic interlayer 33. In addition, the surface of the nonmagnetic interlayer 33 including a part thereof exposed at the bottom of the recess portion 41a is formed so as to have an approximately planarized surface.

In the embodiment shown in FIG. 14, the inner side surfaces 42 of the ferromagnetic layers 40 and the second antiferromagnetic layers 41 provided on the nonmagnetic interlayer are formed to be inclined or curved so that the distance between the inner side surfaces 42 gradually increases from the lower surface to the upper surface (Z direction in the figure).

In the embodiment shown in FIG. 14, as is the embodiment shown in FIG. 13, the free magnetic layer 32 is formed continuously on the insulating layers 31 and the laminate 30, and the width dimension in the track width direction (X direction in the figure) of the free magnetic layer 32 is formed to extend larger than the track width W.

In addition, since a so-called exchange bias method is employed in which the second antiferromagnetic layers 41 having a larger thickness are formed above the two side regions (non-sensing regions) C of the free magnetic layer 32 other than the central region D which is used as the track width Tw region (sensing region), the magnetizations of the two side regions C mentioned above can be appropriately fixed in the track width direction, the central region D can be placed in a weak single domain state so that the magnetization thereof may vary in response to an external magnetic field, and hence a magnetic sensor having superior sensitivity can be manufactured even when the track width Tw is decreased.

In addition, the insulating layers 31 are formed on the two sides in the track width direction (X direction in the figure) of the laminate 30 formed of the layers from the first antiferromagnetic layer 23 to the protective layer 29, and the free magnetic layer 32 is formed continuously on the insulating layers 31 and the protective layer 29.

As described above, since the insulating layers 31 are formed on the two sides in the track width direction of the laminate 30, a current flowing from the electrode layer 20 or 37 appropriately flows inside the laminate 30.

That is, in the present invention, since the two sides of the laminate 30 are covered with the insulating layers 31, and an exchange bias method in which the magnetization control of the free magnetic layer 32 is performed using the second antiferromagnetic layer 41 is employed, a current flowing from the free magnetic layer 32 to the laminate 30 is prevented from being shunted to a route other than that mentioned above, and as a result, the changing rate of resistance can be improved due to decrease of so-called shunt loss.

In the present invention, the width dimension in the track width direction (X direction in the figure) of the upper surface 30b of the laminate 30 is larger than the track width Tw.

In the, present invention, the track width Tw is not defined by the width dimension of the upper surface 30b of the laminate 30 and is determined regardless of the width dimension described above.

Consequently, according to the present invention, the width dimension in the track width direction of the laminate 30 can be freely determined regardless of the dimension of the track width Tw. In addition, according to the present invention, since the width dimension in the track width direction of the laminate 30 can be formed to be larger than the track width Tw, the cross-sectional area in the direction (direction parallel to X-Y plane in the figure) parallel to the surface of the laminate 30 can be formed to be large as compared to that formed by a conventional method.

Accordingly, in the present invention, even when the track width is decreased, DC resistance (DCR) can be decreased, and hence reproducing output can be increased as compared to that in the past.

According to the present invention as described above, even when the track width Tw is decreased, a magnetic sensor (tunnel type magnetoresistive element) having superior sensitivity, high reproducing output, and high changing rate of resistance can be appropriately and easily manufactured.

In both embodiments shown in FIGS. 13 and 14, a laminated ferrimagnetic structure composed of the nonmagnetic interlayer 33 and the ferromagnetic layer 34 is formed in each of the two side regions C of the free magnetic layer 32, and an exchange bias method is used using a so-called synthetic ferrimagnetic coupling in combination of the laminated ferrimagnetic structure and the second antiferromagnetic layer.

Figure 15:
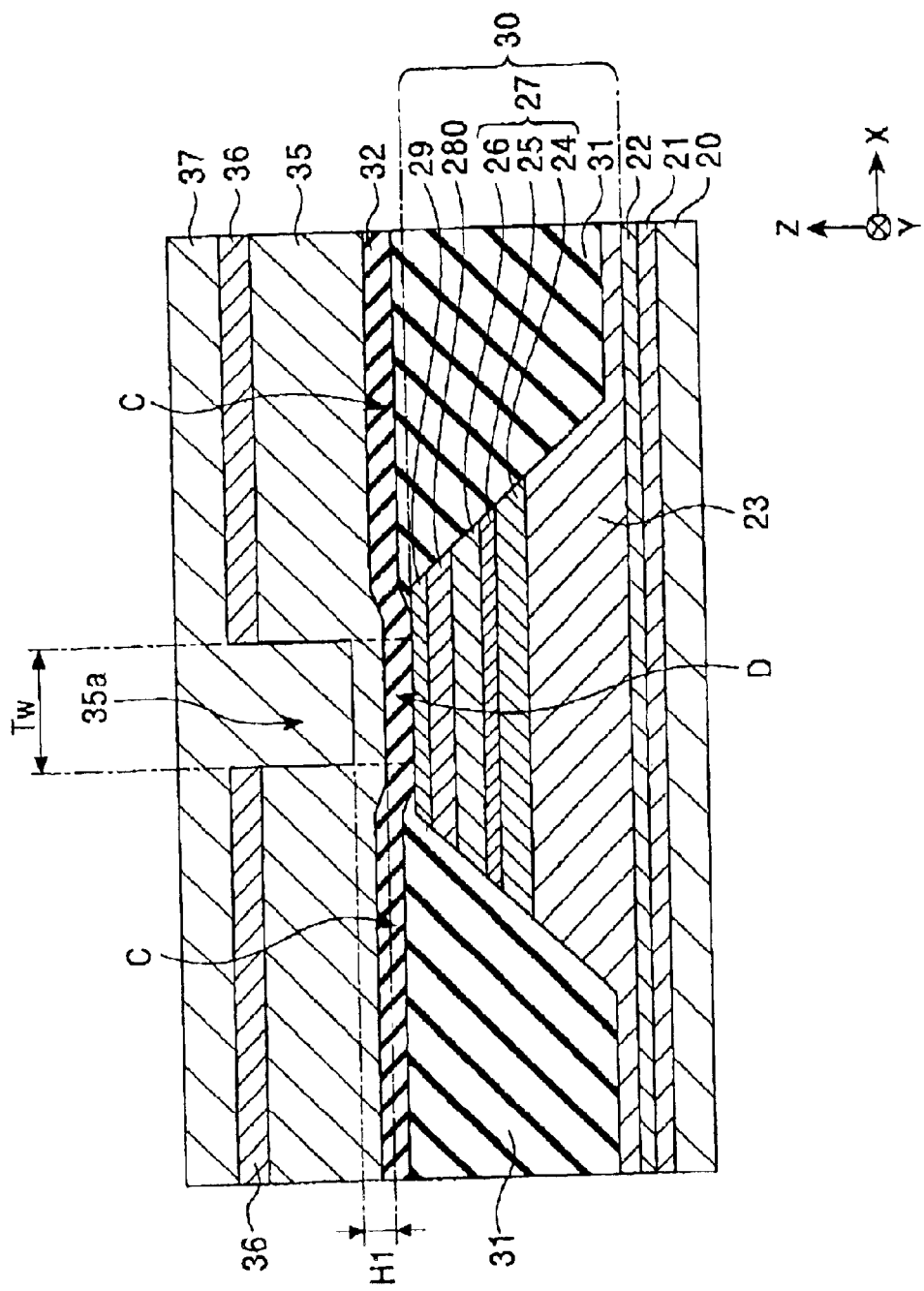
FIG. 15 is a partial cross-sectional view of a magnetic sensor (tunnel type magnetoresistive element) according to a sixth embodiment of the present invention when it is viewed from an opposing face opposing a recording medium.

FIG. 15 is a partial cross-sectional view showing the structure of a magnetic sensor (tunnel type magnetoresistive element) of a sixth embodiment of the present invention when it is viewed from an opposing face opposing a recording medium. The same reference numerals of layers in FIG. 13 designate the same layers in this figure.

The point of the embodiment shown in FIG. 15 different from the embodiment shown in FIG. 13 is that the nonmagnetic interlayer 33 and the ferromagnetic layer 34 are not formed between the free magnetic layer 32 and the second antiferromagnetic layer 35.

That is, as shown in FIG. 15, the second antiferromagnetic layer 35 is directly formed on the free magnetic layer 32, and by an exchange coupling magnetic field generated between the second antiferromagnetic layer 35 and the free magnetic layer 32, the free magnetic layer 32 is magnetized in the track width direction (X direction in the figure).

In this embodiment, the width dimension in the track width direction of the bottom surface of the recess portion 35a formed in the second antiferromagnetic layer 35 is defined as the track width Tw, and the film thickness H1 of the second antiferromagnetic layer 35 remaining under the recess portion 35a is very thin. Accordingly, an exchange coupling magnetic field is not substantially generated between the second antiferromagnetic layer 35 and the free magnetic layer 32 under the recess portion 35a, and hence, the magnetization of the central region D of the free magnetic layer 32 under the recess portion 35a is not firmly fixed.

On the other hand, in each of the two side regions (non-sensing regions) C of the central region D of the free magnetic layer 32, a large exchange coupling magnetic field is generated between the free magnetic layer 32 and the thicker part of the antiferromagnetic layer 35 formed thereon, and hence, the magnetizations of the two side regions C are firmly fixed in the track width direction.

The width dimension in the track width direction of the central region D of the free magnetic layer 32 is approximately equal to that of the track width Tw determined by the width dimension of the bottom surface of the recess portion 35a, and since the magnetizations of the two side regions C of the free magnetic layer 32 are fixed in the X direction in the figure, the magnetization of the central region D of the free magnetic layer 32 is aligned in the X direction in the figure.

In the embodiment shown in FIG. 15, as in the embodiment shown in FIG. 13, the free magnetic layer 32 is formed continuously on the insulating layers 31 and the laminate 30, and the width dimension of the free magnetic layer 32 in the track width direction (X direction in the figure) is formed to extend larger than the width dimension of the track width Tw.

Since a so-called exchange bias method is employed in which the thick second antiferromagnetic layer 35 is formed on the two side regions (non-sensing regions) C of the free magnetic layer 32 other than the central region D at which the track width Tw region (sensing region) is formed, the magnetizations of the two side regions C can be properly fixed in the track width direction, the central region D can be placed in a weak single domain state so that magnetization thereof may vary in response to an external magnetic field, and hence a magnetic sensor having superior sensitivity can be manufactured even when the track width Tw is decreased.

In addition, the insulating layers 31 are formed on the two sides in the track width direction of the laminate 30 composed of the layers from the first antiferromagnetic layer 23 to the protective layer 29, and the free magnetic layer 32 is formed continuously on the insulating layers 31 and the protective layer 29.

As described above, since the insulating layers 31 are formed on the two sides of the laminate 30 in the track width direction, a current flowing from the electrode layer 20 or 37 appropriately flows inside the laminate 30.

That is, in the present invention, since the two sides of the laminate 30 are covered with the insulating layers 31, and an exchange bias method in which the magnetization control of the free magnetic layer 32 is performed using the second antiferromagnetic layer 35 is employed, a current flowing from the free magnetic layer 32 to the laminate 30 is prevented from being shunted to a route other than that mentioned above, and as a result, the changing rate of resistance can be improved due to decrease of so-called shunt loss.

In the present invention, the width dimension in the track width direction (X direction in the figure) of the upper surface 30b of the laminate 30 is larger than the track width Tw.

In the present invention, the track width Tw is not defined by the width dimension of the upper surface 30b of the laminate 30 and is determined regardless of the width dimension described above.

Consequently, according to the present invention, the width dimension in the track width direction of the laminate 30 can be freely determined regardless of the dimension of the track width Tw. In addition, according to the present invention, since the width dimension in the track width direction of the laminate 30 can be formed to be larger than the track width Tw, the cross-sectional area in the direction (direction parallel to X-Y plane in the figure) parallel to the surface of the laminate 30 can be formed to be large as compared to that formed by a conventional method.

Accordingly, in the present invention, even when the track width is decreased, DCR resistance can be decreased, and hence reproducing output can be increased as compared to the case in the past.

According to the present invention, as described above, even when the track width Tw is decreased, a magnetic sensor (tunnel type magnetoresistive element) having superior sensitivity, high reproducing output, and high changing rate of resistance can be appropriately and easily manufactured.

FIGS. 16 to 20 shows steps of manufacturing a magnetic sensor of the present invention. The figures are partial cross-sectional views showing the magnetic sensor when it is viewed form an opposing face opposing a recording medium.

Figure 16:
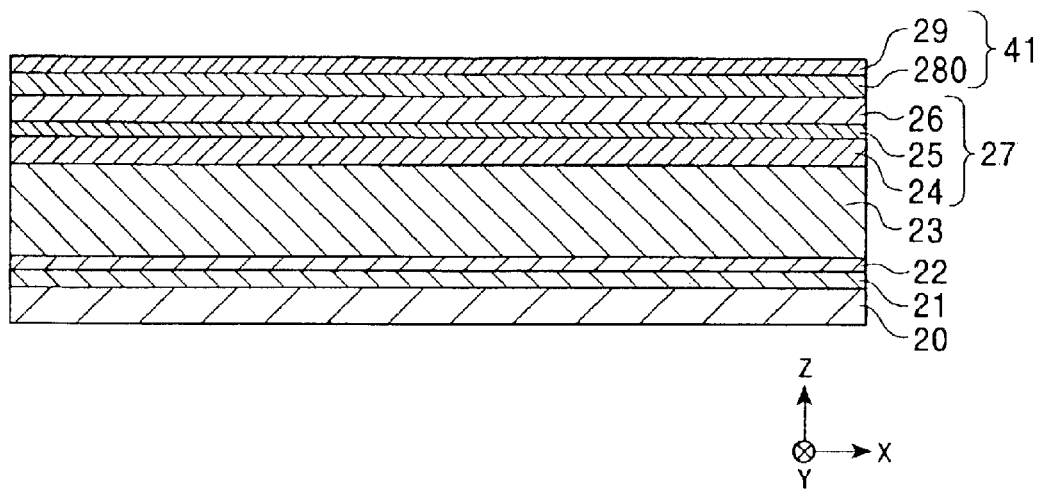
FIG. 16 is a view showing a step of forming the magnetic sensor having the structure of the present invention shown in FIG. 13.

In the step shown in FIG. 16, the first electrode layer 20, the underlying layer 21, the seed layer 22, the first antiferromagnetic layer 23, the fixed magnetic layer 27, the spacer layer 41 composed of the insulating barrier layer 280 and the protective layer 29 are sequentially formed from the bottom. In this film-forming step, sputtering or deposition may be used.

In the present invention, it is preferable that the first electrode layer 20 be formed of α-Ta, Au, Cr, Cu, Rh, Ir, Ru, or W, the underlying layer 21 be formed of at least one element selected from the group consisting of Ta, Hf, Nb, Zr, Ti, Mo, and W, the seed layer 22 be formed of a Ni—Fe—Cr alloy, chromium, or the like, and the first antiferromagnetic layer 23 be formed of an antiferromagnetic material containing element X (where X is at least one element selected from the group consisting of Pt, Pd, Ir, Rh, Ru, and Os) and Mn or be formed of an X—Mn—X' alloy (where X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements).

In addition, the underlying layer 21 and the seed layer 22 used in the manufacturing step shown in FIG. 16 may be or may not be provided.

Next, the fixed magnetic layer 27 has a so-called laminated ferrimagnetic structure composed of three layers, that is, the magnetic layers 24 and 26 and the nonmagnetic interlayer 24 provided therebetween. In the present invention, the magnetic layers 24 and 26 are preferably formed of a Co—Fe alloy, a Co—Fe—Ni alloy, Co, a Ni—Fe alloy, or the like. In addition, the nonmagnetic interlayer 25 is preferably formed of a nonmagnetic conductive material such as Ru, Rh, Ir, Cr, Re, or Cu.

In order to form an appropriate laminated ferrimagnetic structure, the magnetic momentum (product of the saturated magnetization Ms and film thickness t) per unit area of the magnetic layer 24 must be different from that of the magnetic layer 26. For example, when the same material is used for forming the magnetic layers 24 and 26, the magnetic layer 24 is formed so as to have a thickness different from that of the magnetic layer 26.

After the first antiferromagnetic layer 23 and the fixed magnetic layer 27 are formed, an exchange coupling magnetic field is generated between the first antiferromagnetic layer 23 and the fixed magnetic layer 27 by performing heat treatment, thereby magnetizing the fixed magnetic layer 27 in the height direction. The magnetic layers 24 and 26 forming the fixed magnetic layer 27 are magnetized to be antiparallel to each other. In addition, this heat treatment may be performed at any time, and for example, it may be performed after the protective layer 29 is formed or after the fixed magnetic layer is formed.

In addition, the insulating barrier layer 280 is preferably formed from an insulating material composed of Al—O, Si—O, or Al—Si—O. An insulating material such as $Al_2O_3$ and $SiO_2$, which is represented by stoichiometric coefficients, are used for forming the insulating barrier layer 280.

For example, when the insulating barrier layer 280 is formed from Al—O, it is preferable that after a layer composed of Al is formed on the fixed magnetic layer 27, the Al layer be oxidized. As the oxidation method therefor, for example, there may be mentioned natural oxidation, plasma oxidation, radical oxidation, ion-assist-oxidation (IAO), or CVD oxidation.

According to the present invention, the protective layer 29 is provided on the insulating barrier layer 280. The protective layer 29 is preferably formed of at least one selected from the group consisting of Ru, Ir, Rh, Os, Re, Pt, and Pd. By providing the protective layer 29, in the case in which the magnetic sensor having the film structure shown in FIG. 16 is exposed to the air when being transferred to another apparatus, damage done to the insulating barrier layer 280 by exposure to the air can be suppressed.

When the protective layer 29 composed of Ru is not provided, the insulating barrier layer 280 is contaminated by exposure to the air, resulting in degradation of barrier properties. In addition, the insulating barrier layer 280 or the fixed magnetic layer 27 becomes susceptible to oxidation, and as a result, the changing rate of resistance may be degraded.

Accordingly, by providing the protective layer 29 composed of Ru or the like on the insulating barrier layer 280, degradation of the barrier properties of the insulating barrier layer 280 can be prevented.

When the magnetic sensor shown in FIG. 16 is not exposed to the air, the protective layer 29 is not necessary, and the topmost layer shown in FIG. 16 is the insulating barrier layer 280.

In FIG. 16, the insulating barrier layer 280 and the protective layer 29 are shown having an apparent two-layered structure; however, the insulating barrier layer 280 and the protective layer 29 may thermally diffuse by heat treatment or the like performed in subsequent steps, and in the case described above, the interface between the insulating barrier layer 280 and the protective layer 29 may become vague in some cases. However, when it is confirmed by composition analysis that Ru or the like and an insulating material such as $Al_2O_3$ are mixed together in the spacer layer 41, it may be estimated that a two-layered structure as shown in FIG. 16 is formed when film formation is performed.

Figure 17:
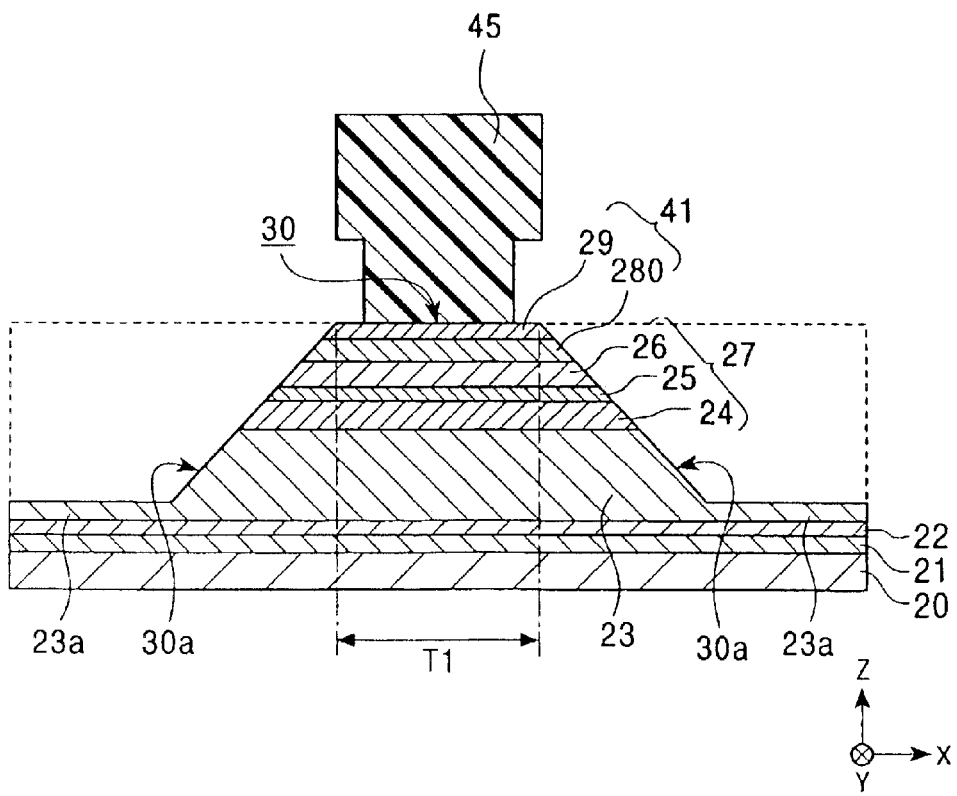
FIG. 17 is a view showing a step performed after the step shown in FIG. 16.

Next, in the step shown in FIG. 17, the lift-off resist layer 45 (see FIG. 17) is formed on the protective layer 29 shown in FIG. 16.

Next, the two side regions, which are not covered with the resist layer 45, in the track width direction (X direction in the figure) of the laminate 30 formed of the layers from the first antiferromagnetic layer 23 to the protective layer 29 are removed by ion milling. In FIG. 17, the parts thus removed are indicated by the dotted line.

In the step shown in FIG. 17, the two side surfaces 30a in the track width direction of the laminate 30, which are left behind below the resist layer 45, are formed to be inclined or curved so that the width dimension in the track width direction of the laminate is gradually decreased from the lower side to the upper side (from the first antiferromagnetic layer 23 side to the protective layer 29 side).

The size of the resist layer 45 is adjusted so that the width dimension T1 in the track width direction of the upper surface 30b of the laminate 30 which is left behind below the resist layer 45 is approximately 0.15 to 0.25 μm.

In addition, in FIG. 17, the downside regions 23a of the first antiferromagnetic layer 23 are formed to further extend from the two side surfaces 30a in the X direction in the figure; however, all the extending downside region 23 may be removed so as to form the first antiferromagnetic layer 23 in an approximately trapezoid shape. In this case, the seed layer 22, the underlayer 21, or the first electrode layer 20 is exposed at the two sides in the track width direction of the laminate 30 thus formed.

Figure 18:
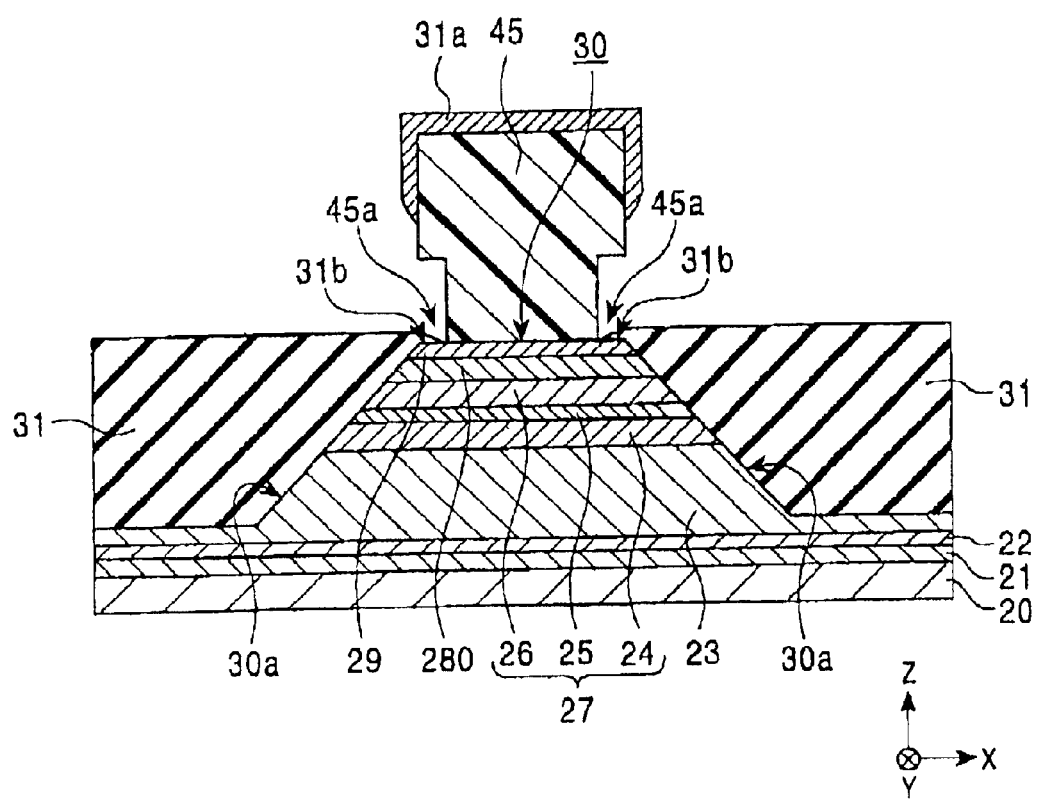
FIG. 18 is a view showing a step performed after the step shown in FIG. 17.

Next, in the step shown in FIG. 18, the insulating layers 31 are formed on the two side surfaces in the track width direction of the laminate 30 shown in FIG. 17 (see FIG. 18). The film formation mentioned above is performed by sputtering or deposition.

In the present invention, the insulating layer 31 is preferably formed of an insulating material such as $Al_2O_3$ or The insulating layers 31 are each formed so that the upper surface thereof shown in FIG. 18 is located at approximately the same level as that of the upper surface of the laminate 30, and that a part of the two side surfaces of the laminate 30 is not exposed. When the part of the two side surfaces 30a of the laminate 30 is exposed, shunt loss may easily occur thereby.

In order to totally cover the two side surfaces 30a of the laminate 30 with the insulating layers 31, as shown in FIG. 18, the inner front portions 31b of the insulating layers 31 are formed in the groove portions 45a formed in the lower side of the lift-off resist layer 45 so as to cover the upper surface of the laminate 30.

In order to form the inner front portions 31b of the insulating layers 31 in the groove portions 45a formed in the resist layer 45, when the insulating layers 31 is formed by sputtering, sputtering is performed at a sputtering angle inclined to some extent with respect to the direction (Z direction in the figure) perpendicular to the substrate (not shown) under the first electrode layer 20.

In addition, when the insulating layers 31 are formed, an insulating material 31a forming the insulating layers 31 adheres to the periphery of the resist layer 35. Next, the lift-off resist layer 45 is removed.

Figure 19:
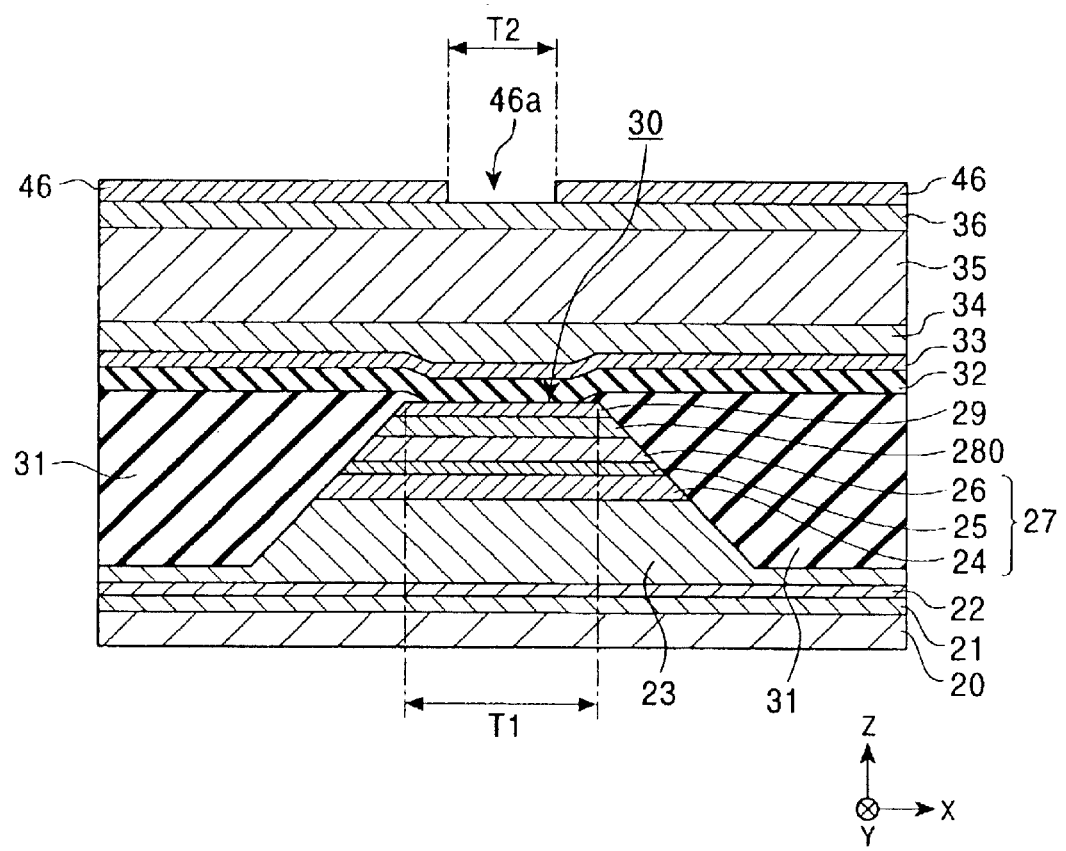
FIG. 19 is a view showing a step performed after the step shown in FIG. 18.

Next, in the step shown in FIG. 19, on the insulating layers 31 and the laminate 30, the free magnetic layer 32, the nonmagnetic interlayer 33, the ferromagnetic layer 34, the second antiferromagnetic layer 35, and the protective layer 36 are sequentially formed.

In the present invention, it is preferable that the free magnetic layer 32 be formed of a magnetic material such as a Co—Fe—Ni alloy, a Co—Fe alloy, Co, or a Ni—Fe alloy, that the nonmagnetic interlayer 33 be formed of a nonmagnetic conductive material such as Ru, Rh, Ir, Cr, Re, or Cu, that the ferromagnetic layer 34 be formed of a magnetic material such as a Ni—Fe alloy, a Co—Fe alloy, a Co—Fe—Ni alloy, or Co, that the second antiferromagnetic layer 35 be formed of an antiferromagnetic material containing Mn and element X (where X is at least one element selected from the group consisting of Pt, Pd, Ir, Rh, Ru., and Os) or be formed of an X—Mn—X' alloy (where X' is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and at least one of rare earth elements), and that the protective layer 36 be formed of Ta or the like.

Next, an exchange coupling magnetic field is generated between the second antiferromagnetic layer 35 and the ferromagnetic layer 34 by heat treatment, so that the ferromagnetic layer 34 is magnetized in the track width direction (X direction in the figure). This heat treatment may be performed at any time, and for example, it may be performed after a step of forming a recess portion shown in FIG. 20, which will be described later.

In the embodiment shown in FIG. 19, since three layers, that is, the ferromagnetic layer 34, the nonmagnetic interlayer 33, and the free magnetic layer 32, form a laminated ferrimagnetic structure, by a coupling magnetic field generated between the ferromagnetic layer 34 and the free magnetic layer 32 due to the RKKY interaction, the magnetizations of the ferromagnetic layer 34 and the free magnetic layer 32 can be antiparallel to each other.

As in the embodiment shown in FIG. 15, when the second antiferromagnetic layer 35 is provided directly on the free magnetic layer 32, after the free magnetic layer 32 shown in FIG. 19 is formed, the second ferromagnetic layer 35 is formed on the free magnetic layer 32.

Next, as shown in FIG. 19, a mask layer 46 having an opening 46a is formed on the protective layer 36. In the present invention, the mask layer 46 is preferably formed of an inorganic material.

Of various inorganic materials, an inorganic insulating material is preferably used. As the inorganic insulating material, for example, there may be mentioned $Al_2O_3$, $SiO_2$, or Al—Si—O.

The reason an inorganic insulating material is used for forming the mask layer 46 is that a thin-film can be formed. In addition, even when a thin-film is formed, a milling rate of an inorganic insulating material is low as compared to that of a metal material or the like, and hence the durability of the inorganic insulating material is superior as a mask. As the mask layer 46, a resist or the like may be used; however, when a resist is used, the mask layer 46 tends to be very thick, and hence it becomes difficult to form the opening 46a having a small gap in the mask layer 46 by exposure and development. In addition, since sagging may occur at two side surfaces of this opening 46a in the mask layer 46 in some cases, it is difficult to form the opening 46a having a predetermined shape.

Since the gap of the opening 46a formed in the mask layer 46 is used for defining the track width Tw in the following step, the opening 46a having predetermined dimensions and a predetermined shape must be properly formed.

However, the inorganic material for forming the mask layer 46 must be a hard material, which is etched at a rate lower than that of the protective layer 36 or the second antiferromagnetic layer 35. Otherwise, the recess portion having an appropriate depth cannot be formed in the second antiferromagnetic layer 35 in the following step. As the inorganic material, Ta, Mo, W, Ti, Si, Zr, Hf, Nb, Al—O, SiO, Al—Si—O, or the like is preferably used.

As described above, the opening 46a provided in the central portion of the mask layer 46 is formed by, for example, steps of providing a resist layer (not shown) on the central portion of the protective layer 36, forming the mask layer 46 so as to cover two sides of the resist layer, and then removing the resist layer. Alternatively, for example, there may be a method in which after the mask layer 46 is formed over the entire protective layer 36, a resist layer (not shown) is formed on the mask layer 46, and after the opening is formed in the central portion of the resist layer by exposure and development, the mask layer 46 exposed in this opening is polished away so as to form the opening 46a in the mask layer 46.

In the present invention, the width dimension T2 in the track width direction of the opening 46a provided in the mask layer 46 is formed to be smaller than the width dimension T1 of the upper surface of the laminate 30. For example, the width dimension T2 of the opening 46a of the mask layer 46 is preferably formed to be approximately 0.1 μm.

Figure 20:
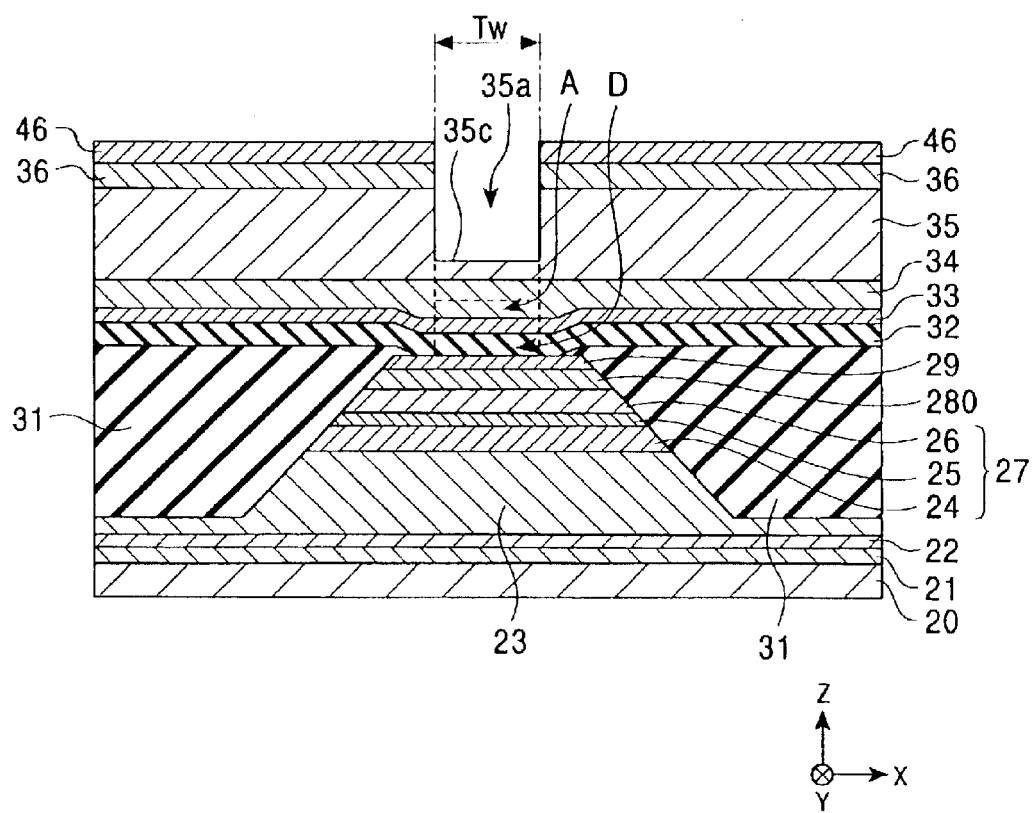
FIG. 20 is a view showing a step performed after the step shown in FIG. 19.

Next, in the step shown in FIG. 20, the protective layer 36 and the second antiferromagnetic layer 35 exposed in the opening 46a formed in the mask layer 46 in the step shown in FIG. 19 are excavated by ion milling or the like (see FIG. 20).

As shown in FIG. 20, a part of the second antiferromagnetic layer 35 is excavated by the ion milling mentioned above. Under the recess portion 35a thus formed, a part of the second antiferromagnetic layer 35 remains; however, the thickness thereof is very thin. Accordingly, an exchange coupling magnetic field generated between the second antiferromagnetic layer 35 and the ferromagnetic layer 34 under the recess portion 35a becomes very small, and hence the central region A of the ferromagnetic layer 34 and the central region D of the free magnetic layer 32, which are located under the recess portion 35a, are placed in a weak single domain state so that the magnetizations thereof may vary in response to an external magnetic field.

Concerning the depth of the recess portion 35a formed by excavation, as shown in FIG. 20, the second antiferromagnetic layer 35 is excavated so that a part thereof remains under the recess portion 35a, or the recess portion 35a is formed by excavating the second antiferromagnetic layer 35 and the ferromagnetic layer 34 so that the surface (see the dotted line in the figure) of the ferromagnetic layer 34 or the surface of the nonmagnetic interlayer 33, is exposed.

After the recess formation described above, the width dimension in the track width direction (X direction in the figure) of the bottom surface 35c of the recess portion 35a is defined as the track width Tw, and in the present invention, the track width Tw can be formed to be smaller that that in the track width direction of the upper surface of the laminate 30.

After ion milling is performed for forming the recess portion 35a shown in FIG. 20, the mask layer 46 is removed, and the second electrode layer 37b (see FIG. 13) is formed in the recess portion 35a formed in the second antiferromagnetic layer 35 from the protective layer 36 side, thereby forming a magnetic sensor having the structure shown in FIG. 13. Even when the mask layer 46 is not removed, the second electrode layer 37 can be formed without any troubles since the mask layer 46 is very thin. In addition, for example, when being formed of a metal material, the mask layer may be used as a part of the electrode layer, and hence after the recess portion 35a is formed in the second antiferromagnetic layer 35, the second electrode layer 37 may be formed without removing the mask layer 46 by cleaning or the like.

Figure 21:
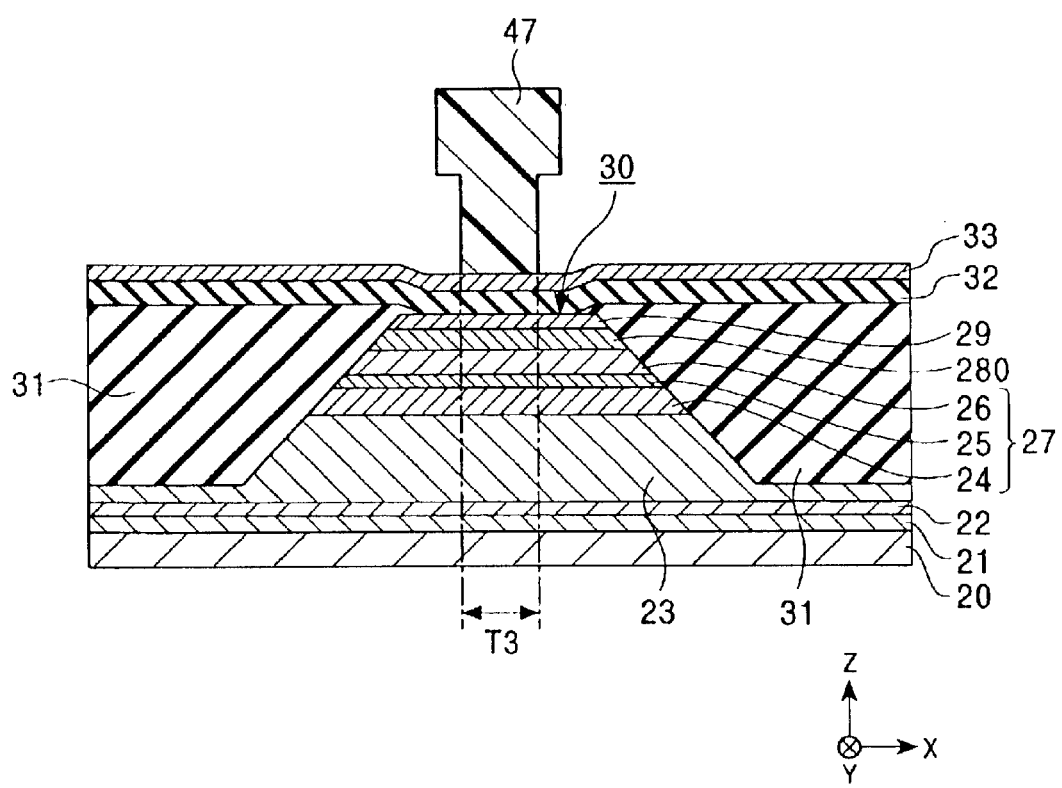
FIG. 21 is a view showing a step of forming the magnetic sensor having the structure of the present invention shown in FIG. 14.
Figure 22:
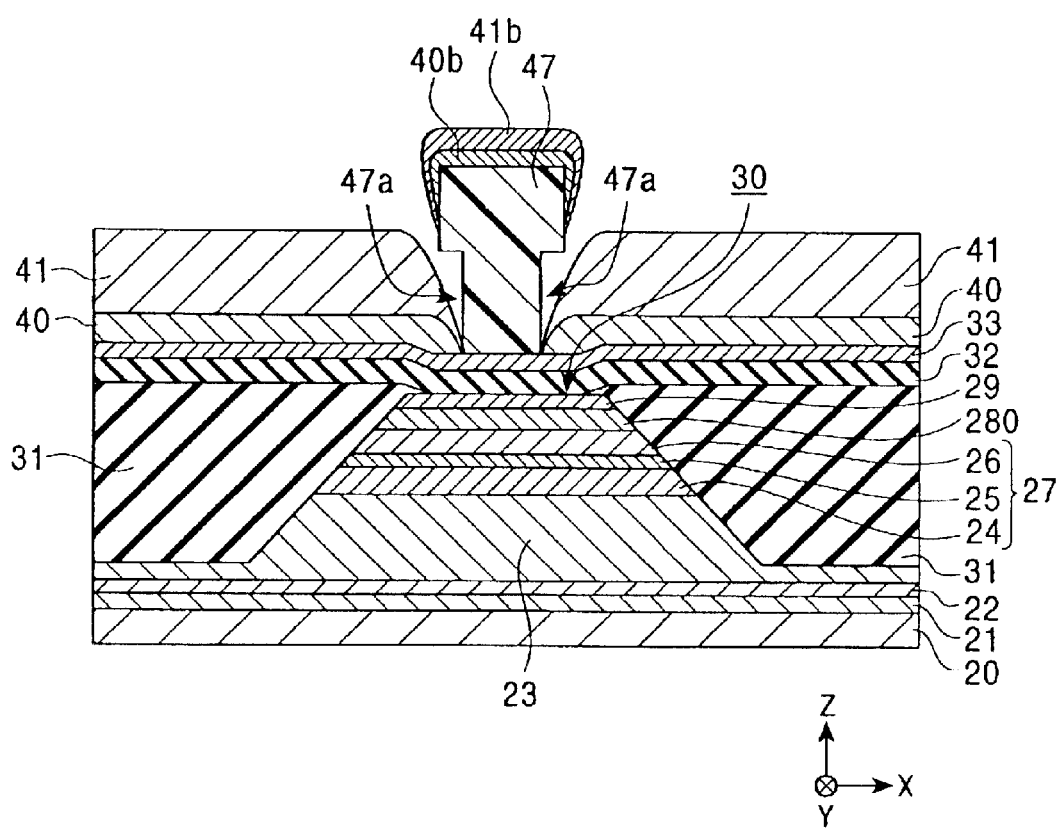
FIG. 22 is a view showing a step performed after the step shown in FIG. 21.
Figure 23:
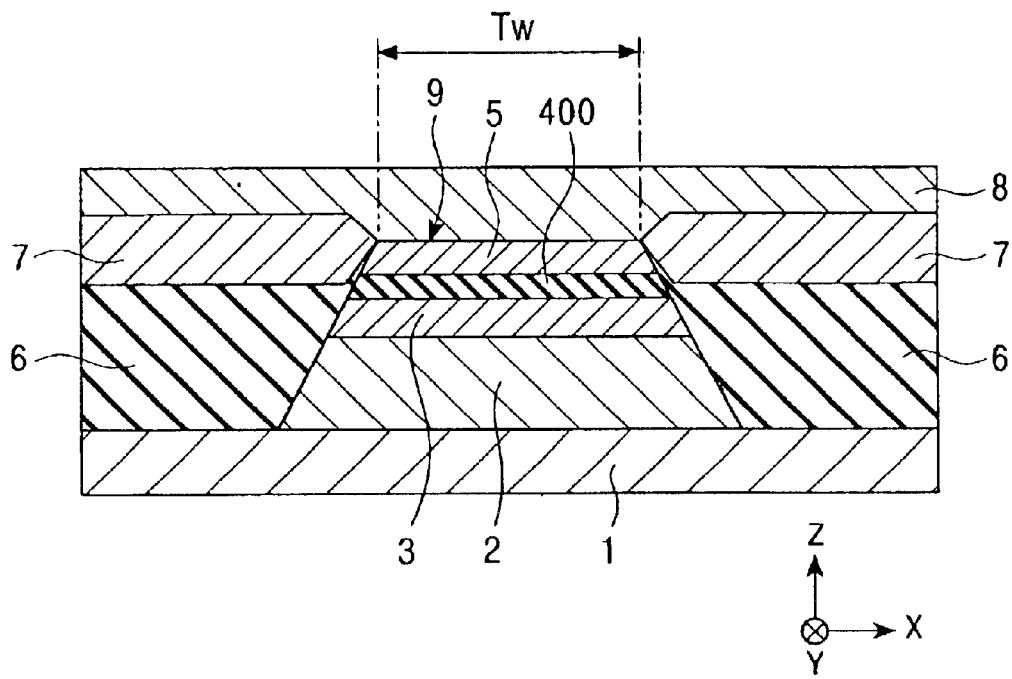
FIG. 23 is a partial schematic view showing the structure of a conventional magnetic sensor (tunnel type magnetoresistive element) when it is viewed from an opposing face opposing a recording medium.
Figure 24:
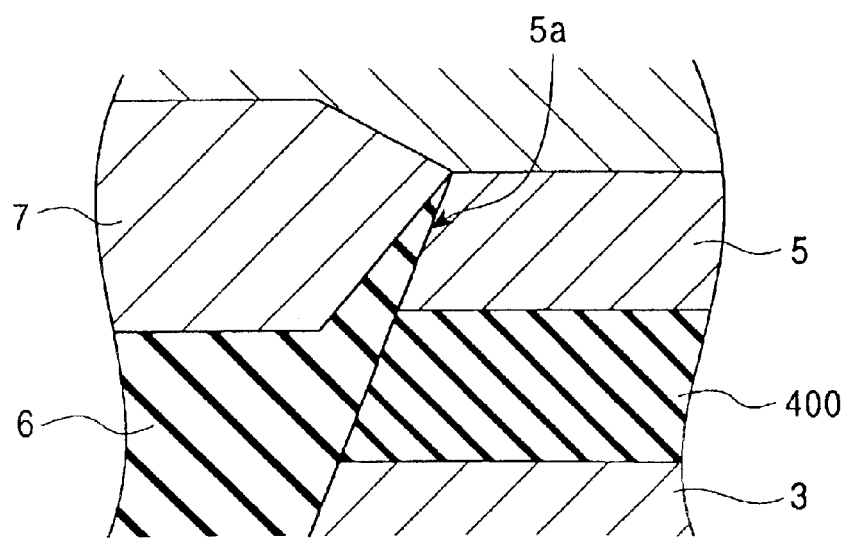
FIG. 24 is an enlarged view of a part of the conventional magnetic sensor shown in FIG. 23.

FIGS. 21 and 22 are views each showing a step of a manufacturing method for the magnetic sensor shown in FIG. 14. Each of the figures is a partial cross-sectional view of the magnetic sensor when it is viewed from an opposing face opposing a recording medium.

Prior to the step shown in FIG. 21, the same steps as those shown in FIGS. 16 to 18 are performed. In the step shown in FIG. 21, the free magnetic layer 32 and the nonmagnetic interlayer 33 are sequentially formed on the laminate 30 and the insulating layers 31 provided on the two sides thereof in the track width direction (X direction in the figure).

Subsequently, the lift-off resist layer 47 is formed on the nonmagnetic interlayer 33. The width dimension T3 in the track width direction of the lower surface of the lift-off resist layer 47 is a width dimension for defining the track width Tw and is formed to be smaller than the width dimension in the track width direction of the upper surface of the laminate 30.

Next, in the step shown in FIG. 22, the ferromagnetic layers 40 and the second antiferromagnetic layers 41 are sequentially formed on the nonmagnetic interlayer 33 exposed at the two sides in the track width direction of the resist layer 47 described above. The film formation mentioned above may be performed by sputtering or deposition.

When the ferromagnetic layers 40 and the second antiferromagnetic layers 41 are formed, in order to form the, inner front portions thereof in the groove portions 47a formed in the lower side of the resist layer 47 as deep as possible, sputtering is performed at a sputtering angle inclined with respect to the direction (Z direction in the figure) perpendicular to the substrate (not shown). Consequently, the inner front portions of the ferromagnetic layers 40 and the second antiferromagnetic layers 41 are formed deeply in the groove portions 47a of the resist layer 47, and as a result, the distance between the ferromagnetic layers 40 in the track width direction (X direction in the figure) can be made approximately equal to the width dimension T3 of the lower surface of the resist layer 47 shown in FIG. 21. In FIG. 22, the track width Tw is defined by the width dimension of the nonmagnetic interlayer exposed between the ferromagnetic layers 40.

After the ferromagnetic layers 40 and the second antiferromagnetic layers 41 are formed, the resist layer 47 is removed, thereby forming the magnetic sensor shown in FIG. 14.

As described above, in the method for manufacturing the magnetic sensor according to the present invention, the second antiferromagnetic layer 35 or 41 is formed on the free magnetic layer 32, and by an exchange coupling magnetic field generated between the free magnetic layer 32 and the second antiferromagnetic layer 35 or 41 or by a coupling magnetic field generated between the free magnetic layer and the ferromagnetic layer 34 or 40 due to the RKKY interaction, the free magnetic layer 32 can be magnetized in the track width direction.

Accordingly, the free magnetic layer 32 can be formed to extend long in the track width direction as compared to that by a conventional hard bias method, and the free magnetic layer 32 can be appropriately placed in a single domain state.

In addition, since the two sides of the laminate 30, which is formed of the first antiferromagnetic layer 23, the fixed magnetic layer 27, the insulating barrier layer 280, and the protective layer 29, and which is provided under the free magnetic layer 32, are appropriately covered with the insulating layers 31, shunt loss is unlikely to occur, and hence a magnetic sensor capable of improving changing rate of resistance can be manufactured.

In addition, the track width Tw can be defined by the width dimension in the track width direction of the bottom surface of the recess portion 35a or 41a formed in the second antiferromagnetic layer 35 or 41, respectively, and even when the track width is decreased, the width dimension in the track width direction of the laminate 30 can be formed to be large regardless of the dimension of the track width Tw. Accordingly, DC resistance (DCR) of the laminate can be appropriately increased, and a magnetic sensor capable of increasing reproducing output larger that that in the past can be easily formed.

Consequently, according to the method for manufacturing the magnetic sensor of the present invention, even when recording density is increased, a magnetic sensor capable of appropriately improving reproducing properties such as reproducing output or changing rate of resistance can be easily manufactured.

In the present invention, when the insulating barrier layer 280 formed of Al—O or the like is exposed to the air, barrier properties thereof are degraded due to damage caused by contamination or the like, and as a result, degradation of reproducing properties such as changing rate of resistance is likely to occur.

Accordingly, in the present invention, after the layer composed of the Al—O mentioned above is formed, the protective layer 29 composed of Ru or the like is sequentially formed on the layer described above, thereby appropriately preventing the Al—O layer from being exposed to the air. Consequently, the barrier properties of the insulating barrier layer 280 can be appropriately maintained.

In the manufacturing steps shown in FIGS. 21 and 22, since the excavating step such as ion milling shown in FIGS. 16 to 20 is not necessary, a magnetic sensor having a more precise predetermined shape can be easily manufactured.

The tunnel type magnetoresistive elements of the present invention described above in detail can be used as memory devices such as MRAM in addition to reproducing heads mounted in hard disc devices.

The reproducing head using the tunnel type magnetoresistive element described above may be a sliding type or a floating type.

According to the present invention described above in detail, the free magnetic layer is formed continuously on the laminate, which is composed of the antiferromagnetic layer, the fixed magnetic layer, and the spacer layer including the insulating barrier layer, and on the insulating layers provided on the two sides of the laminate, and the width dimension in the track width direction of the free magnetic layer is formed to extend larger than the track width Tw. In addition, the second antiferromagnetic layer is formed at the upper side of the free magnetic layer, and the free magnetic layer is magnetized by an exchange bias method.

Accordingly, the free magnetic layer can be appropriately placed in a single domain state, and hence a magnetic sensor having superior sensitivity can be manufactured even when the track width Tw is decreased.

In addition, since the two sides of the laminate are covered with the insulating layers, and the magnetization control of the free magnetic layer is performed by an exchange bias method using the second antiferromagnetic layer, a current flowing from the free magnetic layer to places other than the laminate, i.e., a shunt current, is decreased, and hence changing rate of resistance can be improved due to decrease of so-called shunt loss.

In addition, according to the present invention, the width dimension in the track width direction of the laminate can be freely determined regardless of the dimension of the track width Tw, and in the present invention, the width dimension in the track width direction of the laminate can be formed to be larger than the track width Tw. Accordingly, the cross-sectional area in the direction parallel to the surface of the laminate can be formed to be large as compared to that in the past.

According to the present invention, even when the track width Tw is decreased, DC resistance can be decreased, and hence reproducing output can be increased as compared to that of a conventional one.

As described above, according to the present invention, even when the track width is decreased, a magnetic sensor (tunnel type magnetoresistive element) having superior sensitivity, high reproducing output, and high changing rate of resistance can be appropriately and easily manufactured.

What is claimed is:

1. A magnetic sensor comprising:
    a laminate having a first antiferromagnetic layer, a fixed magnetic layer formed on an upper surface of the first antiferromagnetic layer, a magnetization of the fixed magnetic layer being fixed in a predetermined direction by an exchange coupling magnetic field generated between the first antiferromagnetic layer and the fixed magnetic layer, and a nonmagnetic material layer formed on an upper surface of the fixed magnetic layer;
    insulating layers formed on two sides in a track width direction of the laminate;
    a free magnetic layer formed continuously on an upper surface of the nonmagnetic material layer and upper surfaces of the insulating layers, a magnetization of the free magnetic layer being aligned in a direction crossing that of the fixed magnetic layer;
    a second antiferromagnetic layer formed at an upper side of the free magnetic layer;
    a recess portion formed in the second antiferromagnetic layer from an upper surface thereof in a direction toward the laminate at a position opposing the laminate in a thickness direction; and
    electrode layers formed at a lower side of the laminate and the upper side of the second antiferromagnetic layer.

2. A magnetic sensor according to claim 1, wherein a width dimension in the track width direction of the upper surface of the laminate is at most a width dimension in the track width direction of a bottom surface of the recess portion.

3. A magnetic sensor according to claim 1, wherein the nonmagnetic material layer contains one of element Ru, Rh, Re, Os, Ir, Pt, Pd, and a mixture thereof at a higher concentration at an upper surface side of the nonmagnetic material layer than that at a lower surface side thereof.

4. A magnetic sensor according to claim 3, wherein the nonmagnetic material layer is composed of a lower layer, which is formed of one of a Cu layer, an Rh layer, an Ru layer, an Re layer, an Os layer, a Cr layer, an Ir layer, a Pt layer, a Pd layer, and a layer containing at least two elements forming the above layers, and an upper layer which is provided on the lower layer and which is formed of one of an Ru layer, an Rh layer, an Re layer, an Os layer, an Ir layer, a Pt layer, a Pd layer, and a layer containing at least two elements forming the above-mentioned layers.

5. A magnetic sensor according to claim 3, wherein the entire nonmagnetic material layer is formed of one of an Ru layer, an Rh layer, an Re layer, an Os layer, an Ir layer, a Pt layer, a Pd layer, and a layer containing at least two elements forming the above-mentioned layers.

6. A magnetic sensor according to claim 1, further comprising a nonmagnetic interlayer and a ferromagnetic layer formed on the free magnetic layer in that order, wherein the second antiferromagnetic layer is formed on the ferromagnetic layer.

7. A magnetic sensor according to claim 6, wherein the recess portion is formed to extend to a surface of the ferromagnetic layer so that the surface thereof is exposed at a bottom of the recess portion.

8. A magnetic sensor according to claim 6, wherein the recess portion is formed to extend to a surface of the nonmagnetic interlayer so that the surface thereof is exposed at a bottom of the recess portion.

9. A method for manufacturing a magnetic sensor comprising:
  a step (a) of forming a laminate composed of a first antiferromagnetic layer, a fixed magnetic layer, and a nonmagnetic material layer provided in that order on a first electrode layer;
  a step (b) of forming a lift-off resist layer on an upper surface of the laminate and removing two side surfaces thereof, which are not covered with the resist layer, in a track width direction;
  a step (c) of forming insulating layers on two sides in the track width direction of the laminate and removing the resist layer;
  a step (d) of forming a free magnetic layer continuously on the insulating layers and the nonmagnetic material layer and forming a second antiferromagnetic layer on the free magnetic layer;
  a step (f) of forming a mask layer having an opening at a position opposing the laminate in a thickness direction on the second antiferromagnetic layer and excavating the second antiferromagnetic layer which is exposed in the opening to form a recess portion in the second antiferromagnetic layer; and
  a step (g) of forming a second electrode layer on the second antiferromagnetic layer.

10. A method for manufacturing a magnetic sensor according to claim 9, wherein, in the step (f), a width dimension in the track width direction of a bottom surface of the recess portion is formed to be larger than a width dimension in the track width direction of the upper surface of the laminate.

11. A method for manufacturing a magnetic sensor according to claim 9, wherein, in the step (a), the nonmagnetic material layer is composed of a lower layer, which is formed of one of a Cu layer, an Rh layer, an Ru layer, an Re layer, an Os layer, a Cr layer, an Ir layer, a Pt layer, a Pd layer, and a layer containing at least two elements forming the above layers, and an upper layer which is provided on the lower layer and which is formed of one of an Ru layer, an Rh layer, an Re layer, an Os layer, an Ir layer, a Pt layer, a Pd layer, and a layer containing at least two elements forming the above-mentioned layers.

12. A method for manufacturing a magnetic sensor according to claim 9, wherein, in the step (a), the nonmagnetic material layer is formed of one of an Ru layer, an Rh layer, an Re layer, an Os layer, an Ir layer, a Pt layer, a Pd layer, and a layer containing at least two elements forming the above-mentioned layers.

13. A method for manufacturing a magnetic sensor according to claim 9, wherein, in the step (d), a nonmagnetic interlayer and a ferromagnetic layer are formed in that order on the free magnetic layer, and the second antiferromagnetic layer is then formed on the ferromagnetic layer.

14. A method for manufacturing a magnetic sensor according to claim 13, wherein, in the step (f), the second antiferromagnetic layer is excavated to expose a surface of the ferromagnetic layer.

15. A method for manufacturing a magnetic sensor according to claim 9, wherein, in the step (f), a part of the second antiferromagnetic layer is excavated.

16. A method for manufacturing a magnetic sensor according to claim 9, wherein the mask layer formed in the step (f) is formed from an inorganic material.

17. A method for manufacturing a magnetic sensor according to claim 9, further comprising, instead of the steps (d) to (g):
  a step (h) of, after the free magnetic layer is formed continuously on the insulating layers and the nonmagnetic material layer, forming a nonmagnetic interlayer on the free magnetic layer;
  a step (l) of forming a lift-off resist layer on the nonmagnetic interlayer at a position opposing the laminate in the thickness direction, and forming a ferromagnetic layer and a second antiferromagnetic layer in that order on each of two sides, which are not covered with the resist layer, in the track width direction of the nonmagnetic interlayer so that a recess portion is formed between the ferromagnetic layers and between the second antiferromagnetic layers; and
  a step (j) of removing the resist layer.

18. A magnetic sensor comprising:
  a laminate formed of a first antiferromagnetic layer, a fixed magnetic layer formed on an upper surface of the first antiferromagnetic layer, a magnetization of the fixed magnetic layer being fixed in a predetermined direction by an exchange coupling magnetic field generated between the first antiferromagnetic layer and the fixed magnetic layer, and a spacer layer which is formed on an upper surface of the fixed magnetic layer and which contains at least an insulating barrier layer;
  insulating layers formed on two sides in a track width direction of the laminate;
  a free magnetic layer formed continuously on an upper surface of the spacer layer and upper surfaces of the insulating layers, a magnetization of the free magnetic layer being aligned in a direction crossing that of the fixed magnetic layer;
  a second antiferromagnetic layer formed at an upper side of the free magnetic layer;
  a recess portion formed in the second antiferromagnetic layer from a surface thereof in a direction toward the laminate at a position opposing to the laminate in a thickness direction, a width dimension in the track width direction of a bottom surface of the recess portion being formed to be smaller than a width dimension in the track width direction of an upper surface of the laminate; and electrode layers formed at a lower side of the laminate and at an upper side of the second antiferromagnetic layer.

19. A magnetic sensor according to claim 18, wherein the insulating barrier layer is formed of one of Al—O, Si—O, and Al—Si—O.

20. A magnetic sensor according to claim 18, wherein the spacer layer has a laminated structure composed of the insulating barrier layer and a protective layer which is provided thereon and which contains at least one selected from the group consisting of Ru, Ir, Rh, Os, Re, Pt, and Pd.

21. A magnetic sensor according to claim 18, further comprising a nonmagnetic interlayer and a ferromagnetic layer formed in that order on the free magnetic layer, wherein the second antiferromagnetic layer is formed on the ferromagnetic layer.

22. A magnetic sensor according to claim 21, wherein the recess portion is formed to extend to a surface of the ferromagnetic layer so that the surface thereof is exposed at a bottom of the recess portion.

23. A magnetic sensor according to claim 21, wherein the recess portion is formed to extend to a surface of the nonmagnetic interlayer so that the surface thereof is exposed at a bottom of the recess portion.

24. A method for manufacturing a magnetic sensor comprising:
  a step (a) of forming a laminate composed of a first antiferromagnetic layer, a fixed magnetic layer, and an insulating barrier layer provided in that order on a first electrode layer;
  a step (b) of forming a lift-off resist layer on an upper surface of the laminate and removing two side surfaces thereof, which are not covered with the resist layer, in a track width direction;
  a step (c) of forming insulating layers on two sides in the track width direction of the laminate and removing the resist layer;
  a step (d) of forming a free magnetic layer continuously on the insulating layers and the insulating barrier layer and forming a second antiferromagnetic layer on the free magnetic layer;
  a step (f) of forming a mask layer having an opening at a position opposing the laminate in a thickness direction on the second antiferromagnetic layer and excavating the second antiferromagnetic layer which is exposed in the opening to form a recess portion in the second antiferromagnetic layer so that a width dimension in the track width direction of a bottom surface of the recess portion is smaller than a width dimension in the track width direction of an upper surface of the laminate; and
  a step (g) of forming a second electrode layer on the second antiferromagnetic layer.

25. A method for manufacturing a magnetic sensor according to claim 24, wherein, in the step (a), the insulating barrier layer comprises an insulating material composed of one of Al—O, Si—O, and Al—Si—O.

26. A method for manufacturing a magnetic sensor according to claim 25, wherein, in the step (a), after an initial layer composed of one of Al, Si, and Al—Si is formed on the fixed magnetic layer, the insulating barrier layer composed of one of Al—O, Si—O, and Al—Si—O is formed by oxidizing the initial layer.

27. A method for manufacturing a magnetic sensor according to claim 24, wherein, in the step (a), a protective layer composed of at least one selected from the group consisting of Ru, Ir, Rh, Os, Re, Pt, and Pd is formed on the insulating barrier layer, whereby the protective layer and the insulating barrier layer form a spacer layer.

28. A method for manufacturing a magnetic sensor according to claim 24, wherein, in the step (d), a nonmagnetic interlayer and a ferromagnetic layer are formed.

29. A method for manufacturing a magnetic sensor according to claim 28, wherein, in the step (f), the second antiferromagnetic layer is excavated to expose a surface of the ferromagnetic layer.

30. A method for manufacturing a magnetic sensor according to claim 24, wherein, in the step (f), a part of the second antiferromagnetic layer is excavated.

31. A method for manufacturing a magnetic sensor according to claim 24, wherein the mask layer formed in the step (f) is formed from an inorganic material.

32. A method for manufacturing a magnetic sensor according to claim 24, further comprising, instead of the steps (d) to (g):
  a step (h) of, after the free magnetic layer is formed continuously on the insulating layers and the insulating barrier layer, forming a nonmagnetic interlayer on the free magnetic layer;
  a step (i) of forming a lift-off resist layer on the nonmagnetic interlayer at a position opposing the laminate in the thickness direction, and forming ferromagnetic layers and second antiferromagnetic layers in that order on two sides, which are not covered with the resist layer, in the track width direction of the nonmagnetic interlayer so that a width dimension in the track width direction of a surface of the nonmagnetic interlayer which is exposed between the second antiferromagnetic layers is smaller than a width dimension in the track width direction of the upper surface of the laminate; and
  a step (j) of removing the resist layer.

* * * * *

UNITED STATES PATENT AND TRADEMARK OFFICE
CERTIFICATE OF CORRECTION

PATENT NO. : 6,826,022 B2  Page 1 of 1
APPLICATION NO. : 10/215693
DATED : November 30, 2004
INVENTOR(S) : Eiji Umetsu It is certified that error appears in the above-identified patent and that said Letters Patent is hereby corrected as shown below:

In the Claims

Column 52, in claim 17, line 8, before "of forming a lift-off" delete "(1)" and substitute --(i)-- in its place.

Column 54, in claim 28, line 3, after "ferromagnetic layer are" delete "formed." and substitute --formed on the free magnetic layer in that order, and the second antiferromagnetic layer is formed on the ferromagnetic layer.-- in its place.

Signed and Sealed this

Twelfth Day of December, 2006

JON W. DUDAS
*Director of the United States Patent and Trademark Office*